US010599038B2

United States Patent
Tsubaki et al.

(10) Patent No.: US 10,599,038 B2
(45) Date of Patent: Mar. 24, 2020

(54) RINSING LIQUID, PATTERN FORMING METHOD, AND ELECTRONIC DEVICE MANUFACTURING METHOD

(71) Applicant: FUJIFILM Corporation, Tokyo (JP)

(72) Inventors: Hideaki Tsubaki, Shizuoka (JP); Toru Tsuchihashi, Shizuoka (JP); Wataru Nihashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/849,689

(22) Filed: Dec. 21, 2017

(65) Prior Publication Data

US 2018/0120708 A1    May 3, 2018

Related U.S. Application Data

(63) Continuation of application No. PCT/JP2016/065353, filed on May 24, 2016.

(30) Foreign Application Priority Data

Jun. 23, 2015  (JP) .................. 2015-125622

(51) Int. Cl.
| | |
|---|---|
| G03F 7/00 | (2006.01) |
| G03F 7/32 | (2006.01) |
| G03F 7/40 | (2006.01) |
| G03F 7/004 | (2006.01) |
| G03F 7/038 | (2006.01) |
| G03F 7/039 | (2006.01) |

(52) U.S. Cl.
CPC ............ *G03F 7/405* (2013.01); *G03F 7/0002* (2013.01); *G03F 7/0042* (2013.01); *G03F 7/038* (2013.01); *G03F 7/039* (2013.01); *G03F 7/0397* (2013.01); *G03F 7/322* (2013.01); *G03F 7/325* (2013.01)

(58) Field of Classification Search
CPC ...... G03F 7/405; G03F 7/0002; G03F 7/0042; G03F 7/038; G03F 7/039; G03F 7/20; G03F 7/32; G03F 7/322

USPC ........................................ 430/331
See application file for complete search history.

(56) References Cited

U.S. PATENT DOCUMENTS

| | | | |
|---|---|---|---|
| 5,403,699 A | 4/1995 | Takechi et al. | |
| 8,999,817 B2 * | 4/2015 | Tagami | C09J 7/00 438/464 |
| 2011/0300485 A1 | 12/2011 | Tsubaki et al. | |
| 2014/0113236 A1 | 4/2014 | Senzaki et al. | |

FOREIGN PATENT DOCUMENTS

| | | |
|---|---|---|
| JP | S60-098621 | 6/1985 |
| JP | H03182756 | 8/1991 |
| JP | 2007191509 | 8/2007 |
| JP | 2009-251506 | 10/2009 |
| JP | 2010217884 | 9/2010 |
| JP | 2013-257379 | 12/2013 |
| KR | 20130098926 | 9/2013 |
| KR | 20140047045 | 4/2014 |
| WO | 2012046581 | 4/2012 |
| WO | 2016104565 | 6/2016 |

OTHER PUBLICATIONS

"International Search Report (Form PCT/ISA/210) of PCT/JP2016/065353", dated Aug. 23, 2016, with English translation thereof, pp. 1-5.
"Written Opinion of the International Searching Authority (Form PCT/ISA/237)" of PCT/JP2016/065353, dated Aug. 23, 2016, with English translation thereof, pp. 1-11.
"Office Action of Korea Counterpart Application," dated May 27, 2019, with English translation thereof, p. 1-p. 9.
"Office Action of Taiwan Counterpart Application," with English translation thereof, dated Sep. 26, 2019, p. 1-p. 8.

* cited by examiner

*Primary Examiner* — Christopher G Young
(74) *Attorney, Agent, or Firm* — JCIPRNET

(57) ABSTRACT

Provided are a rinsing liquid which is used for rinsing a resist film obtained from an actinic ray-sensitive or radiation-sensitive composition and includes a hydrocarbon-based solvent having a branched alkyl group. The hydrocarbon-based solvent having a branched alkyl group contains at least one of isodecane or isododecane.

8 Claims, No Drawings

RINSING LIQUID, PATTERN FORMING METHOD, AND ELECTRONIC DEVICE MANUFACTURING METHOD

CROSS REFERENCE TO RELATED APPLICATIONS

This is a continuation of International Application No. PCT/JP2016/065353 filed on May 24, 2016, and claims priority from Japanese Patent Application No. 2015-125622 filed on Jun. 23, 2015, the entire disclosures of which are incorporated herein by reference.

BACKGROUND OF THE INVENTION

1. Field of the Invention

The present invention relates to a rinsing liquid, a pattern forming method, and an electronic device manufacturing method.

More specifically, the present invention relates to a rinsing liquid for patterning a resist film, which is used for a production process of a semiconductor such as an IC, a production process of a circuit board of, for example, a liquid crystal or a thermal head, and other lithography processes of photofabrication, a pattern forming method using the rinsing liquid, and an electronic device manufacturing method including the pattern forming method.

2. Description of the Related Art

In the process of producing a semiconductor device such as an integrated circuit (IC) or a large scale integrated circuit (LSI), microfabrication by lithography using a photoresist composition has been conventionally carried out. Recently, the integration degree of integrated circuits has been becoming higher and consequently the formation of an ultrafine pattern in the sub-micron or quarter-micron range has been required. To cope with this requirement, the exposure wavelength has also tended to become shorter, for example, from g line to i line, or further to KrF excimer laser light. Furthermore, at present, the development of lithography using electron beams, X-rays, or extreme ultraviolet (EUV) light in addition to excimer laser light is also proceeding.

In such lithography, a film is formed by using a photoresist composition (also referred to as an actinic ray-sensitive or radiation-sensitive composition), the resulting film is developed with a developer, and the post-development film is cleaned with a rinsing liquid.

For example, JP2010-217884A discloses a pattern forming method including a step of rinsing with a rinsing liquid containing an organic solvent.

SUMMARY OF THE INVENTION

In recent years, in order to manufacture highly integrated and highly accurate electronic devices, a method for stably forming a high-precision fine pattern (for example, a line width of 20 nm or less) is required.

An object of the present invention is to provide a rinsing liquid which is used for a resist film to achieve both pattern collapse performance and bridge performance at a very high level in a high-precision fine pattern (for example, a line width of 20 nm or less), a pattern forming method using the rinsing liquid, and an electronic device manufacturing method including the pattern forming method.

The rinsing step in the pattern forming method is carried out to wash development residues generated in the development step with a rinsing liquid. Meanwhile, in the formation of a high-precision fine pattern (for example, a line width of 20 nm or less), for the purpose of achieving both pattern collapse performance and bridge performance, it has also been found to be important to suppress the swelling of the pattern by removing the developer slightly penetrated into the pattern, in addition to washing the development residues. Further, it has been found that washing of development residues and suppression of pattern swelling can be achieved by using a rinsing liquid containing a hydrocarbon-based solvent having a branched alkyl group.

Although the detailed reasons for these findings are not clear, the present inventors presumed as follows. It is considered that, by means of the rinsing liquid containing a hydrocarbon-based solvent having a branched alkyl group, the developer slightly penetrated into a resist film after development is washed into a hydrophobic rinsing liquid, so that the swelling of the film is suppressed and, in addition, the penetration of the rinsing liquid itself into the resist film is suppressed by the steric barrier due to the branched structure, so that swelling suppression effects are further exerted. It is further considered that the suppression of swelling inhibited the reduction of the distance between the patterns, so that bridges due to adhesion between adjacent patterns and pattern collapse due to capillary force could be suppressed.

That is, the above-mentioned problems can be solved by the following means.

<1> A rinsing liquid for use in rinsing a resist film obtained from an actinic ray-sensitive or radiation-sensitive composition, comprising a hydrocarbon-based solvent having a branched alkyl group.

<2> The rinsing liquid according to <1>, in which the hydrocarbon-based solvent having a branched alkyl group has 10 or more carbon atoms.

<3> The rinsing liquid according to <1> or <2>, in which the hydrocarbon-based solvent having a branched alkyl group contains at least one of isodecane or isododecane.

<4> A pattern forming method comprising the successive steps of:

a resist film forming step of forming a resist film using an actinic ray-sensitive or radiation-sensitive composition, an exposure step of exposing the resist film, a step of developing the exposed resist film using a developer containing an organic solvent, and a step of rinsing the developed resist film using the rinsing liquid according to any one of <1> to <3>.

<5> The pattern forming method according to <4>, in which the organic solvent contained in the developer is an ester-based solvent.

<6> The pattern forming method according to <4> or <5>, in which the organic solvent contained in the developer contains one or more selected from the group consisting of butyl acetate, pentyl acetate, and isoamyl acetate.

<7> The pattern forming method according to any one of <4> to <6>, in which the actinic ray-sensitive or radiation-sensitive composition contains a resin containing a repeating unit represented by General Formula (1):

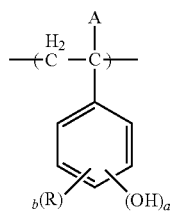

(1)

in General Formula (1),

A represents a hydrogen atom, an alkyl group, a cycloalkyl group, a halogen atom, or a cyano group, R represents a halogen atom, an alkyl group, a cycloalkyl group, an aryl group, an alkenyl group, an aralkyl group, an alkoxy group, an alkylcarbonyloxy group, an alkylsulfonyloxy group, an alkyloxycarbonyl group, or an aryloxycarbonyl group; in the case where there are a plurality of R's, they may be the same or different; and in the case of having a plurality of R's, they may form a ring in cooperation with each other, a represents an integer of 1 to 3, and b represents an integer of 0 to (3-a).

<8> The pattern forming method according to any one of <4> to <7>, in which the exposure is carried out using electron beams or extreme ultraviolet rays.

<9> An electronic device manufacturing method, comprising the pattern forming method according to any one of <4> to <8>.

It is possible to provide a rinsing liquid which is used for a resist film to achieve both pattern collapse performance and bridge performance at a very high level in a high-precision fine pattern (for example, a line width of 20 nm or less), a pattern forming method using the rinsing liquid, and an electronic device manufacturing method including the pattern forming method.

DESCRIPTION OF THE PREFERRED EMBODIMENTS

Hereinafter, an example of embodiments for carrying out the present invention will be described.

The numerical value ranges shown with "to" as used herein means ranges including the numerical values indicated before and after "to" as the lower limit and the upper limit, respectively.

The term "actinic rays" or "radiation" as used herein indicates, for example, a bright line spectrum of mercury lamp, far ultraviolet rays represented by excimer laser light, extreme ultraviolet rays, X-rays, or electron beams. The term "light" as used herein means actinic rays or radiation. Unless otherwise indicated, the term "exposure" as used herein includes not only exposure to a mercury lamp, far ultraviolet rays represented by excimer laser light, X-rays, extreme ultraviolet rays (EUV light), or the like but also lithography with particle beams such as electron beams (EB) and ion beams.

In the description of the present specification, in the case where a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

As used herein, the term "(meth)acrylic monomer" means at least one monomer having a structure of "$CH_2$=CH—CO—" or "$CH_2$=C($CH_3$)—CO—". Similarly, "(meth)acrylate" and "(meth)acrylic acid" mean "at least one of acrylate or methacrylate" and "at least one of acrylic acid or methacrylic acid", respectively.

As used herein, the weight-average molecular weight of a resin is a polystyrene-conversion value measured by a Gel Permeation Chromatography (GPC) method. GPC can be based on a method using HLC-8120 (manufactured by Tosoh Corporation), TSK gel Multipore HXL-M (manufactured by Tosoh Corporation, 7.8 mm IDx30.0 cm) as a column, and tetrahydrofuran (THF) as an eluent.

<Rinsing Liquid>

The rinsing liquid of the present invention is a rinsing liquid used for a resist film obtained from an actinic ray-sensitive or radiation-sensitive composition, in which the rinsing liquid is a rinsing liquid containing a hydrocarbon-based solvent having a branched alkyl group.

The rinsing liquid of the present invention can be used in a rinsing step in a pattern forming method which will be described later.

Examples of the hydrocarbon-based solvent having a branched alkyl group include 2,2,4-trimethylpentane, 2,2,3-trimethylhexane, isohexane, isoheptane, isooctane, isodecane, isododecane, isoundecane, isohexadecane, isotetradecane, isopentadecane, limonene, isopropylcyclopentane, and tert-butylcyclohexane.

The hydrocarbon-based solvent having a branched alkyl group is preferably a branched aliphatic hydrocarbon-based solvent, among which 2,2,4-trimethylpentane, 2,2,3-trimethylhexane, isohexane, isoheptane, isooctane, isodecane, isododecane, isoundecane, isohexadecane, isotetradecane, or isopentadecane is preferable.

The hydrocarbon-based solvent having a branched alkyl group preferably has 10 or more carbon atoms. For example, isodecane, isododecane, isoundecane, isohexadecane, isotetradecane, or isopentadecane is preferable, and isodecane or isododecane is particularly preferable. It is particularly preferred that the rinsing liquid of the present invention contains at least one of isodecane or isododecane. By using a hydrocarbon-based solvent having a branched alkyl group having 10 or more carbon atoms, good pattern collapsing performance and good bridging performance can be satisfied at the same time.

The upper limit of the number of carbon atoms in the hydrocarbon-based solvent having a branched alkyl group is not particularly limited, but it is, for example, 16 or less, preferably 14 or less, and more preferably 12 or less. As a result, drying efficiency during spin drying is improved, and occurrence of defects in the wafer plane can be suppressed.

The rinsing liquid may contain only one type of hydrocarbon-based solvent having a branched alkyl group or may contain two or more types thereof.

Further, the hydrocarbon-based solvent having a branched alkyl group may be a mixture of compounds having the same number of carbon atoms and different structures. For example, in the case where decane is used as the hydrocarbon-based solvent having a branched alkyl group, 2-methylnonane, 2,2-dimethyloctane, 4-ethyloctane, isodecane, and the like, which are compounds having the same number of carbon atoms and different structures, may be included in the hydrocarbon-based solvent having a branched alkyl group.

In addition, the compounds having the same number of carbon atoms and different structures may contain only one kind, or plural kinds as described above.

The vapor pressure at 20° C. of the rinsing liquid is preferably 0.05 kPa or more and 5 kPa or less, more preferably 0.1 kPa or more and 5 kPa or less, and most preferably 0.12 kPa or more and 3 kPa or less. In the case where the rinsing liquid is a mixed solvent of a plurality of solvents, the overall vapor pressure thereof is preferably within the above-specified range. In the case where the vapor pressure of the rinsing liquid is set to 0.05 kPa or more and 5 kPa or less, temperature uniformity in the wafer plane is improved, the swelling due to permeation of the rinsing liquid is further suppressed, and the dimensional uniformity in the wafer plane is improved.

The polarity element Sp of the SP value (Solubility Parameter) of the rinsing liquid is preferably 0 to 3, more preferably 0 to 2, and still more preferably 0 to 1. In the case where the polarity element δp of the SP value of the rinsing liquid is 0 to 3, it is preferable from the viewpoint of suppression of swelling of the pattern, and it is possible to achieve both washing of development residues and suppression of swelling of the pattern. The polarity element δp of the SP value uses the values described in the following documents: Hansen, Charles (2007). Hansen Solubility Parameters: A user's handbook, Second Edition. Boca Raton, Fla.: CRC Press.

In the rinsing liquid, the component containing a sulfur atom is preferably 10 mmol/L or less.

The content of the hydrocarbon-based solvent having a branched alkyl group in the rinsing liquid is preferably 60 mass % or more, more preferably 80 mass % or more, still more preferably 90 mass % or more, and particularly preferably 95 mass % or more, with respect to the total mass of the rinsing liquid. By setting the content of the hydrocarbon-based solvent having a branched alkyl group in the rinsing liquid to 60 mass % or more, the pattern collapse performance is further improved.

The rinsing liquid may contain a solvent other than the hydrocarbon-based solvent having a branched alkyl group.

As the solvent other than the hydrocarbon-based solvent having a branched alkyl group which may be contained in the rinsing liquid, various organic solvents are mentioned, among which it is preferred to use at least one organic solvent selected from the group consisting of a hydrocarbon-based solvent other than the hydrocarbon-based solvent having a branched alkyl group, a ketone-based solvent, an ester-based solvent, an alcohol-based solvent, an amide-based solvent, and an ether-based solvent.

The ester-based solvent is a solvent having an ester bond in the molecule, the ketone-based solvent is a solvent having a ketone group in the molecule, the alcohol-based solvent is a solvent having an alcoholic hydroxyl group in the molecule, the amide-based solvent is a solvent having an amide bond in the molecule, and the ether-based solvent is a solvent having an ether bond in the molecule. Among these solvents, there is also a solvent having a plurality of the above-mentioned functional groups in one molecule, but in this case, such a solvent shall correspond to any solvent type containing the functional group possessed by the solvent. For example, it is assumed that diethylene glycol monomethyl ether shall also fall under any of an alcohol-based solvent and an ether-based solvent in the above-mentioned categories.

Examples of the ester-based solvent include methyl acetate, ethyl acetate, butyl acetate, isobutyl acetate, pentyl acetate, propyl acetate, isopropyl acetate, amyl acetate (pentyl acetate), isoamyl acetate (isopentyl acetate, or 3-methylbutyl acetate), 2-methylbutyl acetate, 1-methylbutyl acetate, hexyl acetate, isohexyl acetate, heptyl acetate, octyl acetate, methoxyethyl acetate, ethoxyethyl acetate, propylene glycol monomethyl ether acetate (PGMEA; also known as 1-methoxy-2-acetoxypropane), ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, butyl propionate, pentyl propionate, hexyl propionate, heptyl propionate, butyl butanoate, isobutyl butanoate, pentyl butanoate, hexyl butanoate, isobutyl isobutanoate, propyl pentanoate, isopropyl pentanoate, butyl pentanoate, pentyl pentanoate, ethyl hexanoate, propyl hexanoate, butyl hexanoate, isobutyl hexanoate, methyl heptanoate, ethyl heptanoate, propyl heptanoate, cyclohexyl acetate, cycloheptyl acetate, 2-ethylhexyl acetate, cyclopentyl propionate, 2-hydroxymethyl propionate, 2-hydroxyethyl propionate, methyl-3-methoxy propionate, ethyl-3-methoxy propionate, ethyl-3-ethoxy propionate, and propyl-3-methoxy propionate. Among these, preferred is butyl acetate, amyl acetate, isoamyl acetate, 2-methylbutyl acetate, 1-methylbutyl acetate, hexyl acetate, pentyl propionate, hexyl propionate, heptyl propionate, or butyl butanoate, and particularly preferred is isoamyl acetate.

Examples of the ketone-based solvent include 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenyl acetone, methyl ethyl ketone, methyl isobutyl ketone, acetylacetone, acetonylacetone, ionone, diacetonyl alcohol, acetyl carbinol, acetophenone, methyl naphthyl ketone, isophorone, propylene carbonate, and γ-butyrolactone, among which preferred is 2-heptanone.

Examples of the alcohol-based solvent include an alcohol (monohydric alcohol), such as methanol, ethanol, 1-propanol, isopropanol, 1-butanol, 2-butanol, 3-methyl-1-butanol, tert-butyl alcohol, 1-pentanol, 2-pentanol, 1-hexanol, 1-heptanol, 1-octanol, 1-decanol, 2-hexanol, 2-heptanol, 2-octanol, 3-hexanol, 3-heptanol, 3-octanol, 4-octanol, 3-methyl-3-pentanol, cyclopentanol, 2,3-dimethyl-2-butanol, 3,3-dimethyl-2-butanol, 2-methyl-2-pentanol, 2-methyl-3-pentanol, 3-methyl-2-pentanol, 3-methyl-3-pentanol, 4-methyl-2-pentanol, 4-methyl-3-pentanol, cyclohexanol, 5-methyl-2-hexanol, 4-methyl-2-hexanol, 4,5-dimethyl-2-hexanol, 6-methyl-2-heptanol, 7-methyl-2-octanol, 8-methyl-2-nonanol, 9-methyl-2-decanol, or 3-methoxy-1-butanol; a glycol-based solvent, such as ethylene glycol, diethylene glycol, or triethylene glycol; and a glycol ether-based solvent containing a hydroxyl group, such as ethylene glycol monomethyl ether, propylene glycol monomethyl ether (PGME; also known as 1-methoxy-2-propanol), diethylene glycol monomethyl ether, triethylene glycol monoethyl ether, methoxymethyl butanol, ethylene glycol monoethyl ether, ethylene glycol monopropyl ether, ethylene glycol monobutyl ether, propylene glycol monoethyl ether, propylene glycol monopropyl ether, propylene glycol monobutyl ether, or propylene glycol monophenyl ether. Among these, preferred is a glycol ether-based solvent.

Examples of the ether-based solvent include, in addition to the above-mentioned glycol ether-based solvent containing a hydroxyl group, a glycol ether-based solvent containing no hydroxyl group, such as propylene glycol dimethyl ether, propylene glycol diethyl ether, diethylene glycol dimethyl ether, or diethylene glycol diethyl ether; an aromatic ether-based solvent such as anisole or phenetole; a cycloaliphatic ether-based solvent such as dioxane, tetrahydrofuran, tetrahydropyran, perfluoro-2-butyl tetrahydrofuran, perfluorotetrahydrofuran, 1,4-dioxane, and isopropyl ether. Preferred is a glycol ether-based solvent, or an aromatic ether-based solvent such as anisole.

Examples of the amide-based solvent include N-methyl-2-pyrrolidone, N,N-dimethylacetamide, N,N-dimethylformamide, hexamethylphosphoric triamide, and 1,3-dimethyl-2-imidazolidinone.

Examples of the hydrocarbon-based solvent other than the hydrocarbon-based solvent having a branched alkyl group include an aliphatic hydrocarbon-based solvent such as pentane, hexane, octane, nonane, decane, dodecane, undecane, hexadecane, perfluorohexane, or perfluoroheptane; an aromatic hydrocarbon-based solvent such as toluene, xylene, ethylbenzene, propylbenzene, 1-methylpropylbenzene, 2-methylpropylbenzene, dimethylbenzene, diethylbenzene, ethylmethylbenzene, trimethylbenzene, ethyldimethylbenzene, or dipropylbenzene; and an unsaturated hydrocarbon-based solvent such as octene, nonene, decene, undecene, dodecene, or hexadecene.

The double bond and the triple bond possessed by the unsaturated hydrocarbon-based solvent may be plural, and may be present at any position of the hydrocarbon chain. Cis and trans forms of an unsaturated hydrocarbon-based solvent compound occurring due to having a double bond may be mixed.

In the case where a solvent other than the hydrocarbon-based solvent having a branched alkyl group is contained in the rinsing liquid, the content of the solvent other than the hydrocarbon-based solvent having a branched alkyl group is preferably 40 mass % or less, more preferably 20 mass % or less, still more preferably 10 mass % or less, and particularly preferably 5 mass % or less, with respect to the total mass of the rinsing liquid. By setting the content of the solvent other than the hydrocarbon-based solvent having a branched alkyl group to 40 mass % or less, the pattern collapse performance can be further improved.

The rinsing liquid may contain a surfactant. In the case where the rinsing liquid contains a surfactant, the wettability to a resist film is improved, the rinsing property is improved, and generation of foreign matter tends to be suppressed.

As the surfactant, use can be made of the same surfactants as those used in an actinic ray-sensitive or radiation-sensitive composition to be described hereinafter.

In the case where the rinsing liquid contains a surfactant, the content of the surfactant is preferably 0.001 to 5 mass %, more preferably 0.005 to 2 mass %, and still more preferably 0.01 to 0.5 mass %, with respect to the total mass of the rinsing liquid.

The rinsing liquid preferably contains an antioxidant. In the case where the rinsing liquid contains an antioxidant, the generation of an oxidant over time can be suppressed, and the deterioration of the liquid over time can be suppressed.

A known antioxidant may be used as the antioxidant. In the case where the antioxidant is used for semiconductor applications, an amine-based antioxidant or a phenol-based antioxidant is preferably used.

Examples of the amine-based antioxidant include a naphthylamine-based antioxidant such as 1-naphthylamine, phenyl-1-naphthylamine, p-octylphenyl-1-naphthylamine, p-nonylphenyl-1-naphthylamine, p-dodecylphenyl-1-naphthylamine, or phenyl-2-naphthylamine; a phenylenediamine-based antioxidant such as N,N'-diisopropyl-p-phenylenediamine, N,N'-diisobutyl-p-phenylenediamine, N,N'-diphenyl-p-phenylenediamine, N,N'-di-β-naphthyl-p-phenylenediamine, N-phenyl-N'-isopropyl-p-phenylenediamine, N-cyclohexyl-N'-phenyl-p-phenylenediamine, N-1,3-dimethylbutyl-N'-phenyl-p-phenylenediamine, dioctyl-p-phenylenediamine, phenylhexyl-p-phenylenediamine, or phenyloctyl-p-phenylenediamine; a diphenylamine-based antioxidant such as dipyridylamine, diphenylamine, p,p'-di-n-butyldiphenylamine, p,p'-di-t-butyldiphenylamine, p,p'-di-t-pentyldiphenylamine, p,p'-dioctyldiphenylamine, p,p'-dinonyldiphenylamine, p,p'-didecyldiphenylarnine, p,p'-didodecyldiphenylamine, p,p'-distyryldiphenylamine, p,p'-dimethoxydiphenylamine, 4,4'-bis(4-α,α-dimethylbenzoyDddiphenylamine, p-isopropoxydiphenylamine, or dipyridyl amine; and a phenothiazine-based antioxidant such as phenothiazine, N-methylphenothiazine, N-ethylphenothiazine, 3,7-dioctylphenothiazine, phenothiazine carboxylic acid ester, or phenoselenazine.

Examples of the phenol-based antioxidant include 2,6-ditertiarybutylphenol (hereinafter, tertiary butyl is simply referred to as t-butyl), 2,6-di-t-butyl-p-cresol, 2,6-di-t-butyl-4-methylphenol, 2,6-di-t-butyl-4-ethylphenol, 2,4-dimethyl-6-t-butylphenol, 4,4'-methylene bis(2,6-di-t-butylphenol), 4,4'-bis(2,6-di-t-butylphenol), 4,4'-bis(2-methyl-6-t-butylphenol), 2,2'-methylene bis(4-methyl-6-t-butylphenol), 2,2'-methylene bis(4-ethyl-6-t-butylphenol), 4,4'-butylidene bis(3-methyl-6-t-butylphenol), 4,4'-isopropylidene bis(2,6-di-t-butylphenol), 2,2'-methylene bis(4-methyl-6-cyclohexylphenol), 2,2'-methylene bis (4-methyl-6-nonylphenol), 2,2'-isobutylidene bis(4,6-dimethylphenol), 2,6-bis(2'-hydroxy-3'-t-butyl-5'-methylbenzyl)-4-methylphenol, 3-t-butyl-4-hydroxyanisole, 2-t-butyl-4-hydroxyanisole, octyl 3-(4-hydroxy-3,5-di-t-butylphenyl)propionate, stearyl 3-(4-hydroxy-3,5-di-t-butylphenyl) propionate, oleyl 3-(4-hydroxy-3,5-di-t-butylphenyl) propionate, dodecyl 3-(4-hydroxy-3,5-di-t-butylphenyl) propionate, decyl 3-(4-hydroxy-3,5-di-t-butylphenyl) propionate, tetrakis{3-(4-hydroxy-3,5-di-t-butylphenyl) propionyloxymethyl}methane, 3-(4-hydroxy-3,5-di-t-butylphenyl) propionic acid glycerin monoester, ester of 3-(4-hydroxy-3,5-di-t-butylphenyl) propionic acid and glycerin monooleyl ether, 3-(4-hydroxy-3,5-di-t-butylphenyl) propionic acid butylene glycol diester, 3-(4-hydroxy-3,5-di-t-butylphenyl) propionic acid thiodiglycol diester, 4,4'-thiobis(3-methyl-6-t-butylphenol), 4,4'-thiobis(2-methyl-6-t-butylphenol), 2,2'-thiobis(4-methyl-6-t-butylphenol), 2,6-di-t-butyl-a-dimethylamino-p-cresol, 2,6-di-t-butyl-4-(N,N'-dimethylaminomethylphenol), bis(3,5-di-t-butyl-4-hydroxybenzyl)sulfide, tris{(3,5-di-t-butyl-4-hydroxyphenyl)propionyl-oxyethyl}isocyanurate, tris(3,5-di-t-butyl-4-hydroxyphenyl)isocyanurate, 1,3,5-tris(3,5-di-t-butyl-4-hydroxybenzyl)isocyanurate, bis{2-methyl-4-(3-n-alkylthiopropionyloxy)-5-t-butylphenyl}sulfide, 1,3,5-tris (4-t-butyl-3-hydroxy-2,6-dimethylbenzyl)isocyanurate, tetraphthaloyl-di(2,6-dimethyl-4-t-butyl-3-hydroxybenzyl-sulfide), 6-(4-hydroxy-3,5-di-t-butylanilino)-2,4-bis(octyl-thio)-1,3,5-triazine, 2,2-thio-{diethyl-bis-3-(3,5-di-t-butyl-4-hydroxyphenyl)}propionate, N,N'-hexamethylene bis(3,5-di-t-butyl-4-hydroxy-hydrocinnamate), 3,9-bis[1,1-dimethyl-2-{β-(3-t-butyl-4-hydroxy-5-methylphenyl) propionyloxy}ethyl]-2,4,8,10-tetraoxaspiro[5,5]undecane, 1,1,3-tris(2-methyl-4-hydroxy-5-t-butylphenyl)butane, 1,3, 5-trimethyl-2,4,6-tris(3,5-di-t-butyl-4-hydroxybenzyl)benzene, and bis{3,3'-bis-(4'-hydroxy-3'-t-butylphenyl)butyric acid}glycol ester.

In the case where the rinsing liquid contains an antioxidant, the content of the antioxidant is not particularly limited, but it is preferably 0.0001 to 1 mass %, more preferably 0.0001 to 0.1 mass %, and still more preferably 0.0001 to 0.01 mass %, with respect to the total mass of the rinsing liquid.

<Pattern Forming Method>

The pattern forming method of the present invention is a pattern forming method including:
  a resist film forming step of forming a resist film using an actinic ray-sensitive or radiation-sensitive composition,
  an exposure step of exposing the resist film, and
  a step of developing the exposed resist film using a developer containing an organic solvent, and
  a step of rinsing the developed resist film using a rinsing liquid containing a hydrocarbon-based solvent having a branched alkyl group in this order of steps.

Hereinafter, individual steps in the pattern forming method of the present invention will be described.

<Resist Film Forming Step>

The resist film forming step is a step of forming a resist film using an actinic ray-sensitive or radiation-sensitive composition (also referred to as "resist composition") and can be carried out by, for example, the following method. The resist composition will be described later.

To form a resist film (actinic ray-sensitive or radiation-sensitive composition film) on a substrate using the resist composition, individual components to be described hereinafter are dissolved in a solvent to prepare the resist composition which is then subjected to filtration using a filter if necessary and is applied onto the substrate. The filter is preferably a filter made of polytetrafluoroethylene, polyethylene or nylon and having a pore size of 0.1 µm or less, more preferably 0.05 µm or less, and still more preferably 0.03 µm or less.

The resist composition is applied onto a substrate (for example, silicon or silicon dioxide-coated) used in the production of an integrated circuit element, by a suitable application method such as a spinner. This is followed by drying to form a resist film. If necessary, various underlying films (an inorganic film, an organic film, and an antireflection film) may be formed on the underlayer of the resist film.

As the drying method, a method of drying by heating is generally used. The heating may be carried out by a means provided in a conventional exposure/development machine, and may also be carried out using a hot plate or the like. The heating temperature is preferably 80° C. to 150° C., more preferably 80° C. to 140° C., and still more preferably 80° C. to 130° C. The heating time is preferably 30 to 1000 seconds, more preferably 60 to 800 seconds, and still more preferably 60 to 600 seconds.

The film thickness of the resist film is generally 200 nm or less and preferably 100 nm or less.

For example, in order to resolve a 1:1 line and space pattern having a line width of 20 nm or less, the film thickness of the resist film to be formed is preferably 50 nm or less. If the film thickness is 50 nm or less, pattern collapse becomes less likely to occur in the case of applying a development step to be described hereinafter, and therefore a superior resolution performance is obtained.

The film thickness is more preferably in the range of 15 nm to 45 rim. If the film thickness is 15 nm or more, a sufficient etching resistance is obtained. The film thickness is still more preferably in the range of 15 nm to 40 nm. If the film thickness is within this range, it is possible to satisfy an etching resistance and a superior resolution performance at the same time.

In the pattern forming method of the present invention, a topcoat may be formed on the upper layer of the resist film. It is preferred that the topcoat is not mixed with the resist film and can be uniformly coated on the upper layer of the resist film.

The topcoat is not particularly limited. A conventionally known topcoat may be formed by a conventionally known method. For example, the topcoat may be formed on the basis of the description in paragraphs [0072] to [0082] of JP2014-059543A.

In the case of using a developer containing an organic solvent in the development step, for example, it is preferred to form a topcoat containing a basic compound described in JP2013-61648A on a resist film. Specific examples of the basic compound which may be contained in the topcoat will be described later as a basic compound (E).

The topcoat preferably contains a compound containing at least one group or bond selected from the group consisting of an ether bond, a thioether bond, a hydroxyl group, a thiol group, a carbonyl bond and an ester bond.

<Exposure Step>

The exposure step is a step of exposing the resist film and may be carried out by, for example, the following method.

The resist film formed as described above is irradiated with actinic rays or radiation through a predetermined mask. In irradiation of electron beams, maskless lithography (direct lithography) is common.

The actinic rays or radiation is not particularly limited and may be, for example, a KrF excimer laser, an ArF excimer laser, extreme ultraviolet (EUV), or electron beams (EB). Particularly preferred is extreme ultraviolet or electron beams. The exposure may be an immersion exposure.

<Baking>

In the pattern forming method of the present invention, it is preferred to carry out baking (heating) after the exposure and before the development. The baking accelerates the reaction of the exposed portion, so that the sensitivity and pattern shape become better.

The heating temperature is preferably 80° C. to 150° C., more preferably 80° C. to 140° C., and still more preferably 80° C. to 130° C.

The heating time is preferably 30 to 1000 seconds, more preferably 60 to 800 seconds, and still more preferably 60 to 600 seconds.

The heating may be carried out by means provided in a conventional exposure/development machine. The heating may also be carried out using a hot plate or the like.

<Development Step>

The development step is a step of developing the exposed resist film with a developer.

As the developing method, use can be made of, for example, a method in which a substrate is dipped in a bath filled with a developer for a given period of time (dip method), a method in which a developer is puddled on the surface of a substrate by its surface tension and allowed to stand still for a given period of time to thereby effect development (puddle method), a method in which a developer is sprayed onto the surface of a substrate (spray method), or a method in which a developer is continuously ejected onto a substrate spinning at a given speed while scanning a developer discharge nozzle at a given speed (dynamic dispense method).

Further, after the step of carrying out the development, a step of stopping the development may be carried out while replacing the solvent with another solvent.

The development time is not particularly limited as long as it is a period of time for which the resin of the unexposed portion is sufficiently soluble. The development time is usually 10 to 300 seconds and preferably 20 to 120 seconds.

The temperature of the developer is preferably 0° C. to 50° C. and more preferably 15° C. to 35° C.

The developer preferably contains an organic solvent. The organic solvent is the same as the organic solvent (at least one organic solvent selected from the group consisting of a hydrocarbon-based solvent, a ketone-based solvent, an ester-based solvent, an alcohol-based solvent, an amide-based solvent and an ether-based solvent) that can be contained in the above-mentioned rinsing liquid. The hydrocarbon-based solvent may be a hydrocarbon-based solvent having a branched alkyl group or may be a hydrocarbon-based solvent other than the hydrocarbon-based solvent having a branched alkyl group.

The organic solvent contained in the developer is preferably an ester-based solvent and more preferably an ester-based solvent having a branched hydrocarbon skeleton.

The vapor pressure at 20° C. of the organic solvent contained in the developer is preferably 5 kPa or less, more preferably 3 kPa or less, and particularly preferably 2 kPa or less. By setting the vapor pressure of the developer to 5 kPa or less, evaporation of the developer on a substrate or in a development cup is suppressed, the temperature uniformity in the wafer plane is improved, and consequently the dimensional uniformity in the wafer plane is improved.

Preferred examples of the organic solvent contained in the developer include methyl acetate, butyl acetate, ethyl acetate, isopropyl acetate, amyl acetate, isoamyl acetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, 2-hydroxymethyl propionate, and 2-hydroxyethyl propionate.

Among these, butyl acetate, amyl acetate (pentyl acetate), or isoamyl acetate (isopentyl acetate) is more preferable, and isoamyl acetate is still more preferable.

The developer preferably contains a surfactant, which improves the wettability of a resist film and allows the development to proceed more effectively.

The surfactant to be used may be the same as the surfactant used in an actinic ray-sensitive or radiation-sensitive composition to be described hereinafter.

In the case where the developer preferably contains a surfactant, the content of the surfactant is preferably 0.001 to 5 mass %, more preferably 0.005 to 2 mass %, and still more preferably 0.01 to 0.5 mass %, with respect to the total mass of the developer.

It is preferred that the developer contains an antioxidant, so that the generation of an oxidant over time can be suppressed and the content of the oxidant can be further reduced.

The antioxidant which may be contained in the developer is the same as the antioxidant which may be contained in the above-mentioned rinsing liquid.

The content of the antioxidant is not particularly limited, but it is preferably 0.0001 to 1 mass %, more preferably 0.0001 to 0.1 mass %, and still more preferably 0.0001 to 0.01 mass %, with respect to the total mass of the developer. If the content of the antioxidant is 0.0001 mass % or more, a superior antioxidant effect is obtained. If the content of the antioxidant is 1 mass % or less, there is a tendency that generation of development residues can be suppressed.

The developer preferably contains a basic compound. Specific examples of the basic compound include the compounds exemplified as a basic compound that can be contained in an actinic ray-sensitive or radiation-sensitive composition to be described hereinafter.

Among the basic compounds which may be contained in the developer, a nitrogen-containing compound may be preferably used.

In addition to development using a developer containing an organic solvent, development with an alkaline developer (so-called double development) may be carried out as the developer used in the development step.

<Rinsing Step>

The rinsing step is a step of cleaning (rinsing) by a rinsing liquid after the development step.

In the rinsing step, the wafer subjected to development is subjected to a cleaning treatment by using the above-mentioned rinsing liquid.

The method of cleaning treatment is not particularly limited, but it is possible to employ, for example, a method of continuously ejecting a rinsing liquid on a substrate spinning at a given speed (spin ejection method), a method of dipping a substrate in a bath filled with a rinsing liquid for a given period of time (dip method), or a method of spraying a rinsing liquid on a substrate surface (spray method), and among them, it is preferred that the cleaning treatment is carried out by the spin coating method and after the cleaning, the substrate is spun at a rotation speed of 2,000 rpm to 4,000 rpm to remove the rinsing liquid from the substrate.

The rinsing time is not particularly limited, but it is preferably 10 seconds to 300 seconds, more preferably 10 seconds to 180 seconds, and most preferably 20 seconds to 120 seconds.

The temperature of the rinsing liquid is preferably 0° C. to 50° C. and more preferably 15° C. to 35° C.

Further, a treatment of removing the developer or rinsing liquid adhering on the pattern by a supercritical fluid may be carried out after the development treatment or rinsing treatment.

In addition, after treatments of the development treatment or rinsing treatment or treatment with a supercritical fluid, a heat treatment may be carried out to remove the solvent remaining in the pattern. The heating temperature is not particularly limited as long as a good resist pattern can be obtained, and it is usually 40° C. to 160° C. The heating temperature is preferably 50° C. to 150° C. and most preferably 50° C. to 110° C. The heating time is not particularly limited as long as a good resist pattern can be obtained, and it is usually 15 to 300 seconds and preferably 15 to 180 seconds.

It is preferred to use the above-mentioned rinsing liquid as the rinsing liquid.

<Actinic Ray-Sensitive or Radiation-Sensitive Composition>

Next, the actinic ray-sensitive or radiation-sensitive composition used in the pattern forming method of the present invention will be described.

In the pattern forming method of the present invention, the actinic ray-sensitive or radiation-sensitive composition is preferably an actinic ray-sensitive or radiation-sensitive composition for organic solvent development using a developer containing an organic solvent. Here, the term "for organic solvent development" means at least an application to be subjected to a development step using a developer containing an organic solvent. The actinic ray-sensitive or radiation-sensitive composition in the present invention may be a chemically amplified resist composition or a non-chemically amplified resist composition, but it is preferably a chemically amplified resist composition. Further, the actinic ray-sensitive or radiation-sensitive composition of the present invention may be a positive resist composition or a negative resist composition.

The radiation-sensitive or actinic ray-sensitive composition of the present invention is preferably used for electron beam or extreme ultraviolet exposure.

<Resin (A)>

The resist composition preferably contains a resin (A). The resin (A) has at least (i) a repeating unit having a group capable of decomposing by the action of an acid to generate a carboxyl group (which may further have a repeating unit having a phenolic hydroxyl group), or at least (ii) a repeating unit having a phenolic hydroxyl group.

In the case where the resin (A) has a repeating unit having a group capable of decomposing by the action of an acid to have a carboxyl group, the solubility in an alkaline developer increases due to the action of an acid, and the solubility in an organic solvent decreases.

Examples of the repeating unit having a phenolic hydroxyl group contained in the resin (A) include a repeating unit represented by General Formula (I).

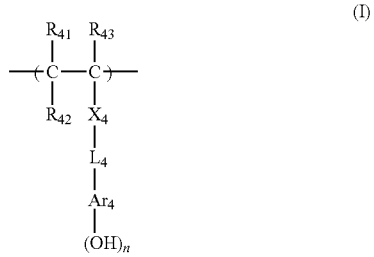

In General Formula (I), $R_{41}$, $R_{42}$, and $R_{43}$ each independently represent a hydrogen atom, an alkyl group, a cycloalkyl group, a halogen atom, a cyano group, or an alkoxycarbonyl group. Meanwhile, $R_{42}$ and $Ar_4$ may be bonded to each other to form a ring, and $R_{42}$ in this case represents a single bond or an alkylene group.

$X_4$ represents a single bond, —COO—, or —CONR$_{64}$— in which $R_{64}$ represents a hydrogen atom or an alkyl group.

$L_4$ represents a single bond or an alkylene group.

$Ar_4$ represents an (n+1)-valent aromatic ring group, and in the case of being bonded to $R_{42}$ to form a ring, $Ar_4$ represents an (n+2)-valent aromatic ring group.

n represents an integer of 1 to 5.

Examples of the alkyl group of $R_{41}$, $R_{42}$, and $R_{43}$ in General Formula (I) preferably include alkyl groups having 20 or less carbon atoms which may have a substituent, such as a methyl group, an ethyl group, a propyl group, an isopropyl group, an n-butyl group, a sec-butyl group, a hexyl group, a 2-ethylhexyl group, an octyl group, and a dodecyl group, more preferably alkyl groups having 8 or less carbon atoms, and particularly preferably alkyl groups having 3 or less carbon atoms.

The cycloalkyl group of $R_{41}$, $R_{42}$, and $R_{43}$ in General Formula (I) may be monocyclic or polycyclic. Examples of the cycloalkyl group preferably include monocyclic cycloalkyl groups having 3 to 8 carbon atoms which may have a substituent, such as a cyclopropyl group, a cyclopentyl group, and a cyclohexyl group.

Examples of the halogen atom of $R_{41}$, $R_{42}$, and $R_{43}$ in General Formula (I) include a fluorine atom, a chlorine atom, a bromine atom, and an iodine atom, among which particularly preferred is a fluorine atom.

The alkyl group contained in the alkoxycarbonyl group of $R_{41}$, $R_{42}$, and $R_{43}$ in General Formula (I) is preferably the same as the alkyl group represented by $R_{41}$, $R_{42}$, and $R_{43}$.

Examples of preferred substituents in each of the above-mentioned groups include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The number of carbon atoms in the substituents is preferably 8 or less.

$Ar_4$ represents an (n+1)-valent aromatic ring group. The divalent aromatic ring group in the case where n is 1 may have a substituent, and preferred examples thereof include arylene groups having 6 to 18 carbon atoms, such as a phenylene group, a tolylene group, a naphthylene group, and an anthracenylene group, and aromatic ring groups containing a hetero ring, such as thiophene, furan, pyrrole, benzothiophene, benzofuran, benzopyrrole, triazine, imidazole, benzimidazole, triazole, thiadiazole, and thiazole.

Specific examples of the (n+1)-valent aromatic ring group in the case where n is an integer of 2 or more preferably include groups formed by removing an (n−1) number of any hydrogen atoms from the above-mentioned specific examples of the divalent aromatic ring group.

The (n+1)-valent aromatic ring group may further have a substituent.

Examples of the substituent that the above-mentioned alkyl group, cycloalkyl group, alkoxycarbonyl group, alkylene group, and (n+1)-valent aromatic ring group may have include alkyl groups exemplified for $R_{41}$, $R_{42}$, and $R_{43}$ in General Formula (I), alkoxy groups such as a methoxy group, an ethoxy group, a hydroxyethoxy group, a propoxy group, a hydroxypropoxy group, and a butoxy group; and aryl groups such as a phenyl group.

Examples of the alkyl group for $R_{64}$ in —CONR$_{64}$— ($R_{64}$ represents a hydrogen atom or an alkyl group) represented by $X_4$ preferably include alkyl groups having 20 or less carbon atoms which may have a substituent, such as a methyl group, an ethyl group, a propyl group, an isopropyl group, an n-butyl group, a sec-butyl group, a hexyl group, a 2-ethylhexyl group, an octyl group, and a dodecyl group, and more preferably include alkyl groups having 8 or less carbon atoms.

$X_4$ is preferably a single bond, —COO—, or —CONH— and more preferably a single bond or —COO—.

Examples of the alkylene group for $L_4$ preferably include alkylene groups having 1 to 8 carbon atoms which may have a substituent, such as a methylene group, an ethylene group, a propylene group, a butylene group, a hexylene group, and an octylene group.

$Ar_4$ is more preferably an aromatic ring group having 6 to 18 carbon atoms which may have a substituent, and particularly preferably a benzene ring group, a naphthalene ring group, or a biphenylene ring group.

The repeating unit represented by General Formula (I) is preferably a repeating unit having a hydroxystyrene structure. That is, $Ar_4$ is preferably a benzene ring group.

The repeating unit having a phenolic hydroxyl group contained in the resin (A) is preferably a repeating unit represented by General Formula (1).

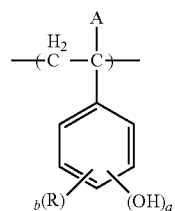

(1)

In General Formula (1),

A represents a hydrogen atom, an alkyl group, a cycloalkyl group, a halogen atom, or a cyano group.

R represents a halogen atom, an alkyl group, a cycloalkyl group, an aryl group, an alkenyl group, an aralkyl group, an alkoxy group, an alkylcarbonyloxy group, an alkylsulfonyloxy group, an alkyloxycarbonyl group, or an aryloxycarbonyl group; in the case where there are a plurality of R's, they may be the same or different. In the case of having a plurality of R's, they may form a ring in cooperation with each other. R is preferably a hydrogen atom.

a represents an integer of 1 to 3 and is preferably 1.

b represents an integer of 0 to (3-a).

The repeating unit having a phenolic hydroxyl group contained in the resin (A) may be preferably, for example, a repeating unit represented by General Formula (p1).

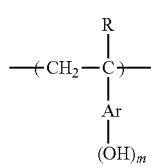

(p1)

R in General Formula (p1) represents a hydrogen atom, a halogen atom, or a linear or branched alkyl group having 1 to 4 carbon atoms. A plurality of R's may be the same or different from one another. R in General Formula (p1) is particularly preferably a hydrogen atom.

The Ar in General Formula (p1) represents an aromatic ring, examples of which include aromatic hydrocarbon rings having 6 to 18 carbon atoms which may have a substituent, such as a benzene ring, a naphthalene ring, an anthracene ring, a fluorene ring, and a phenanthrene ring, and aromatic hetero rings containing a hetero ring, such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, a thiazole ring. Among them, most preferred is a benzene ring.

m in General Formula (p1) represents an integer of 1 to 5 and is preferably 1.

Specific examples of the repeating unit having a phenolic hydroxyl group contained in the resin (A) are shown below, but the present invention is not limited thereto. In the formulae, a represents 1 or 2.

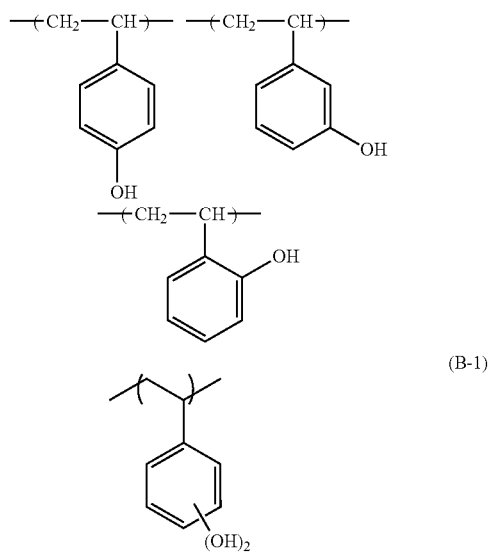

(B-1)

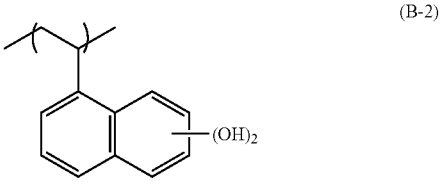

(B-2)

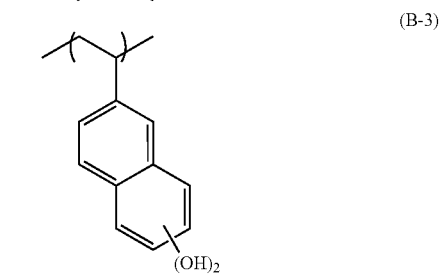

(B-3)

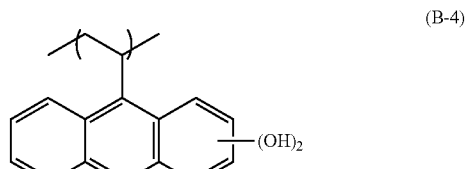

(B-4)

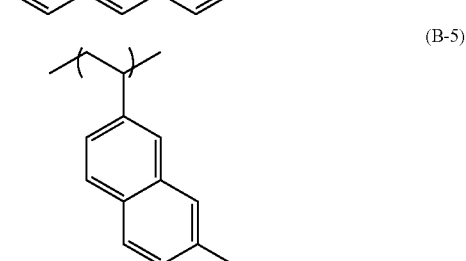

(B-5)

-continued (B-6) — phenanthrene with (OH)₂
(B-7) — indane derivative with (OH)₂
(B-8) — tetrahydronaphthalene with (OH)₂
(B-9) — methylphenol with (OH)₂
(B-10) — ethylphenol with (OH)₂
(B-11) — tert-butylphenol with (OH)₂
(B-12) — methoxyphenol with (OH)₂

(B-13) — H₃CO-substituted phenol with (OH)₂
(B-14) — dimethylphenol with (OH)₂
(B-15) — methyl, methoxy phenol with (OH)₂
(B-16) — acetyl phenol with (OH)₂
(B-17) — methyl ester benzoate with (OH)₂
(B-18) — chlorophenol with (OH)₂
(B-19) — bromophenol with (OH)₂

(B-20) 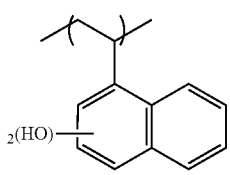
(B-21) 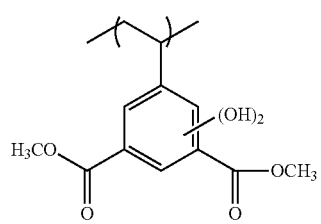
(B-22) 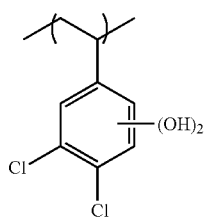
(B-23) 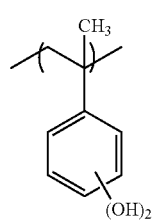
(B-24) 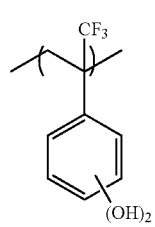
(B-25) 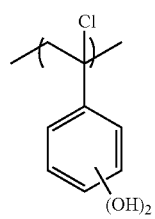
(B-26) 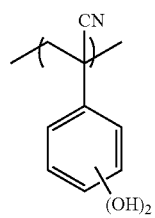
(B-27) 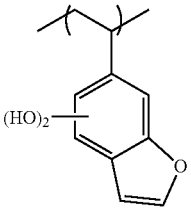
(B-28) 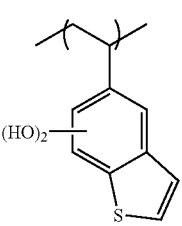
(B-29) 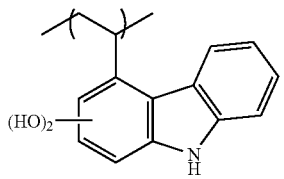
(B-30) 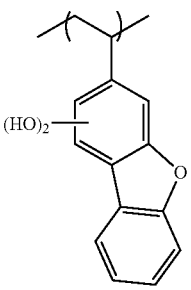
(B-31) 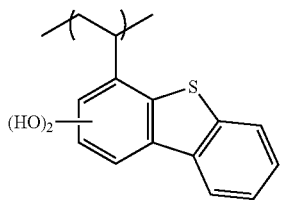
(B-32) 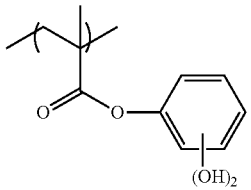
(B-33) 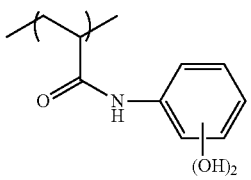

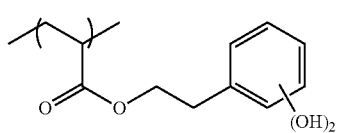
(B-34)

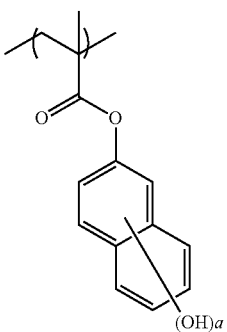
(B-35)

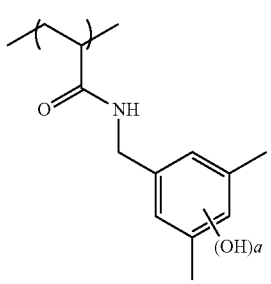
(B-36)

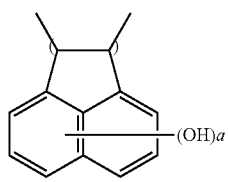
(B-37)

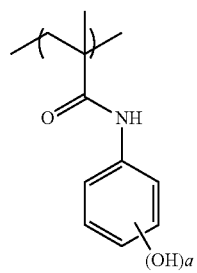
(B-38)

The content of the repeating unit having a phenolic hydroxyl group is preferably 0 to 50 mol %, more preferably 0 to 45 mol %, and still more preferably 0 to 40 mol %, with respect to all repeating units in the resin (A).

The repeating unit having a group capable of decomposing by the action of an acid to generate a carboxyl group, which is contained in the resin (A), is a repeating unit having a group in which a hydrogen atom of the carboxyl group has been substituted with a group capable of decomposing and leaving by the action of an acid.

Examples of the group capable of leaving by the action of an acid include —C($R_{36}$)($R_{37}$)($R_{38}$), —C($R_{36}$)($R_{37}$)($OR_{39}$), and —C($R_{01}$)($R_{02}$)($OR_{39}$).

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

The repeating unit having a group capable of decomposing by the action of an acid to generate a carboxyl group, which is contained in the resin (A), is preferably a repeating unit represented by General Formula (AI).

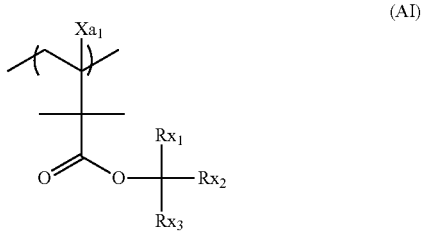
(AI)

In General Formula (AI), $Xa_1$ represents a hydrogen atom or an alkyl group which may have a substituent.

T represents a single bond or a divalent linking group.

$Rx_1$ to $Rx_3$ each independently represent an alkyl group (linear or branched) or a cycloalkyl group (monocyclic or polycyclic). Meanwhile, in the case where all of $Rx_1$ to $Rx_3$ are an alkyl group (linear or branched), at least two of $Rx_1$ to $Rx_3$ are preferably a methyl group.

Two of $Rx_1$ to $Rx_3$ may be bonded to form a cycloalkyl group (monocyclic or polycyclic).

The alkyl group which may have a substituent, which is represented by $Xa_1$, may be, for example, a methyl group or a group represented by —$CH_2$—$R_{11}$. $R_{11}$ represents a halogen atom (a fluorine atom or the like), a hydroxyl group, or a monovalent organic group which is, for example, an alkyl group having 5 or less carbon atoms or an acyl group having 5 or less carbon atoms, preferably an alkyl group having 3 or less carbon atoms, and more preferably a methyl group. In one embodiment, $Xa_1$ is preferably a hydrogen atom, a methyl group, a trifluoromethyl group, or a hydroxymethyl group.

Examples of the divalent linking group of T include an alkylene group, a —COO-Rt- group, and an —O-Rt- group. In the formulae, Rt represents an alkylene group or a cycloalkylene group.

T is preferably a single bond or a —COO-Rt- group. Rt is preferably an alkylene group having 1 to 5 carbon atoms and more preferably a —$CH_2$— group, a —$(CH_2)_2$— group, or a —$(CH_2)_3$— group.

The alkyl group of $Rx_1$ to $Rx_3$ is preferably an alkyl group having 1 to 4 carbon atoms, such as a methyl group, an ethyl group, an n-propyl group, an isopropyl group, an n-butyl group, an isobutyl group, or a t-butyl group.

The cycloalkyl group of $Rx_1$ to $Rx_3$ is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group.

The cycloalkyl group formed by bonding of two of $Rx_1$ to $Rx_3$ is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group. The monocyclic cycloalkyl group having 5 or 6 carbon atoms is particularly preferable.

In the cycloalkyl group formed by bonding of two of $Rx_1$ to $Rx_3$, for example, one of methylene groups constituting the ring may be substituted with a heteroatom such as an oxygen atom, or a group having a heteroatom such as a carbonyl group.

With respect to the repeating unit represented by General Formula (AI), preferred is, for example, an embodiment in which $Rx_1$ is a methyl group or an ethyl group, and $Rx_2$ and $Rx_3$ are bonded to each other to form the above-mentioned cycloalkyl group.

The above respective groups may have a substituent, and examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), with the number of carbon atoms being preferably 8 or less.

The repeating unit represented by General Formula (AI) is preferably an acid-decomposable (meth)acrylic acid tertiary alkyl ester-based repeating unit (a repeating unit in which $Xa_1$ represents a hydrogen atom or a methyl group, and T represents a single bond). More preferred is a repeating unit in which $Rx_1$ to $Rx_3$ each independently represent a linear or branched alkyl group, and still more preferred is a repeating unit in which $Rx_1$ to $Rx_3$ each independently represent a linear alkyl group.

Specific examples of the repeating unit having a group capable of decomposing by the action of an acid to generate a carboxyl group, which is contained in the resin (A), are shown below, but the present invention is not limited thereto.

In the specific examples, Rx and $Xa_1$ represent a hydrogen atom, $CH_3$, $CF_3$, or $CH_2OH$. Rxa and Rxb each represent an alkyl group having 1 to 4 carbon atoms. Z represents a substituent containing a polar group, and in the case where a plurality of Z's are present, they are each independent from one another. p represents 0 or a positive integer. Examples of the substituent containing a polar group, which is represented by Z, include a linear or branched alkyl group and a cycloalkyl group, each having a hydroxyl group, a cyano group, an amino group, an alkyl amide group or a sulfonamide group, among which preferred is an alkyl group having a hydroxyl group. The branched alkyl group is particularly preferably an isopropyl group.

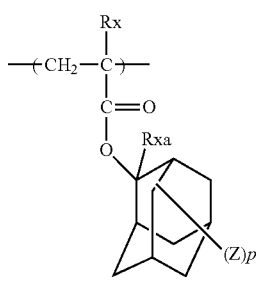

1

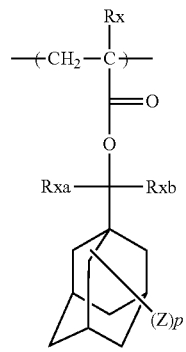

2

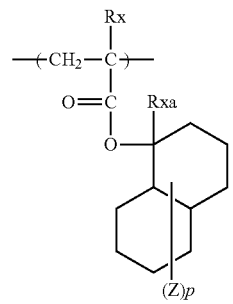

3

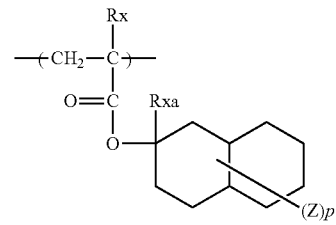

4

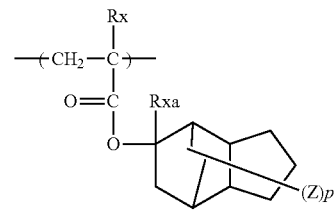

5

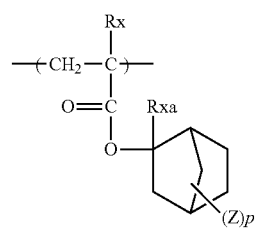

6

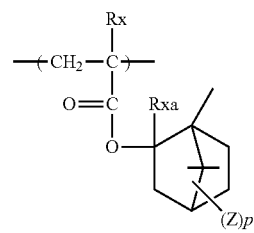

7

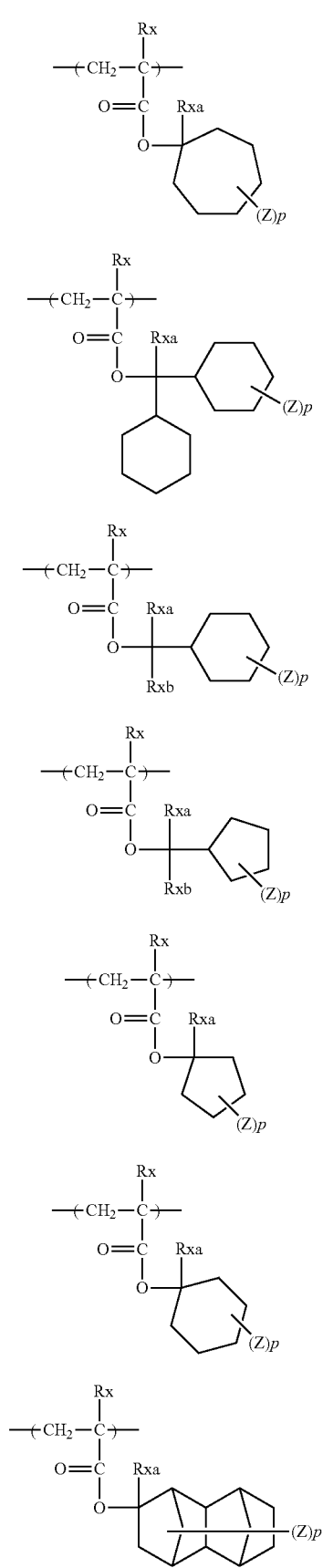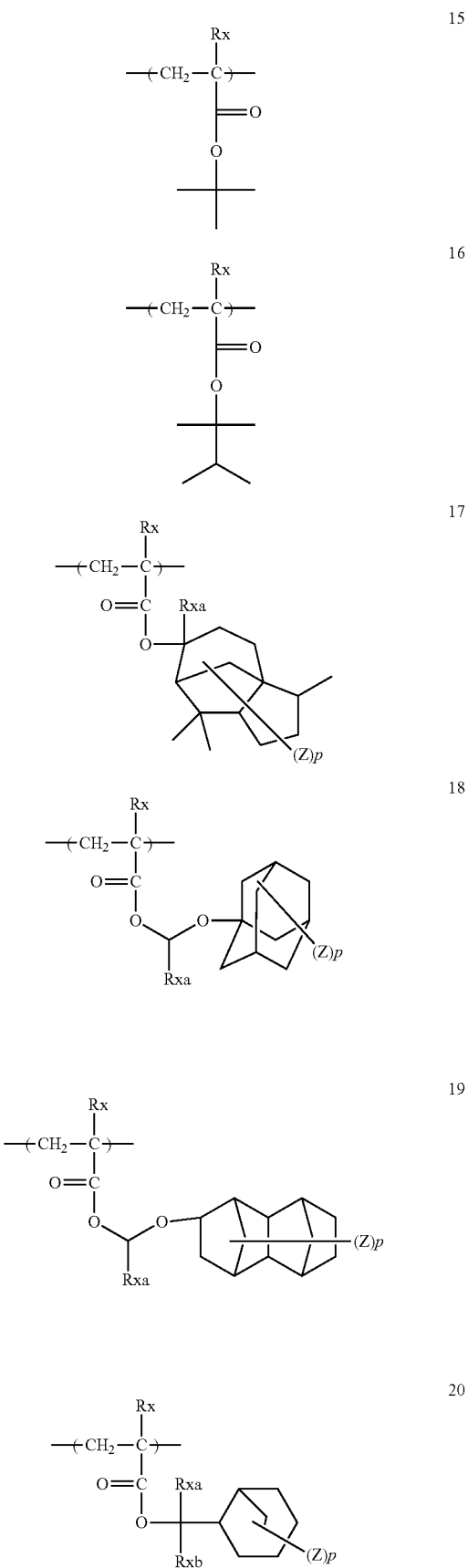

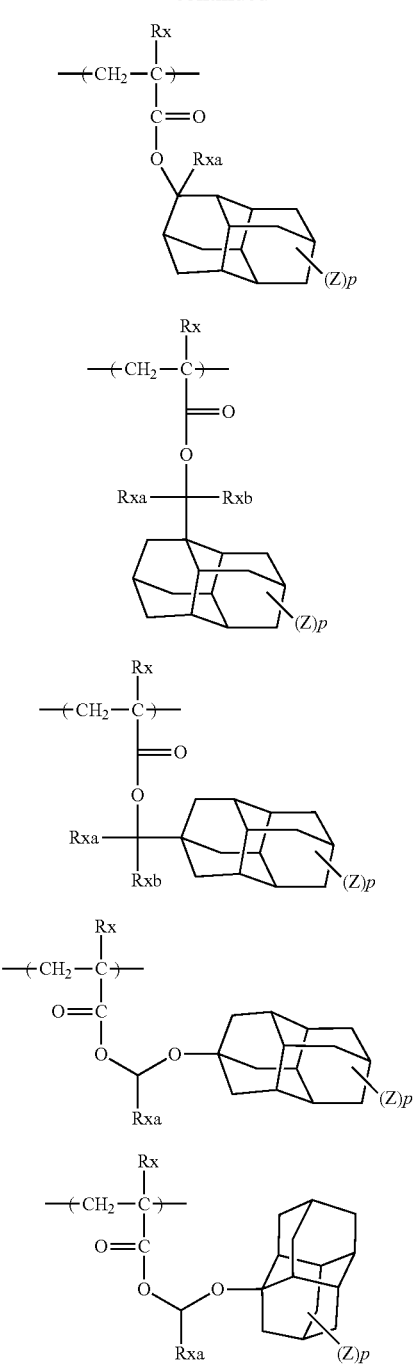

The content of the repeating unit having a group capable of decomposing by the action of an acid to generate a carboxyl group is preferably 20 to 90 mol %, more preferably 25 to 80 mol %, and still more preferably 30 to 70 mol %, with respect to all repeating units in the resin (A).

The resin (A) preferably further contains a repeating unit having a lactone group.

As for the lactone group, any group may be used as long as it has a lactone structure, but a group having a 5- to 7-membered ring lactone structure is preferable. The 5- to 7-membered ring lactone structure is preferably condensed with another ring structure in a fashion to form a bicyclo structure or a Spiro structure. It is more preferred that the resin (A) contains a repeating unit containing a group having a lactone structure represented by any one of General Formulae (LC1-1) to (LC1-17). The group having a lactone structure may be directly bonded to the main chain. Preferred lactone structures are groups represented by General Formulae (LC1-1), (LC1-4), (LC1-5), (LC1-6), (LC1-13), and (LC1-14).

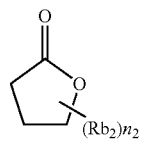

LC1-1

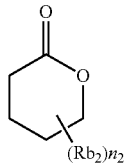

LC1-2

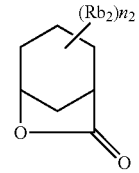

LC1-3

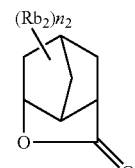

LC1-4

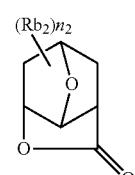

LC1-5

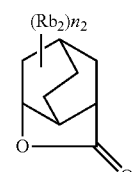

LC1-6

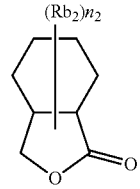

LC1-7

-continued

LC1-8 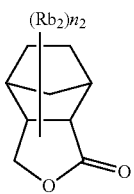

LC1-9 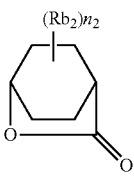

LC1-10 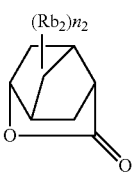

LC1-11 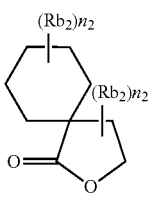

LC1-12 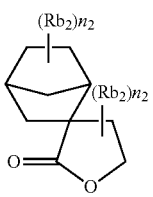

LC1-13 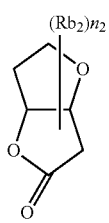

LC1-14 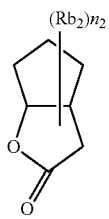

LC1-15 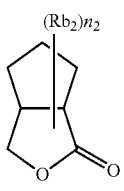

-continued

LC1-16 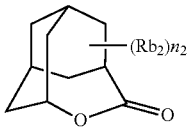

LC1-17 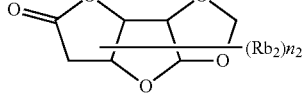

The lactone structure moiety may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, and an acid-decomposable group. $n_2$ represents an integer of 0 to 4. In the case where $n_2$ is 2 or more, a plurality of $Rb_2$'s may be the same or different from one another or may be bonded to each other to form a ring.

The repeating unit containing a group having a lactone structure represented by any one of General Formulae (LC1-1) to (LC1-17) may be, for example, a repeating unit represented by General Formula (AI).

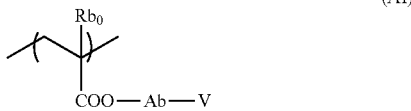

(AI)

In General Formula (AI), $Rb_0$ represents a hydrogen atom, a halogen atom, or an alkyl group having 1 to 4 carbon atoms.

Preferred examples of the substituent which may be possessed by the alkyl group of $Rb_0$ include a hydroxyl group and a halogen atom.

Examples of the halogen atom of $Rb_0$ include a fluorine atom, a chlorine atom, a bromine atom, and an iodine atom. $Rb_0$ is preferably a hydrogen atom or a methyl group.

Ab represents a single bond, an alkylene group, a divalent linking group having a monocyclic or polycyclic alicyclic hydrocarbon structure, an ether group, an ester group, a carbonyl group, a carboxyl group, or a divalent group formed by combining these groups. Preferred is a single bond or a linking group represented by -$Ab_1$-$CO_2$—. $Ab_1$ is a linear or branched alkylene group or a monocyclic or polycyclic cycloalkylene group, preferably a methylene group, an ethylene group, a cyclohexylene group, an adamantylene group, or a norbornylene group.

V represents a group represented by any one of General Formulae (LC1-1) to (LC1-17).

The repeating unit having a lactone structure usually has an optical isomer, but any optical isomer may be used. One optical isomer may be used alone or a mixture of a plurality of optical isomers may be used. In the case of mainly using one optical isomer, the optical purity (ee) thereof is preferably 90 or more and more preferably 95 or more.

Specific examples of the repeating unit having a group having a lactone structure are shown below, but the present invention is not limited thereto.

(In the formulae, Rx is H, CH₃, CH₂OH, or CF₃)
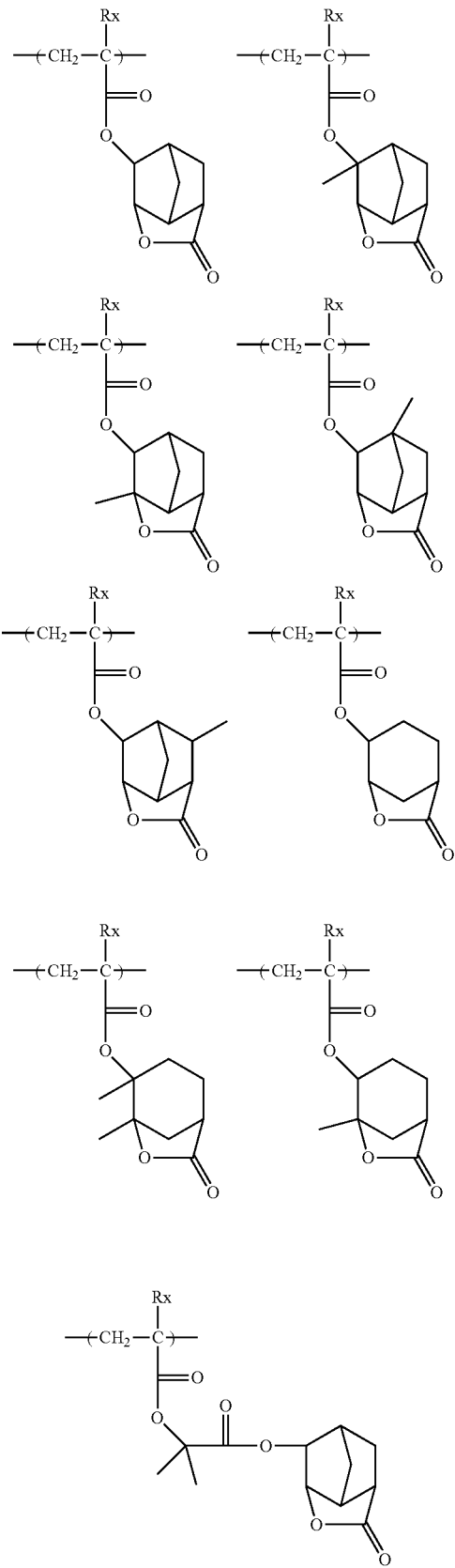
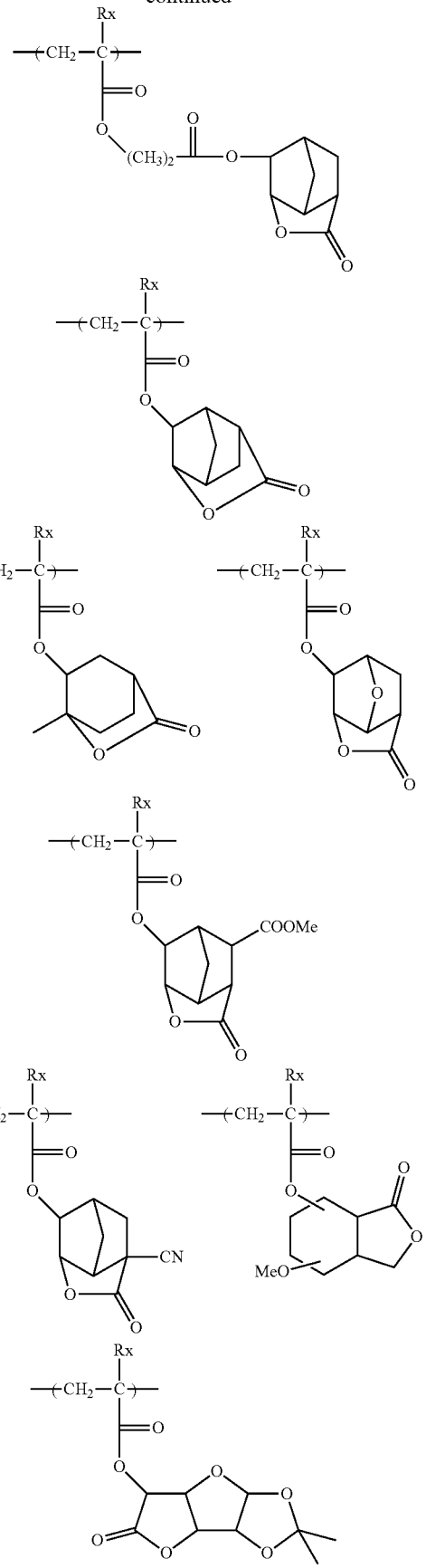

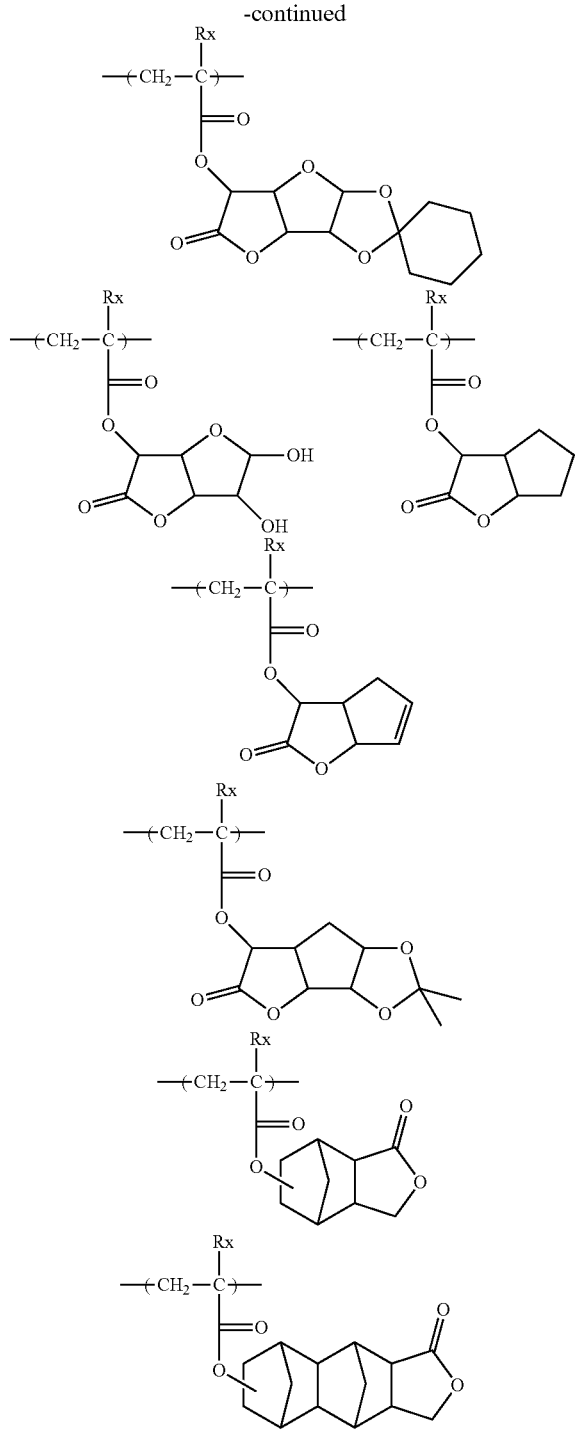

or a norbornane group. The polar group is preferably a hydroxyl group or a cyano group.

Specific examples of the repeating unit having a polar group are shown below, but the present invention is not limited thereto.

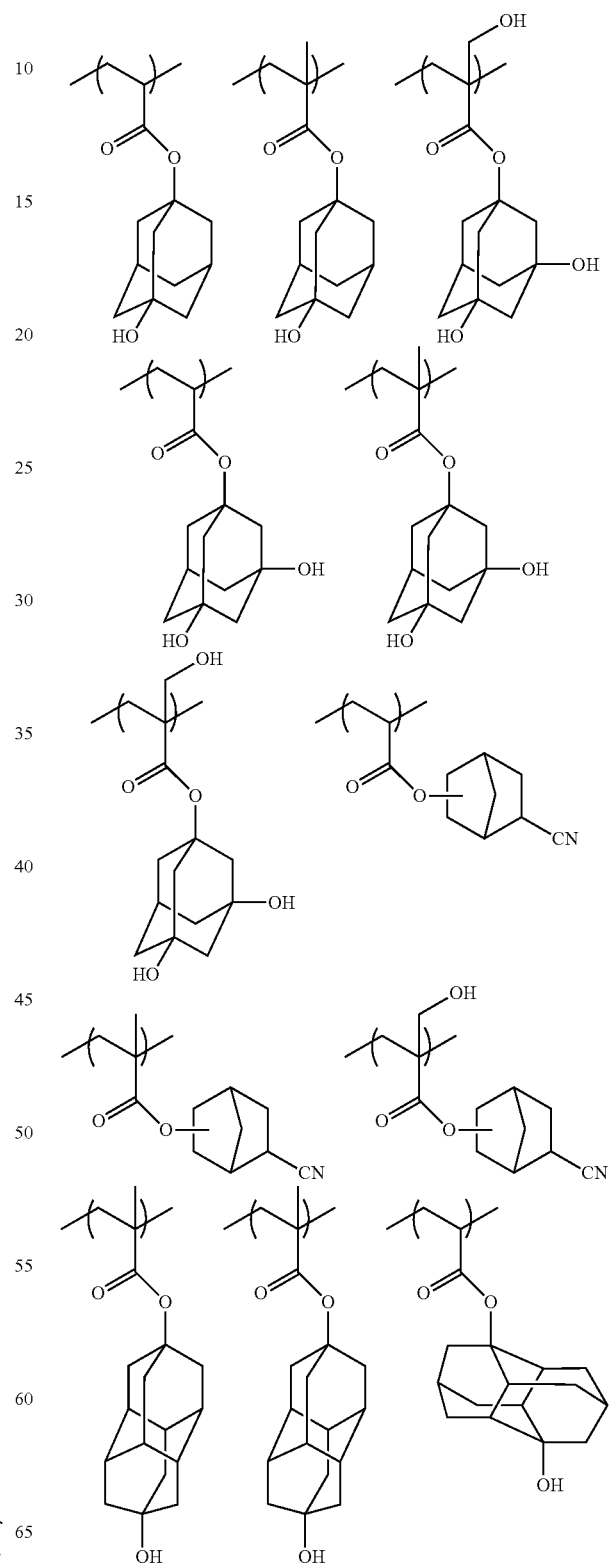

The content of the repeating unit having a lactone group is preferably 1 to 30 mol %, more preferably 5 to 25 mol %, and still more preferably 5 to 20 mol %, with respect to all repeating units in the resin (A).

The resin (A) may further have a repeating unit containing an organic group having a polar group, in particular, a repeating unit having an alicyclic hydrocarbon structure substituted by a polar group.

Thus, adhesiveness to a substrate and affinity to a developer are improved. The alicyclic hydrocarbon structure of the alicyclic hydrocarbon structure substituted by a polar group is preferably an adamantyl group, a diamantyl group,

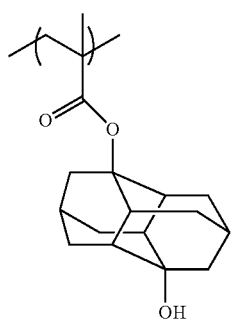

In the case where the resin (A) has a repeating unit containing an organic group having a polar group, the content thereof is preferably 1 to 30 mol %, more preferably 5 to 25 mol %, and still more preferably 5 to 20 mol %, with respect to all repeating units in the resin (A).

A repeating unit having a group capable of generating an acid upon irradiation with actinic rays or radiation (photoacid generating group) may be further included as a repeating unit other than the above-mentioned repeating units. In this case, it can be considered that this repeating unit having a photoacid generating group corresponds to a compound (B) capable of generating an acid upon irradiation with actinic rays or radiation which will be described hereinafter.

Such a repeating unit may be, for example, a repeating unit represented by General Formula (4).

$$-(CH_2-\underset{\underset{\underset{R^{40}}{L^{41}}}{L^{42}}}{\overset{R^{41}}{C}})- \quad (4)$$

$R^{41}$ represents a hydrogen atom or a methyl group. $L^{41}$ represents a single bond or a divalent linking group. $L^{42}$ represents a divalent linking group. $R^{40}$ represents a structural moiety capable of decomposing upon irradiation with actinic rays or radiation to generate an acid on the side chain.

Specific examples of the repeating unit represented by General Formula (4) are shown below, but the present invention is not limited thereto.

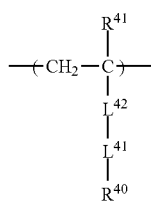

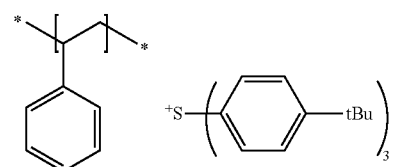

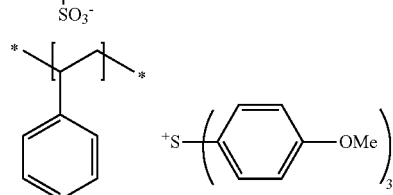

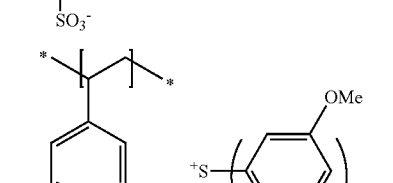

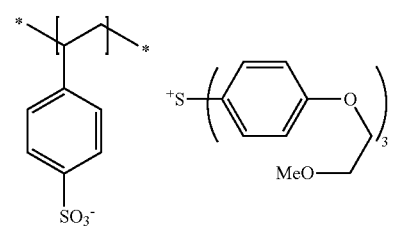

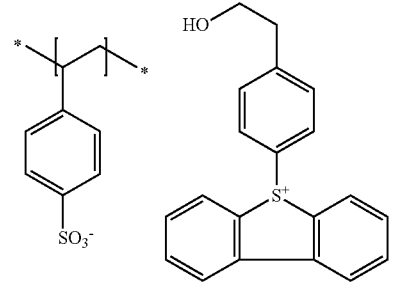

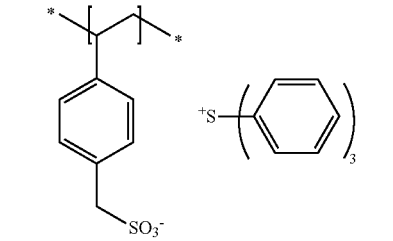

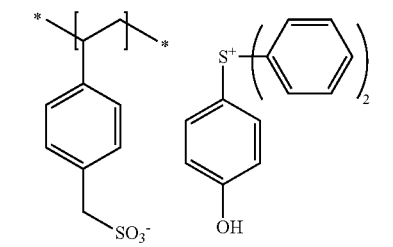

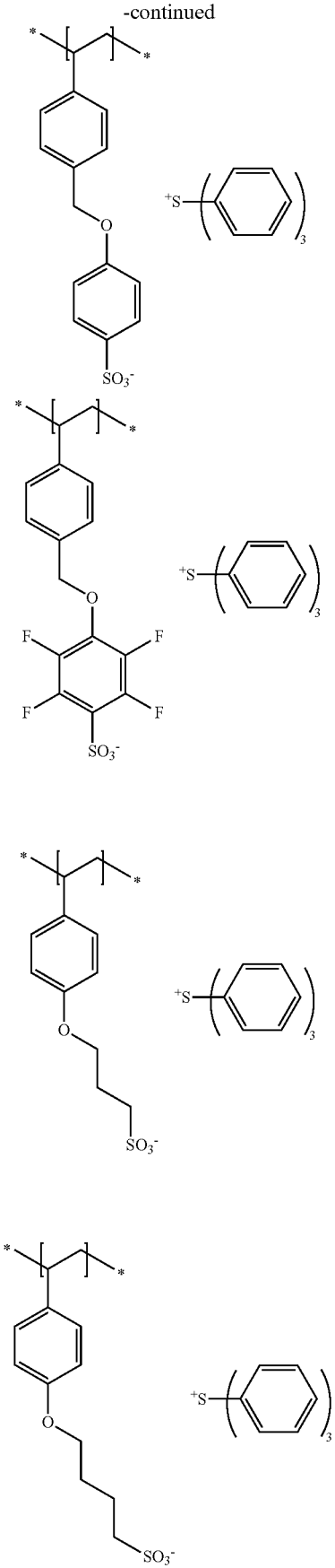

Additional examples of the repeating unit represented by General Formula (4) include those repeating units described in paragraphs [0094] to [0105] of JP2014-041327A.

In the case where the resin (A) contains a repeating unit having a photoacid generating group, the content of the repeating unit having a photoacid generating group is preferably 1 to 40 mol %, more preferably 5 to 35 mol %, and still more preferably 5 to 30 mol %, with respect to all repeating units in the resin (A).

The resin (A) can be synthesized in accordance with a conventional method (for example, radical polymerization). Examples of the general synthesis method include a bulk polymerization method in which polymerization is carried out by dissolving monomer species and an initiator in a solvent and heating the solution, and a dropwise addition polymerization method in which a solution of monomer species and an initiator is added dropwise to a heating solvent over 1 hour to 10 hours, with the dropwise addition polymerization method being preferable.

Examples of the reaction solvent include ethers such as tetrahydrofuran, 1,4-dioxane, and diisopropyl ether; ketones such as methyl ethyl ketone and methyl isobutyl ketone; ester-based solvents such as ethyl acetate; amide solvents such as dimethylformamide and dimethylacetamide; and solvents which dissolve the resist composition of the present invention, such as propylene glycol monomethyl ether acetate, propylene glycol monomethyl ether, and cyclohexanone, which will be described hereinafter. It is preferred to carry out polymerization using the same solvent as the solvent used in the resist composition of the present invention. Thus, generation of particles during storage can be suppressed.

The polymerization reaction is preferably carried out under an inert gas atmosphere such as nitrogen or argon. As the polymerization initiator, a commercially available radical initiator (an azo-based initiator, peroxide, or the like) is used to initiate the polymerization. As the radical initiator, an azo-based initiator is preferable, and the azo-based initiator having an ester group, a cyano group, or a carboxyl group is preferable. Preferred examples of the initiator include azobisisobutyronitrile, azobisdimethylvaleronitrile, and dimethyl 2,2'-azobis(2-methyl propionate). The initiator is added or added in portionwise, as desired. After the reaction has been completed, the reaction mixture is poured into a solvent, and then a desired polymer is recovered by a method such as powder or solid recovery. The concentration of the reactant is 5 to 50 mass % and preferably 10 to 30 mass %. The reaction temperature is usually 10° C. to 150° C., preferably 30° C. to 120° C., and more preferably 60° C. to 100° C.

For the purification, use can be made of a conventional method such as a liquid-liquid extraction method by washing with water or combining suitable solvents to remove the residual monomer and oligomer components, a purification method in the solution state which includes conducting ultrafiltration to thereby extract and remove only components having a specific molecular weight or less, a reprecipitation method which includes dropwise adding a resin solution to a poor solvent, thus solidifying the resin in the poor solvent and removing the residual monomers and the like, or a purification method in the solid state which includes filtering a resin slurry and washing with a poor solvent.

The weight-average molecular weight of the resin (A), as calculated in terms of polystyrene by the GPC method, is preferably 1,000 to 200,000, more preferably 3,000 to 20,000, and most preferably 5,000 to 15,000. By setting the weight-average molecular weight to 1,000 to 200,000, it is possible to prevent deterioration of heat resistance and dry etching resistance and it is also possible to prevent deterioration of developability and deterioration of film formability due to an increase in viscosity.

In particularly preferred another embodiment, the weight-average molecular weight of the resin (A), as calculated in terms of polystyrene by the GPC method, is preferably 3,000 to 9,500. By setting the weight-average molecular weight to 3,000 to 9,500, the formation of particularly a resist residue (hereinafter, also referred to as "scum") can be prevented and thus a better pattern can be formed.

Use is made of a resin having a dispersity (molecular weight distribution) of usually 1 to 5, preferably 1 to 3, more preferably 1.2 to 3.0, and particularly preferably 1.2 to 2.0. A resin having a smaller dispersity can bring about superior resolution, resist shape, smoothness in the side wall of a resist pattern, and roughness.

In the resist composition of the present invention, the content of the resin (A) is preferably 50 to 99.9 mass % and more preferably 60 to 99.0 mass %, based on the total solid content.

In the resist composition of the present invention, the resins (A) may be used alone or in combination of two or more thereof.

Further, the resin (A) may contain a repeating unit represented by General Formula (VI).

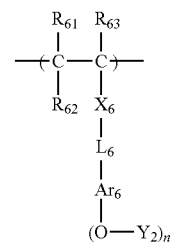

(VI)

In General Formula (VI), $R_{61}$, $R_{62}$, and $R_{63}$ each independently represent a hydrogen atom, an alkyl group, a cycloalkyl group, a halogen atom, a cyano group, or an alkoxycarbonyl group. Meanwhile, $R_{62}$ and $Ar_6$ may be bonded to each other to form a ring, and $R_{62}$ in this case represents a single bond or an alkylene group.

$X_6$ represents a single bond, —COO—, or —CONR$_{64}$—. $R_{64}$ represents a hydrogen atom or an alkyl group.

$L_6$ represents a single bond or an alkylene group.

$Ar_6$ represents an (n+1)-valent aromatic ring group, and $Ar_6$ represents an (n+2)-valent aromatic ring group in the case of being bonded to $R_{62}$ to form a ring.

In the case of n≥2, $Y_2$'s each independently represent a hydrogen atom or a group capable of leaving by the action of an acid, provided that at least one of $Y_2$'s represents a group capable of leaving by the action of an acid.

n represents an integer of 1 to 4.

The group $Y_2$ capable of leaving by the action of an acid is more preferably a structure represented by General Formula (VI-A).

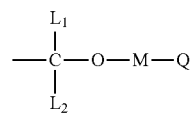

(VI-A)

Here, $L_1$ and $L_2$ each independently represent a hydrogen atom, an alkyl group, a cycloalkyl group, an aryl group, or a group formed by combining an alkylene group and an aryl group.

M represents a single bond or a divalent linking group.

Q represents an alkyl group, a cycloalkyl group which may contain a heteroatom, an aryl group which may contain a heteroatom, an amino group, an ammonium group, a mercapto group, a cyano group, or an aldehyde group.

At least two of Q, M, and $L_1$ may be bonded to form a ring (preferably, a 5-membered or 6-membered ring).

The repeating unit represented by General Formula (VI) is preferably a repeating unit represented by General Formula (3).

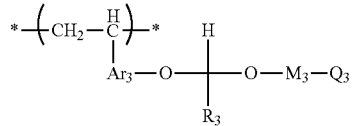

(3)

In General Formula (3),

Ar$_4$ represents an aromatic ring group.

R$_3$ represents a hydrogen atom, an alkyl group, a cycloalkyl group, an aryl group, an aralkyl group, an alkoxy group, an acyl group, or a heterocyclic group.

M$_3$ represents a single bond or a divalent linking group.

Q$_3$ represents an alkyl group, a cycloalkyl group, an aryl group, or a heterocyclic group.

At least two of Q$_3$, M$_3$, and R$_3$ may be bonded to form a ring.

The aromatic ring group represented by Ar$_4$ is the same as Ar$_6$ in General Formula (VI) in the case where n in General Formula (VI) is 1, more preferably a phenylene group or a naphthylene group, and still more preferably a phenylene group.

Specific examples of the repeating unit represented by General Formula (VI) are shown below, but the present invention is not limited thereto.

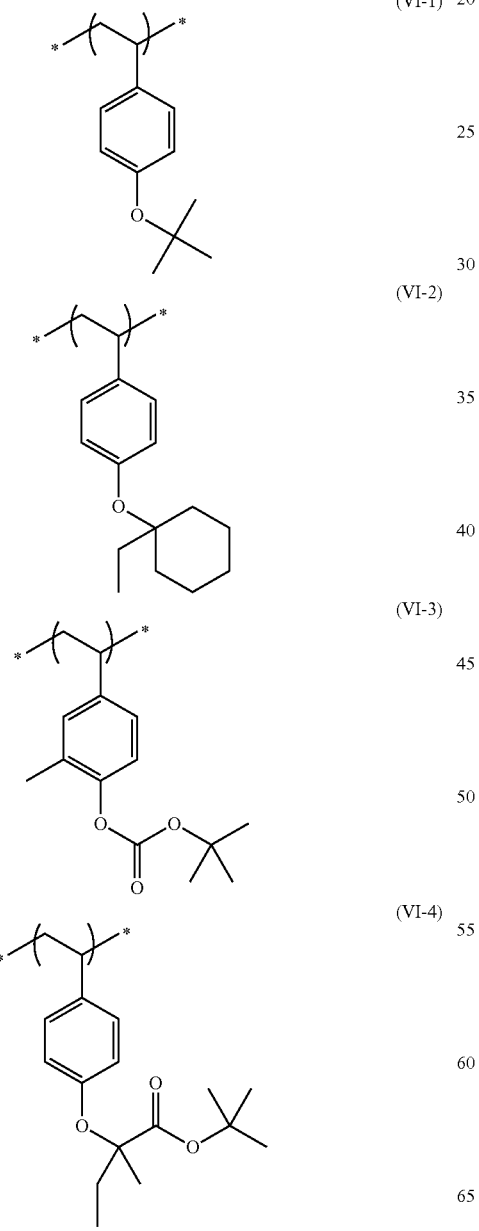

(VI-1)

(VI-2)

(VI-3)

(VI-4)

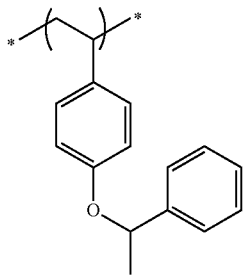

(VI-5)

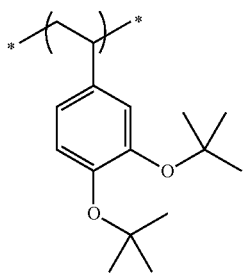

(VI-6)

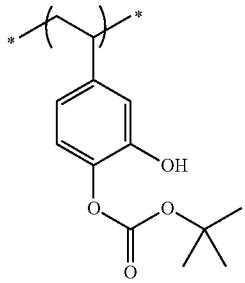

(VI-7)

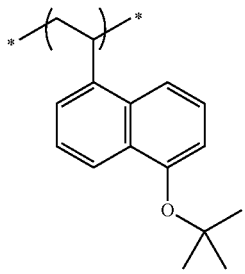

(VI-8)

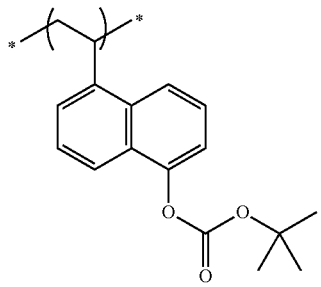

(VI-9)

(VI-10) 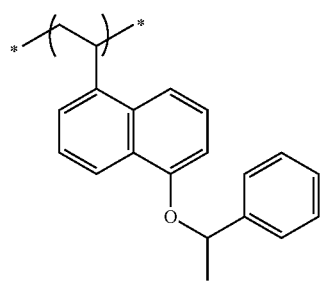
(VI-11) 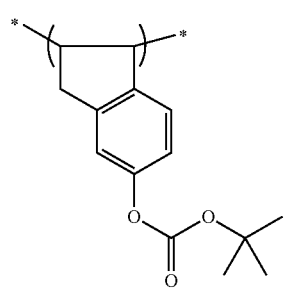
(VI-12) 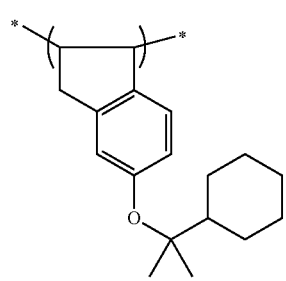
(VI-13) 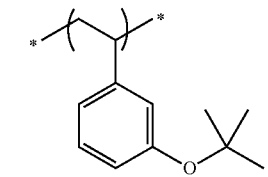
(VI-14) 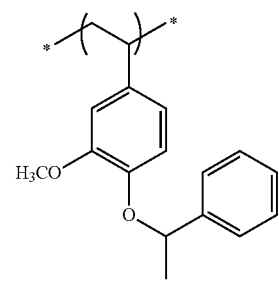
(VI-15) 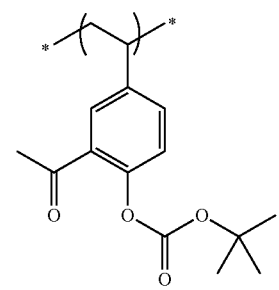
(VI-16) 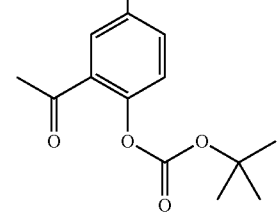
(VI-17) 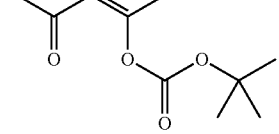
(VI-18) 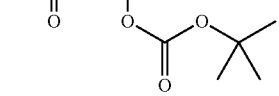
(VI-19) 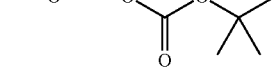
(VI-20) 

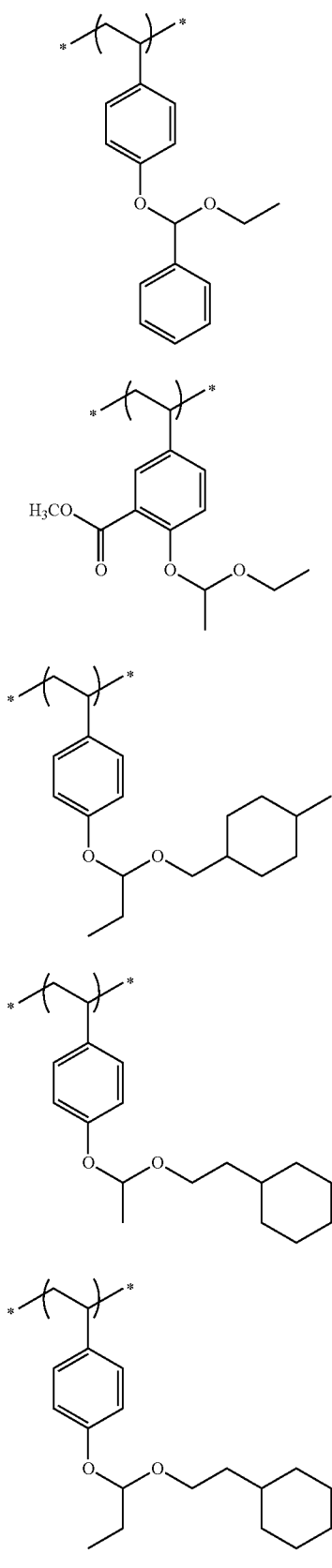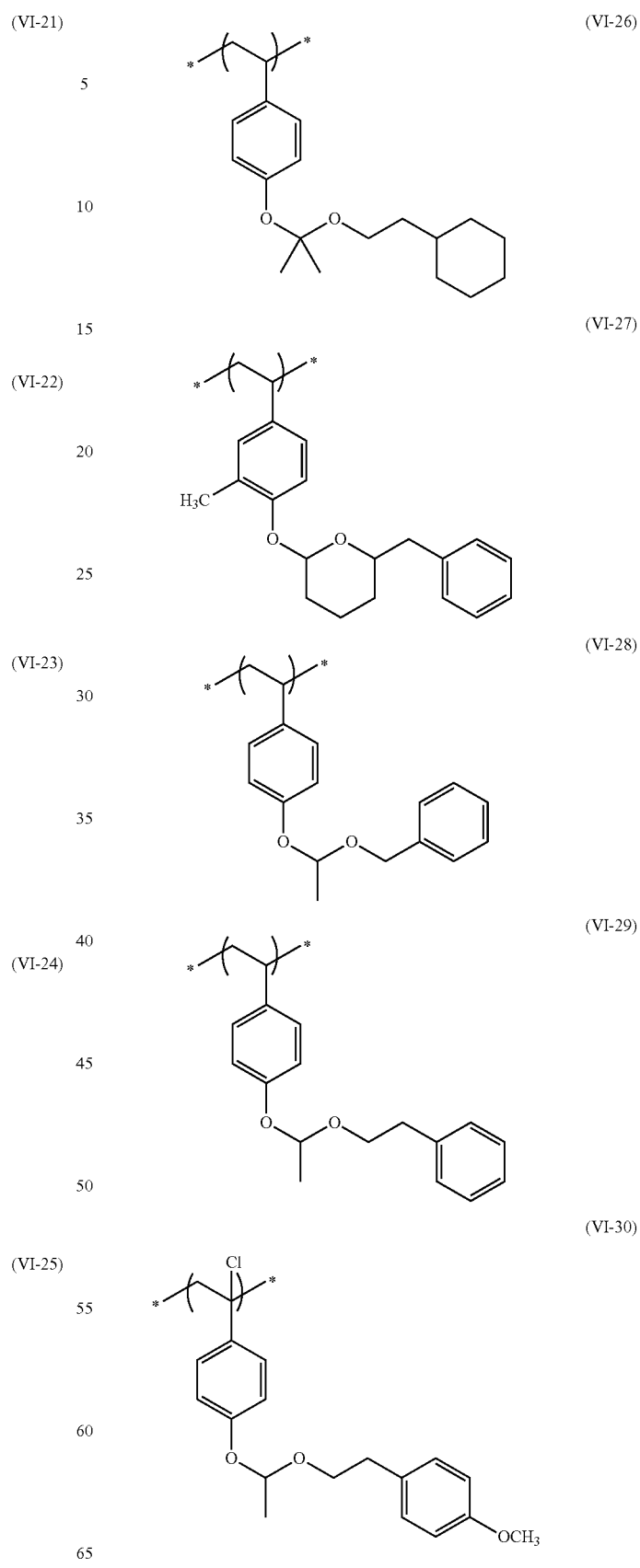

(VI-31)
(VI-32)
(VI-33)
(VI-34)
(VI-35)

The resin (A) also preferably contains a repeating unit represented by General Formula (5).

$$\text{(5)}$$

In General Formula (5), $R_{41}$, $R_{42}$, and $R_{43}$ each independently represent a hydrogen atom, an alkyl group, a cycloalkyl group, a halogen atom, a cyano group, or an alkoxycarbonyl group. $R_{42}$ and $L_4$ may be bonded to form a ring, and $R_{42}$ in this case represents an alkylene group.

$L_4$ represents a single bond or a divalent linking group, and $L_4$ represents a trivalent linking group in the case of forming a ring together with $R_{42}$.

$R_{44}$ and $R_{45}$ represent a hydrogen atom, an alkyl group, a cycloalkyl group, an aryl group, an aralkyl group, an alkoxy group, an acyl group, or a heterocyclic group.

$M_4$ represents a single bond or a divalent linking group.

$Q_4$ represents an alkyl group, a cycloalkyl group, an aryl group, or a heterocyclic group.

At least two of $Q_4$, $M_4$, and $R_{44}$ may be bonded to form a ring.

$R_{41}$, $R_{42}$, and $R_{43}$ each independently represent a hydrogen atom, an alkyl group, a cycloalkyl group, a halogen atom, a cyano group, or an alkoxycarbonyl group. $R_{42}$ may be bonded to $L_4$ to form a ring, and $R_{42}$ in this case represents an alkylene group.

$L_4$ represents a single bond or a divalent linking group, and in the case of forming a ring with $R_{42}$, $L_4$ represents a trivalent linking group.

$R_{44}$ and $R_{45}$ have the same definition as $R_3$ in General Formula (3), and preferred ranges thereof are also the same.

$M_4$ has the same definition as $M_3$ in General Formula (3), and a preferred range thereof is also the same.

$Q_4$ has the same definition as $Q_3$ in the above-mentioned General Formula (3), and a preferred range thereof is also the same. Examples of the ring formed by bonding of at least two of $Q_4$, $M_4$, and $R_{44}$ include rings formed by bonding of at least two of $Q_3$, $M_3$, and $R_3$, and preferred ranges thereof are also the same.

The alkyl group of $R_{41}$ to $R_{43}$ in General Formula (5) is, for example, preferably an alkyl group having 20 or less carbon atoms such as a methyl group, an ethyl group, a propyl group, an isopropyl group, an n-butyl group, a sec-butyl group, a hexyl group, a 2-ethylhexyl group, an octyl group, or a dodecyl group which may have a substituent, more preferably an alkyl group having 8 or less carbon atoms, and particularly preferably an alkyl group having 3 or less carbon atoms.

The alkyl group contained in the alkoxycarbonyl group is preferably the same as the alkyl group in $R_{41}$ to $R_{43}$.

The cycloalkyl group may be monocyclic or polycyclic. The cycloalkyl group may be preferably, for example, a monocyclic cycloalkyl group having 3 to 10 carbon atoms such as a cyclopropyl group, a cyclopentyl group or a cyclohexyl group which may have a substituent.

Examples of the halogen atom include a fluorine atom, a chlorine atom, a bromine atom, and an iodine atom. A fluorine atom is particularly preferable.

Preferred examples of the substituent in each of the above-mentioned groups include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The number of carbon atoms in the substituent is preferably 8 or less.

In the case where $R_{42}$ is an alkylene group and forms a ring with $L_4$, the alkylene group is preferably, for example, an alkylene group having 1 to 8 carbon atoms such as a methylene group, an ethylene group, a propylene group, a butylene group, a hexylene group, or an octylene group. The alkylene group is more preferably an alkylene group having 1 to 4 carbon atoms, and particularly preferably an alkylene group having 1 to 2 carbon atoms. It is particularly preferred that the ring formed by bonding of $R_{42}$ and $L_4$ is a 5- or 6-membered ring.

$R_{41}$ and $R_{43}$ are more preferably a hydrogen atom, an alkyl group, or a halogen atom and particularly preferably a hydrogen atom, a methyl group, an ethyl group, a trifluoromethyl group ($—CF_3$), a hydroxymethyl group (($—CH_2—OH$), a chloromethyl group ($—CH_2—Cl$), or a fluorine atom ($—F$). $R_{42}$ is more preferably a hydrogen atom, an alkyl group, a halogen atom, or an alkylene group (which forms a ring with La) and particularly preferably a hydrogen atom, a methyl group, an ethyl group, a trifluoromethyl group (($—CF_3$), a hydroxymethyl group ($—CH_2—OH$), a chloromethyl group (($—CH_2—Cl$), a fluorine atom ($—F$), a methylene group (which forms a ring with $L_4$), or an ethylene group (which forms a ring with $L_4$).

Examples of the divalent linking group represented by La include an alkylene group, a divalent aromatic ring group, $—COO-L_1-$, $—O-L_1-$, and a group formed by combining two or more of these groups. Here, $L_1$ represents an alkylene group, a cycloalkylene group, a divalent aromatic ring group, or a group formed by combining an alkylene group and a divalent aromatic ring group.

$L_4$ is preferably a single bond, a group represented by $—COO-L_4-$, or a divalent aromatic ring group. $L_1$ is preferably an alkylene group having 1 to 5 carbon atoms, and more preferably a methylene or propylene group. The divalent aromatic ring group is preferably a 1,4-phenylene group, a 1,3-phenylene group, a 1,2-phenylene group, or a 1,4-naphthylene group, and more preferably a 1,4-phenylene group.

The trivalent linking group represented by $L_4$, in the case where $L_4$ is bonded to $R_{42}$ to form a ring, is suitably, for example, a group formed by removing any one hydrogen atom from the above-mentioned specific examples of the divalent linking group represented by $L_4$.

Specific examples of the repeating unit represented by General Formula (5) are shown below, but the present invention is not limited thereto.

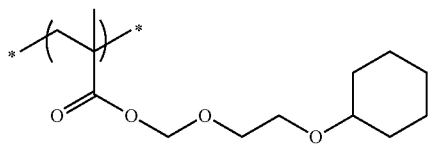

-continued

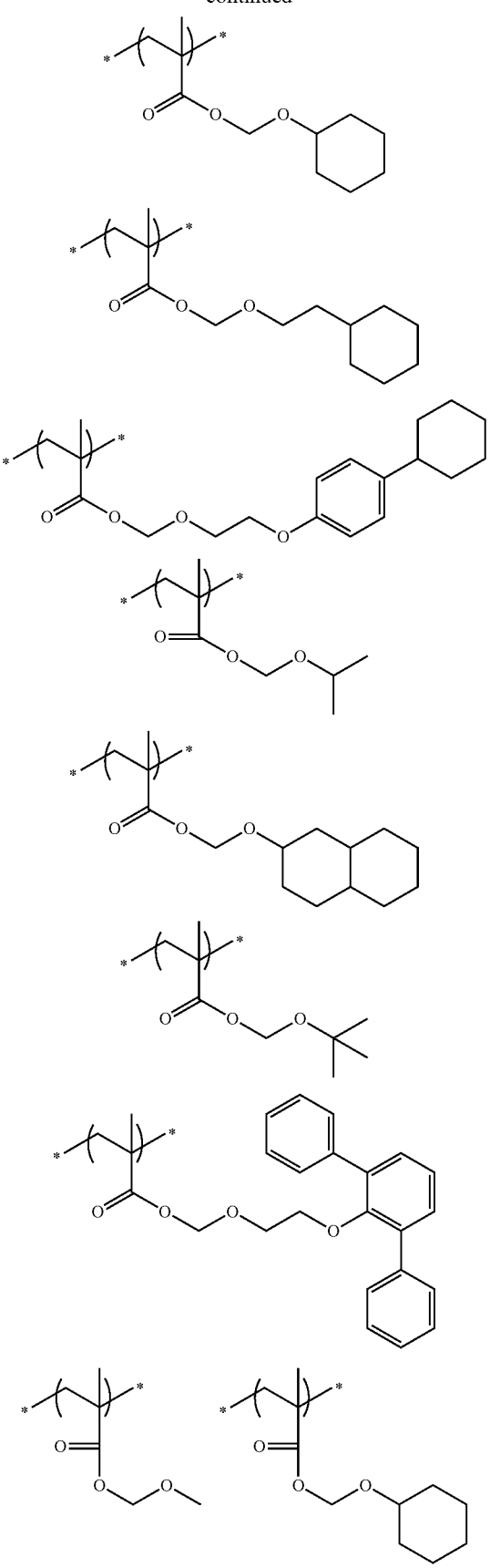

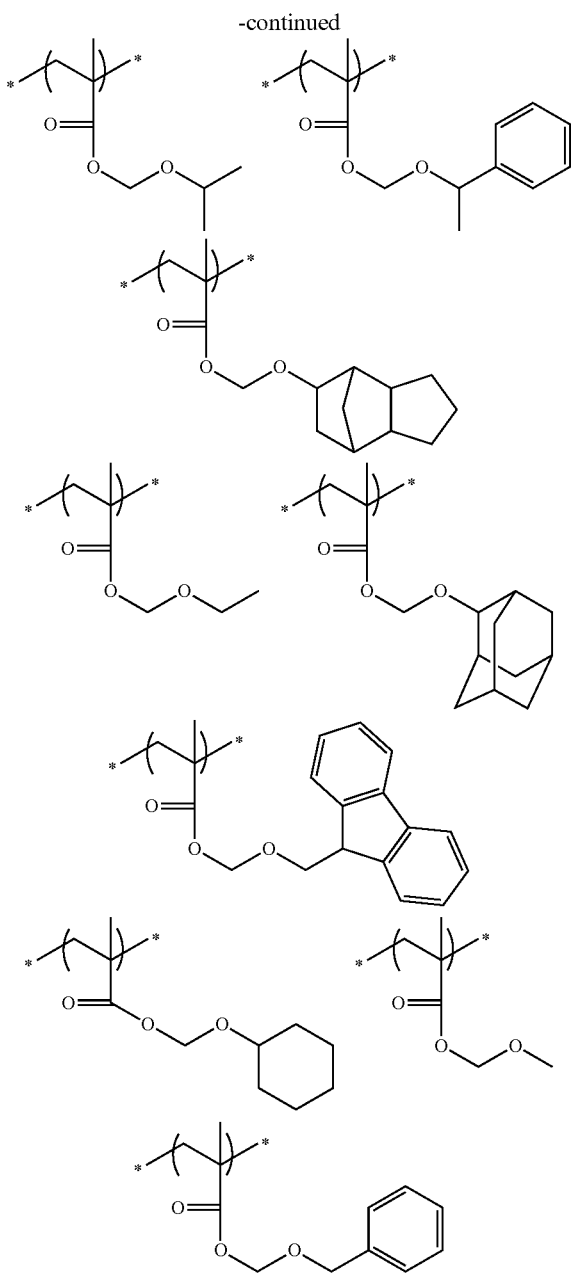

Further, the resin (A) may contain a repeating unit represented by General Formula (BZ).

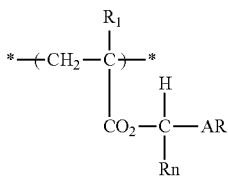

In General Formula (BZ), AR represents an aryl group. Rn represents an alkyl group, a cycloalkyl group, or an aryl group. Rn and AR may be bonded to each other to form a non-aromatic ring.

$R_1$ represents a hydrogen atom, an alkyl group, a cycloalkyl group, a halogen atom, a cyano group, or an alkyloxycarbonyl group.

Specific examples of the repeating unit represented by General Formula (BZ) are shown below, but the present invention is not limited thereto.

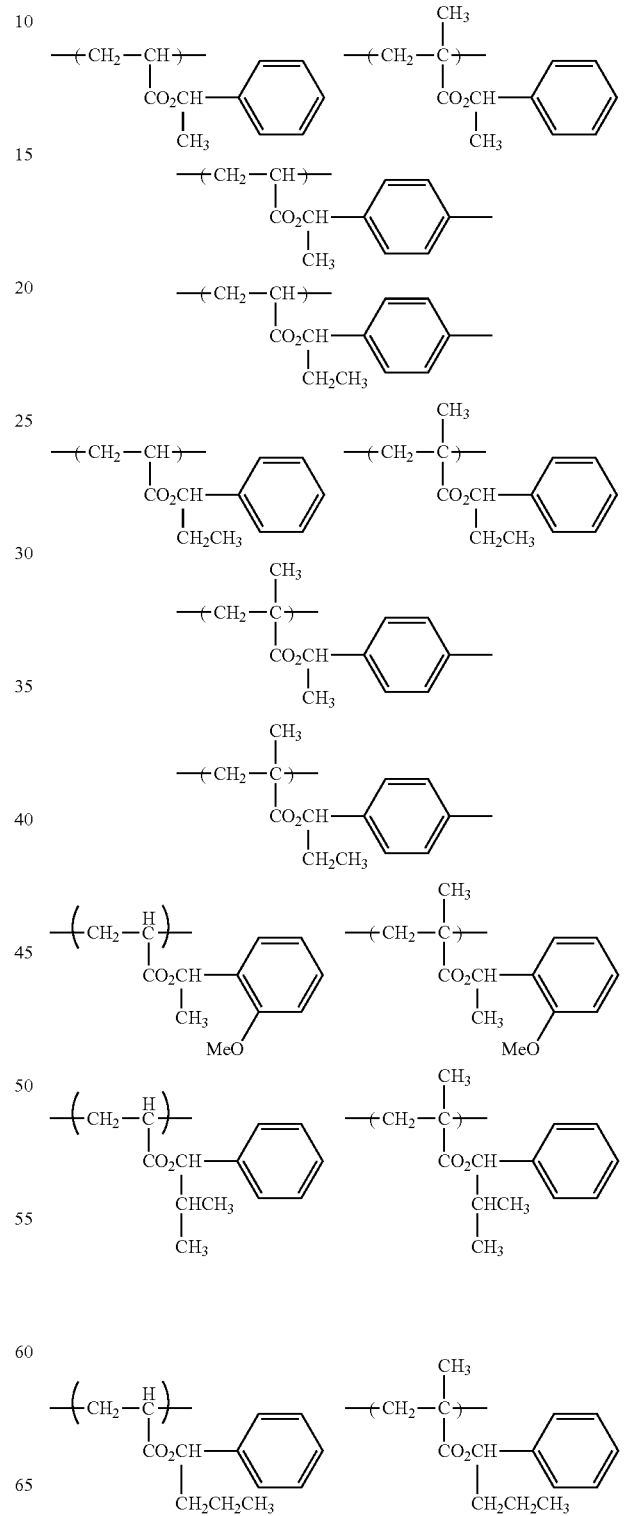

-continued

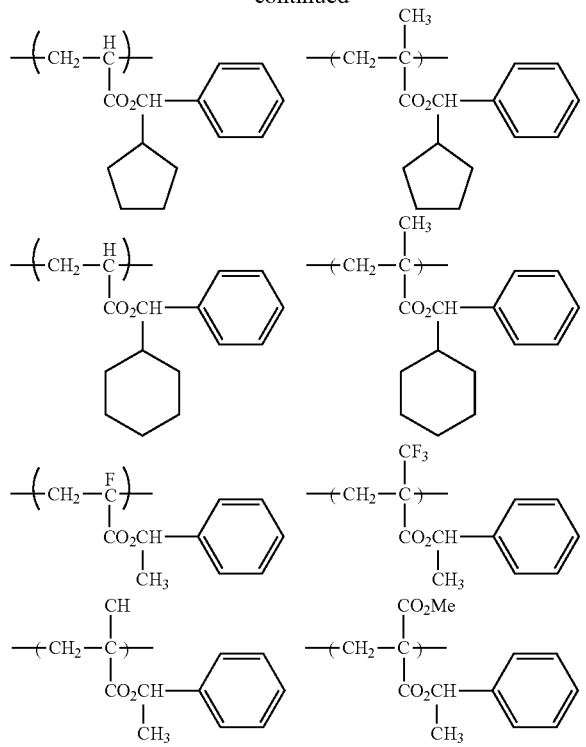

The repeating units having an acid-decomposable group may be used alone or in combination of two or more thereof.

The content of the repeating unit having an acid-decomposable group in the resin (A) (total content of repeating units in the case of containing a plurality of types of repeating units) is preferably 5 mol % or more and 80 mol % or less, more preferably 5 mol % or more and 75 mol % or less, and still more preferably 10 mol % or more and 65 mol % or less, with respect to all repeating units in the resin (A).

The resin (A) may contain a repeating unit represented by General Formula (V-1) or General Formula (V-2).

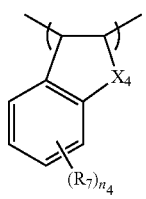 (V-1)

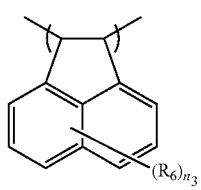 (V-2)

In the formulae, $R_6$ and $R_7$ each independently represent a hydrogen atom, a hydroxy group, a linear, branched or cyclic alkyl group, alkoxy group or acyloxy group having 1 to 10 carbon atoms, a cyano group, a nitro group, an amino group, a halogen atom, an ester group (—OCOR or —COOR: R is an alkyl group or fluorinated alkyl group having 1 to 6 carbon atoms), or a carboxyl group.

$n_3$ represents an integer of 0 to 6.

$n_4$ represents an integer of 0 to 4.

$X_4$ is a methylene group, an oxygen atom, or a sulfur atom.

Specific examples of the repeating unit represented by General Formula (V-1) or (V-2) are shown below, but the present invention is not limited thereto.

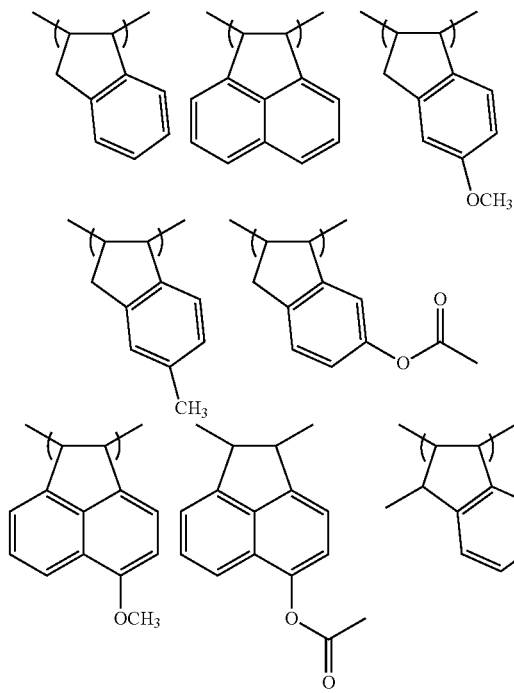

[(B) Compound that Generates Acid by Actinic Rays or Radiation]

The actinic ray-sensitive or radiation-sensitive composition preferably contains a compound which generates an acid by actinic rays or radiation ("photoacid generator (PAG)" or "Compound (B)").

The photoacid generator may be in the form of a low molecular weight compound or may be incorporated into a part of a polymer. In addition, a form of a low molecular weight compound and a form incorporated into a part of a polymer may be used in combination.

In the case where the photoacid generator is in the form of a low molecular weight compound, the molecular weight thereof is preferably 3,000 or less, more preferably 2,000 or less, and still more preferably 1,000 or less.

In the case where the photoacid generator is in the form incorporated into a part of a polymer, the photoacid generator may be incorporated into a part of the resin (A) or incorporated into a resin different from the resin (A).

In the present invention, it is preferred that the photoacid generator is in the form of a low molecular weight compound.

The photoacid generator is not particularly limited as long as it is a known photoacid generator, but the photoacid generator is preferably a compound that generates an organic acid, for example, at least one of sulfonic acid, bis(alkylsulfonyl)imide, or tris(alkylsulfonyl)methide by irradiation with actinic rays or radiation, preferably electron beams or extreme ultraviolet rays.

More preferred are compounds represented by General Formulae (ZI), (ZII), and (ZIII).

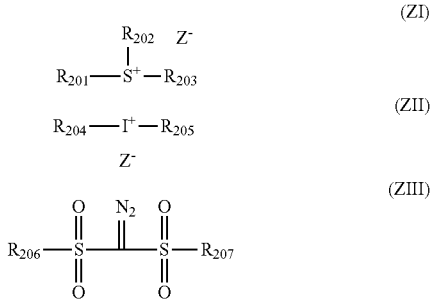

In General Formula (ZI), $R_{201}$, $R_{202}$, and $R_{203}$ each independently represent an organic group.

The number of carbon atoms in the organic group as $R_{201}$, $R_{202}$, and $R_{203}$ is generally 1 to 30 and preferably 1 to 20.

Two of $R_{201}$ to $R_{203}$ may be bonded to form a ring structure, and the ring may contain an oxygen atom, a sulfur atom, an ester bond, an amide bond, or a carbonyl group. The group formed by bonding of two of $R_{201}$ to $R_{203}$ may be, for example, an alkylene group (for example, a butylene group or a pentylene group).

$Z^-$ represents a non-nucleophilic anion (anion having a markedly low ability to cause a nucleophilic reaction).

Examples of the non-nucleophilic anion include a sulfonate anion (an aliphatic sulfonate anion, an aromatic sulfonate anion, a camphorsulfonate anion, or the like), a carboxylate anion (an aliphatic carboxylate anion, an aromatic carboxylate anion, an aralkyl carboxylate anion, or the like), a sulfonylimide anion, a bis(alkylsulfonyl)imide anion, and a tris(alkylsulfonyl)methide anion.

The aliphatic moiety in the aliphatic sulfonate anion and aliphatic carboxylate anion may be an alkyl group or a cycloalkyl group, and is preferably, for example, a linear or branched alkyl group having 1 to 30 carbon atoms and a cycloalkyl group having 3 to 30 carbon atoms.

The aromatic group in the aromatic sulfonate anion and aromatic carboxylate anion is preferably an aryl group having 6 to 14 carbon atoms, and examples thereof may include a phenyl group, a tolyl group, and a naphthyl group.

The alkyl group, cycloalkyl group, and aryl group may have a substituent. Examples of the substituent include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms). For the aryl group and ring structure in each group, an alkyl group (preferably having 1 to 15 carbon atoms) may be further exemplified as a substituent.

The aralkyl group in the aralkyl carboxylate anion is preferably an aralkyl group having 7 to 12 carbon atoms, and examples thereof may include a benzyl group, a phenethyl group, a naphthylmethyl group, a naphthylethyl group, and a naphthylbutyl group.

The sulfonylimide anion may be, for example, a saccharin anion.

The alkyl group in the bis(alkylsulfonyl)imide anion and tris(alkylsulfonyl)methide anion is preferably an alkyl group having 1 to 5 carbon atoms. Examples of the substituent for these alkyl groups include a halogen atom, an alkyl group substituted with a halogen atom, an alkoxy group, an alkylthio group, an alkyloxysulfonyl group, an aryloxysulfonyl group, and a cycloalkylaryloxysulfonyl group. Preferred is a fluorine atom or an alkyl group substituted with a fluorine atom.

Moreover, alkyl groups in the bis(alkylsulfonyl)imide anion may be bonded to each other to form a cyclic structure. This increases the acid strength.

Examples of the other non-nucleophilic anion may include fluorinated phosphorus (for example, $PF_6^-$), fluorinated boron (for example, $BF_4^-$), and fluorinated antimony (for example, $SbF_6^-$).

The non-nucleophilic anion is preferably an aliphatic sulfonate anion in which at least a-position of sulfonic acid is substituted with a fluorine atom, an aromatic sulfonate anion substituted with a fluorine atom or a group having a fluorine atom, a bis(alkylsulfonyl)imide anion in which the alkyl group is substituted with a fluorine atom, or a tris (alkylsulfonyl)methide anion in which the alkyl group is substituted with a fluorine atom. The non-nucleophilic anion is more preferably a perfluoro aliphatic sulfonate anion (still more preferably, having 4 to 8 carbon atoms), or a benzenesulfonate anion having a fluorine atom, and still more preferably a nonafluorobutanesulfonate anion, a perfluorooctanesulfonate anion, a pentafluorobenzenesulfonate anion, or a 3,5-bis(trifluoromethyl)benzenesulfonate anion.

From the viewpoint of acid strength, the pKa of the generated acid is preferably −1 or less in order to improve the sensitivity.

Further, as a non-nucleophilic anion, an anion represented by General Formula (AN1) can also be mentioned as a preferred embodiment.

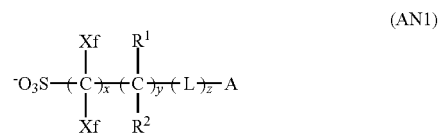

In the formula,

Xf's each independently represent a fluorine atom or an alkyl group substituted with at least one fluorine atom.

$R^1$ and $R^2$ each independently represent a hydrogen atom, a fluorine atom, or an alkyl group; and in the case where there is a plurality of $R_1$'s and $R_2$'s, they may be respectively the same or different from one another.

L represents a divalent linking group, and in the case where there is a plurality of L's, they may be the same or different from one another.

A represents a cyclic organic group.

x represents an integer of 1 to 20, y represents an integer of 0 to 10, and z represents an integer of 0 to 10.

General Formula (AN1) will be described in more detail.

The alkyl group in the alkyl group substituted with a fluorine atom of Xf preferably has 1 to 10 carbon atoms and more preferably 1 to 4 carbon atoms. The alkyl group substituted with a fluorine atom of Xf is preferably a perfluoroalkyl group.

Xf is preferably a fluorine atom or a perfluoroalkyl group having 1 to 4 carbon atoms. Xf is specifically a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, or $CH_2CH_2C_4F_9$, among which a fluorine atom or $CF_3$ is preferable. In particular, both of Xf's are preferably a fluorine atom.

The alkyl group of $R^1$ and $R^2$ may have a substituent (preferably a fluorine atom) and preferably has 1 to 4 carbon atoms. More preferred is a perfluoroalkyl group having 1 to 4 carbon atoms. Specific examples of the alkyl group having a substituent as $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, among which $CF_3$ is preferable.

$R^1$ and $R^2$ are preferably a fluorine atom or $CF_3$.

x is preferably 1 to 10 and more preferably 1 to 5.

y is preferably 0 to 4 and more preferably 0.

z is preferably 0 to 5 and more preferably 0 to 3.

The divalent linking group of L is not particularly limited, and examples thereof include —COO—, —OCO—, —CO—, —O—, —S—, —SO—, —SO$_2$—, an alkylene group, a cycloalkylene group, an alkenylene group, or a linking group formed by connecting a plurality of these groups. A linking group having a total number of carbon atoms of 12 or less is preferable. Among these, COO—, —OCO—, —CO—, or —O— is preferred, and —COO— or —OCO— is more preferable.

The cyclic organic group of A is not particularly limited as long as it has a cyclic structure, and examples thereof include an alicyclic group, an aryl group, and a heterocyclic group (including not only those having aromaticity but also those having no aromaticity).

The alicyclic group may be monocyclic or polycyclic and is preferably a monocyclic cycloalkyl group such as a cyclopentyl group, a cyclohexyl group, or a cyclooctyl group; or a polycyclic cycloalkyl group such as a norbornyl group, a tricyclodecanyl group, a tetracyclodecanyl group, a tetracyclododecanyl group, or an adamantyl group. Among them, an alicyclic group with a bulky structure having 7 or more carbon atoms such as a norbornyl group, a tricyclodecanyl group, a tetracyclodecanyl group, a tetracyclododecanyl group, or an adamantyl group is preferred from the viewpoints of inhibiting diffusivity into the film during the post exposure bake (PEB) step and improving MEEF.

Examples of the aryl group include a benzene ring, a naphthalene ring, a phenanthrene ring, and an anthracene ring.

Examples of the heterocyclic group include those derived from a furan ring, a thiophene ring, a benzofuran ring, a benzothiophene ring, a dibenzofuran ring, a dibenzothiophene ring, and a pyridine ring. Among them, those derived from a furan ring, a thiophene ring, and a pyridine ring are preferable.

A lactone structure can also be mentioned as the cyclic organic group, and specific examples thereof include lactone structures represented by the above-described General Formulae (LC1-1) to (LC1-17).

The cyclic organic group may have a substituent. Examples of the substituent may include an alkyl group (which may be linear, cyclic or branched, and which preferably has 1 to 12 carbon atoms), a cycloalkyl group (which may be monocyclic, polycyclic, or spirocyclic, and which preferably has 3 to 20 carbon atoms), an aryl group (preferably having 6 to 14 carbon atoms), a hydroxy group, an alkoxy group, an ester group, an amido group, a urethane group, an ureido group, a thioether group, a sulfonamido group, and a sulfonic acid ester group. Incidentally, the carbon constituting the cyclic organic group (the carbon contributing to the ring formation) may also be a carbonyl carbon.

Examples of the organic group of $R_{201}$, $R_{202}$ and $R_{203}$ include an aryl group, an alkyl group, and a cycloalkyl group.

It is preferred that at least one of $R_{201}$, $R_{202}$, or $R_{203}$ is an aryl group, and it is more preferred that all three of $R_{201}$, $R_{202}$ and $R_{203}$ are aryl groups. Besides a phenyl group, a naphthyl group or the like, a heteroaryl group such as an indole residue or a pyrrole residue is also possible as the aryl group. Preferred examples of the alkyl group and cycloalkyl group of $R_{201}$ to $R_{203}$ include a linear or branched alkyl group having 1 to 10 carbon atoms and a cycloalkyl group having 3 to 10 carbon atoms. More preferred examples of the alkyl group include a methyl group, an ethyl group, an n-propyl group, an i-propyl group, and an n-butyl group. The cycloalkyl group is more preferably a cyclopropyl group, a cyclobutyl group, a cyclopentyl group, a cyclohexyl group, a cycloheptyl group, or the like. These groups may further have a substituent. Examples of the substituent include, but are not limited to, a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms).

In General Formulae (ZII) and (ZIII), $R_{204}$ to $R_{207}$ each independently represent an aryl group, an alkyl group, or a cycloalkyl group.

The aryl group, alkyl group and cycloalkyl group of $R_{204}$ to $R_{207}$ are the same as those described as the aryl group, alkyl group, and cycloalkyl group of $R_{201}$ to $R_{203}$ in the above-mentioned compound (ZI).

The aryl group, alkyl group and cycloalkyl group of $R_{204}$ to $R_{207}$ may have a substituent. Also as this substituent, those which may be contained in the aryl group, alkyl group and cycloalkyl group of $R_{201}$ to $R_{203}$ in the above-mentioned compound (ZI) can be mentioned.

$Z^-$ represents a non-nucleophilic anion, and the same ones as the non-nucleophilic anion of $Z^-$ in General Formula (ZI) can be mentioned.

In the present invention, from the viewpoint of suppressing diffusion of an acid generated by exposure into a non-exposed area, thereby improving resolution, the photoacid generator is preferably a compound which generates an acid with a volume of 130 Å$^3$ or more (more preferably, a sulfonic acid), more preferably a compound which generates an acid with a volume of 190 Å$^3$ or more (more preferably, a sulfonic acid), still more preferably a compound which generates an acid with a volume of 270 Å³ or more (more preferably, a sulfonic acid), and particularly preferably a compound which generates an acid with a volume of 400 Å³ or more (more preferably, a sulfonic acid), upon irradiation with electron beams or extreme ultraviolet rays. Meanwhile, from the viewpoint of the sensitivity or the coating solvent solubility, the volume is preferably 2000 Å³ or less, and more preferably 1500 Å³ or less. The value of the volume was obtained using "WinMOPAC" manufactured by Fujitsu Limited. That is, the "accessible volume" of each acid can be calculated by, first, inputting a chemical structure of an acid according to each case, determining the most stable conformation of each acid by a molecular force field calculation using an MM3 method with an initial structure of this structure, and then performing a molecular orbital calculation using a PM3 method for the most stable conformation.

In the present invention, a photoacid generator which generates an acid exemplified below by irradiation with actinic rays or radiation is preferable. Also, some examples are given calculated values of volume (unit: Å³). Meanwhile, the value calculated herein is a volume value of an acid in which a proton is bound to an anion moiety.

1 Å corresponds to $1 \times 10^{-10}$ m.

585Å³

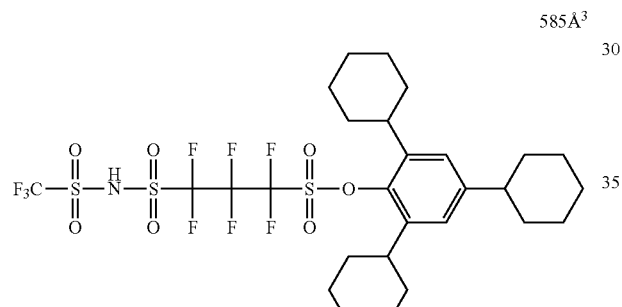

585Å³

525Å³

554Å³

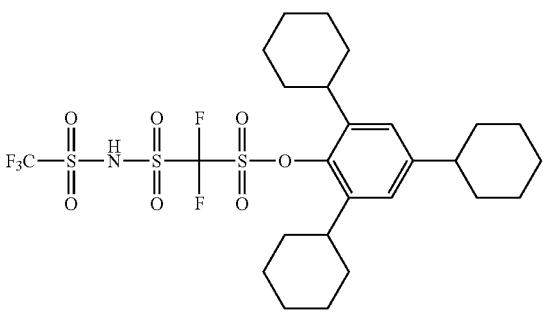

303Å³

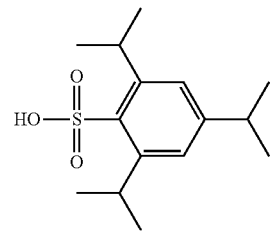

437Å³

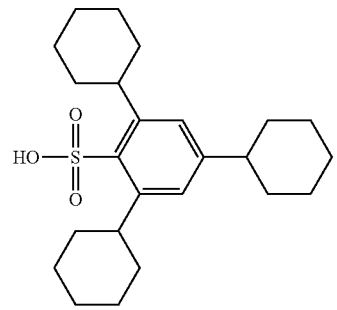

244Å³

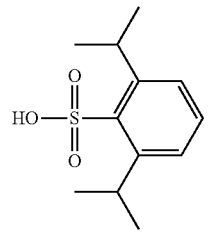

529Å³

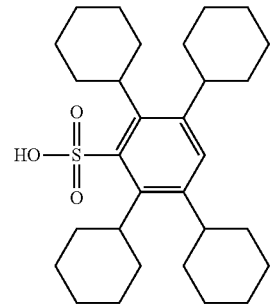

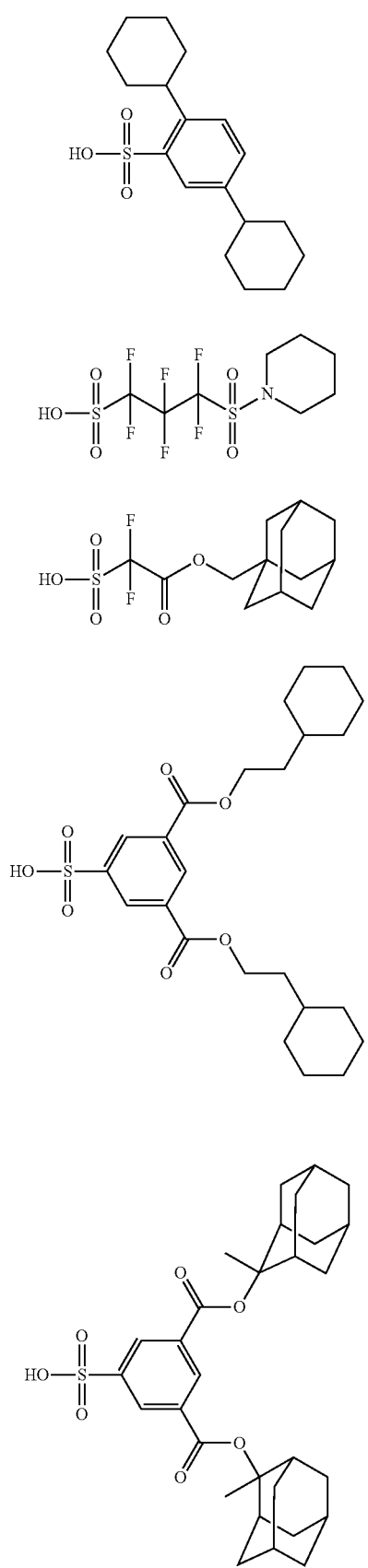

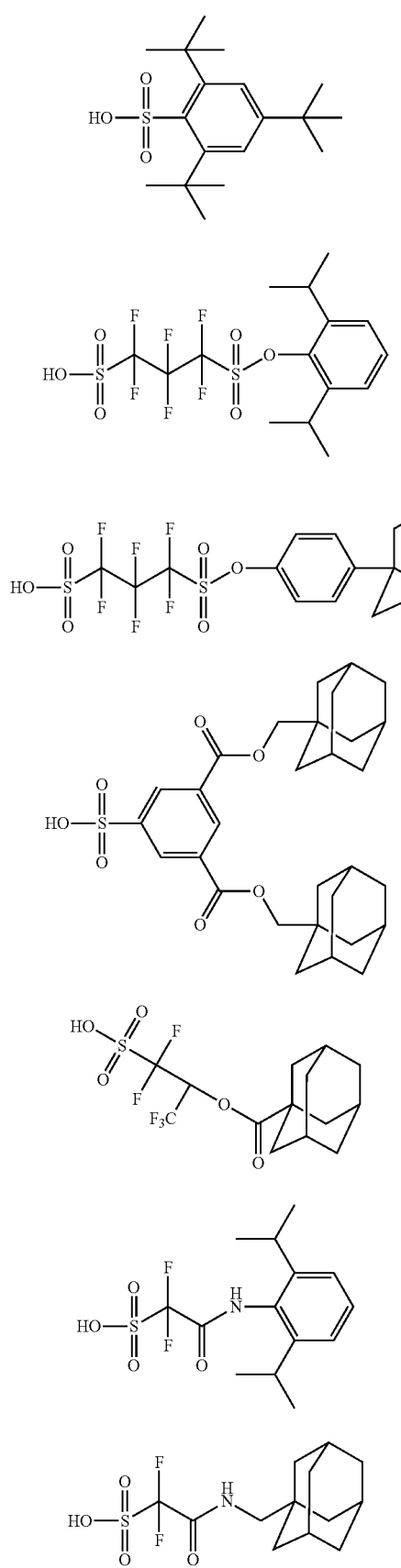
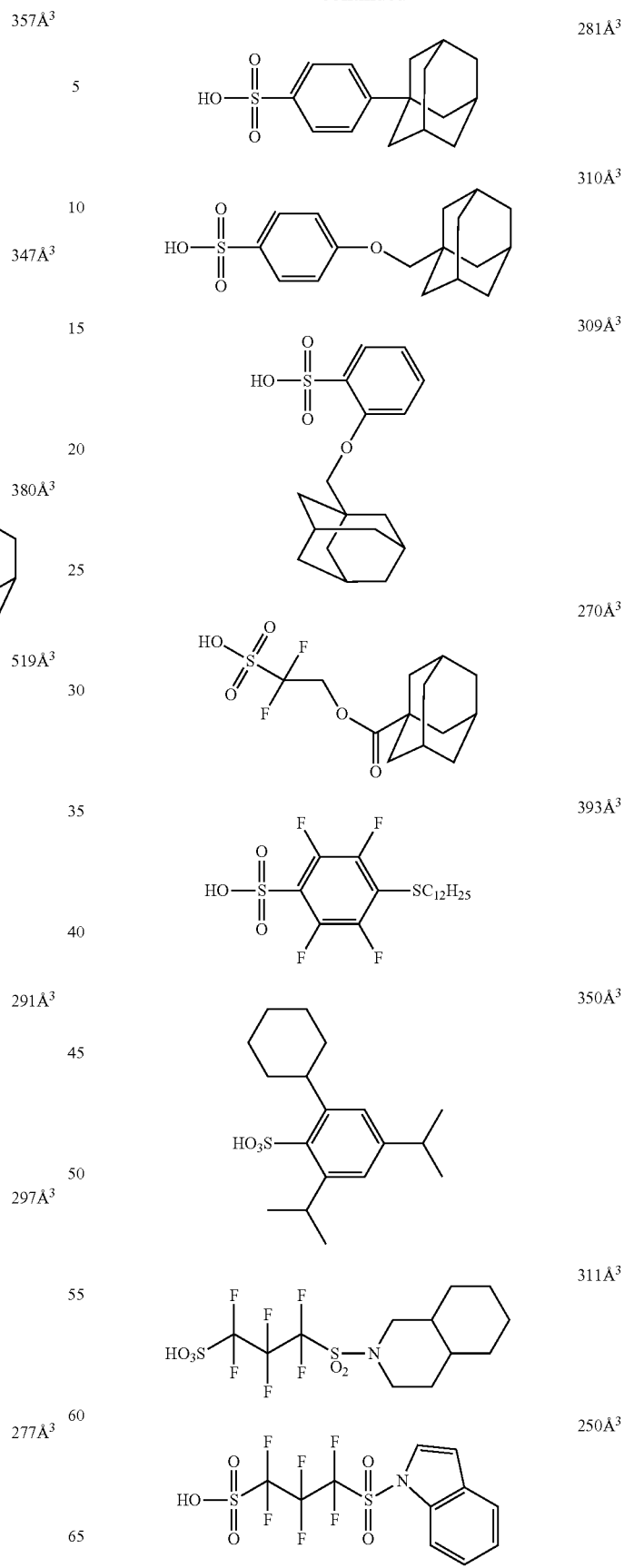

-continued

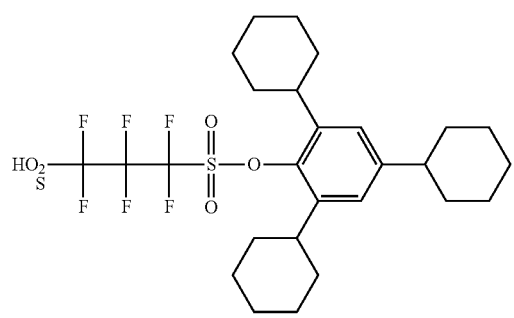

535Å³

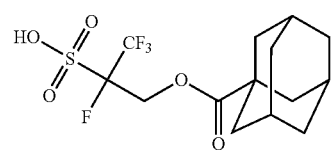

290Å³

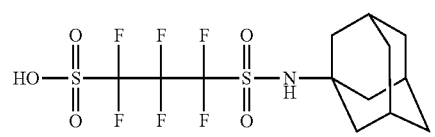

315Å³

The photoacid generator may refer to those described in paragraphs [0368] to [0377] of JP2014-41328A, and paragraphs [0240] to [0262] of JP2013-228681A (paragraph [0339] of corresponding US2015/004533A), the contents of which are incorporated herein by reference. Preferred specific examples of the photoacid generator include the following compounds, but the present invention is not limited thereto.

(z1)

-continued (z2)

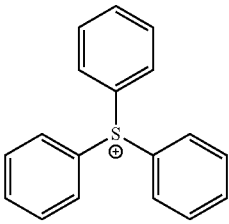

(z3)

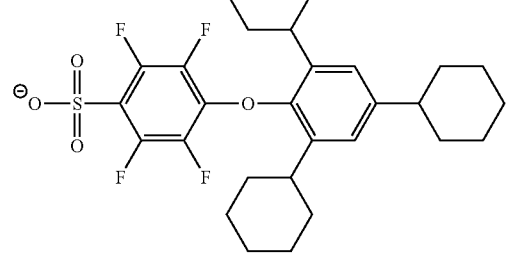

(z4)

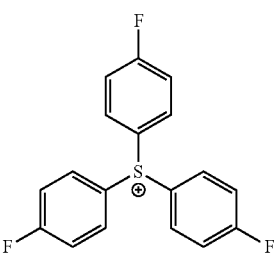

(z5)
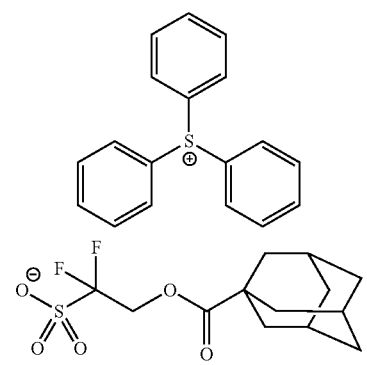
(z6)
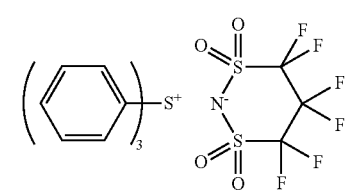
(z7)
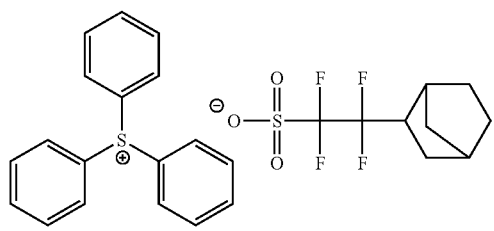
(z8)
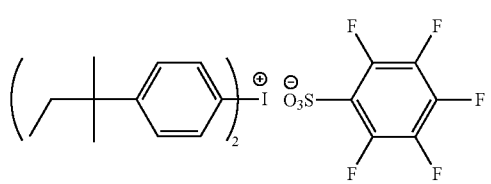
(z9)
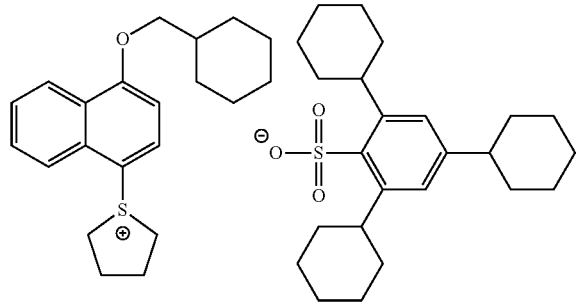
(z10)
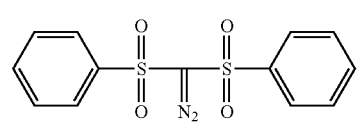
(z11)
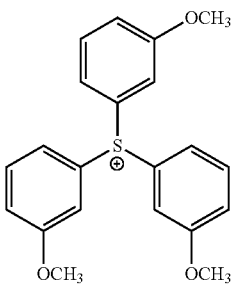
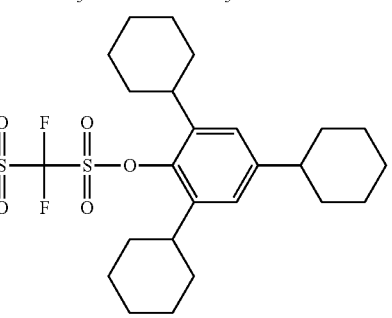
(z12)
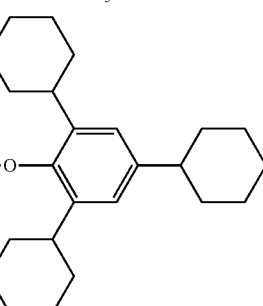
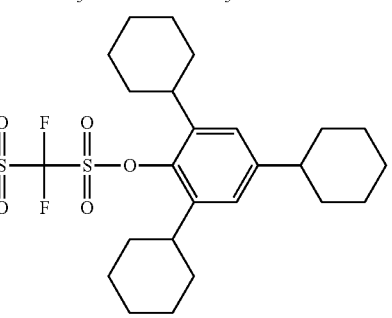
(z13)
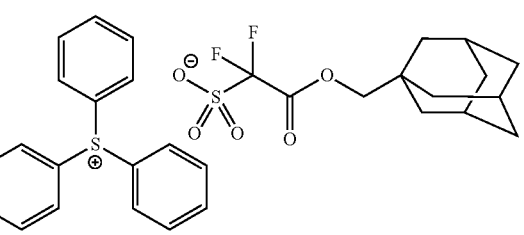

(z14)
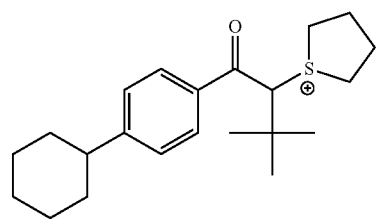
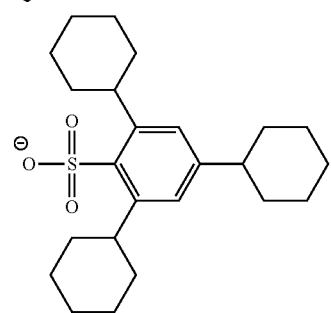
(z15)
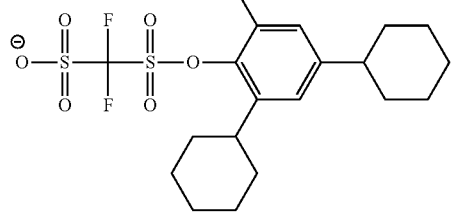
(z16)
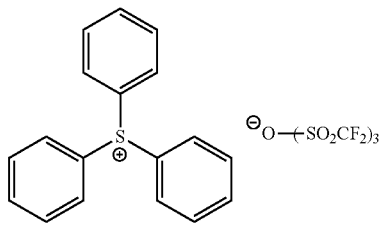
(z17)
(z18)
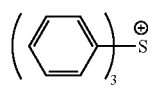
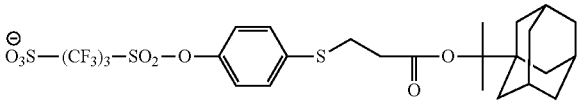
(z19)
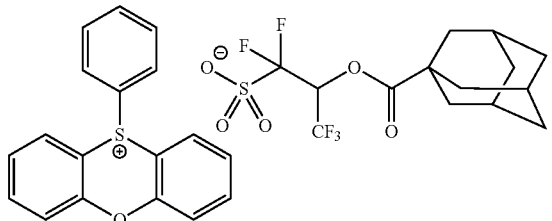
(z20)
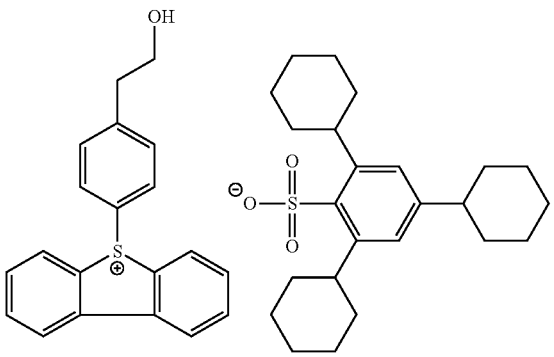
(z21)
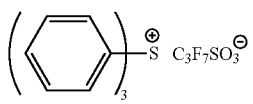
(z22)
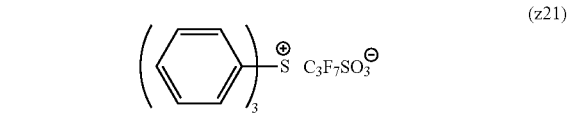
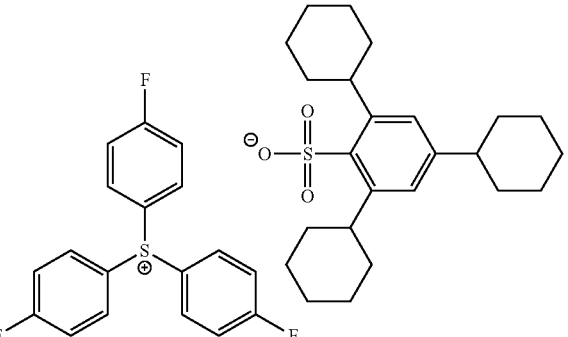
(z23)
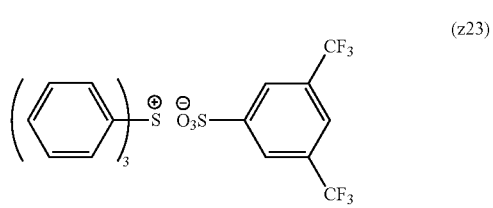

-continued
(z24)
(z25)
(z26)
(z27)
(z28)
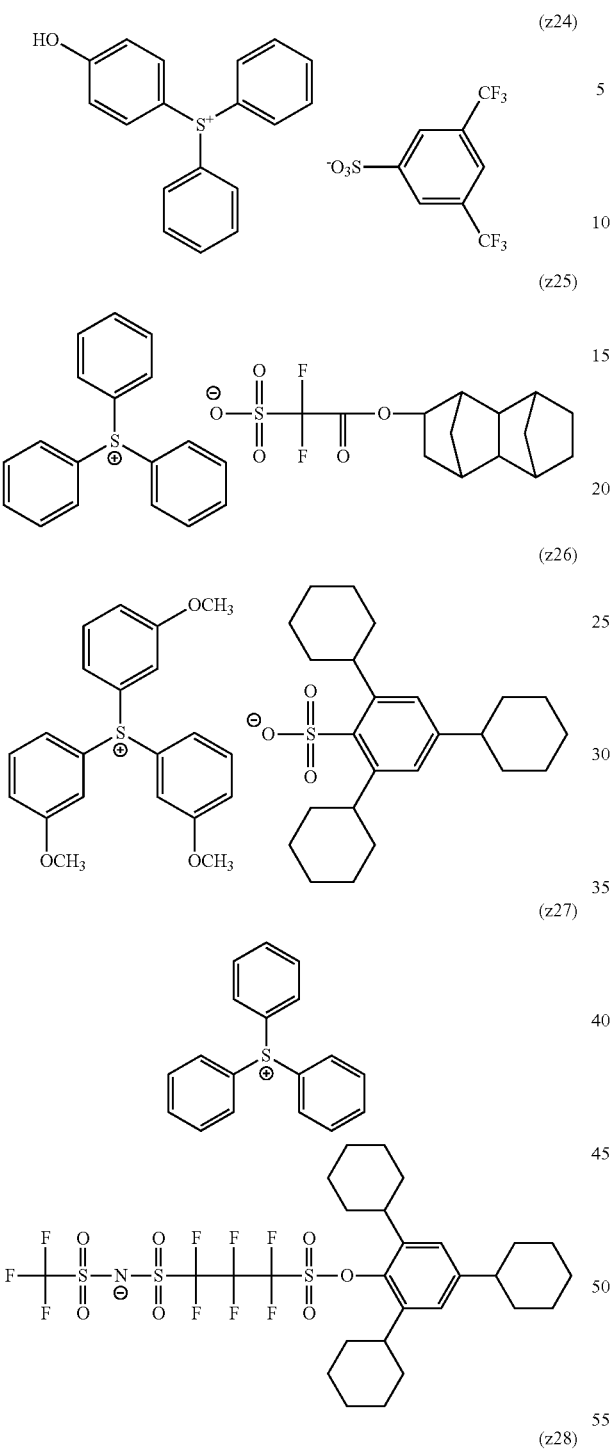
-continued
(z29)
(z30)
(z31)
(z32)
(z33)
(z34)
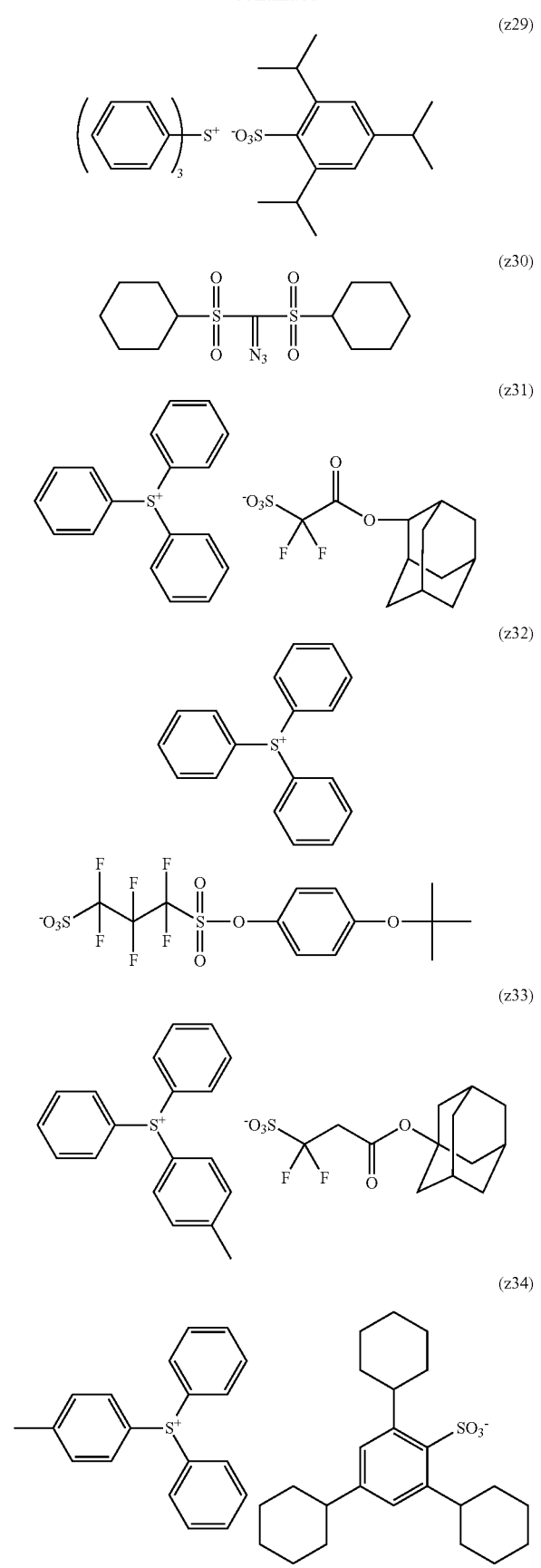

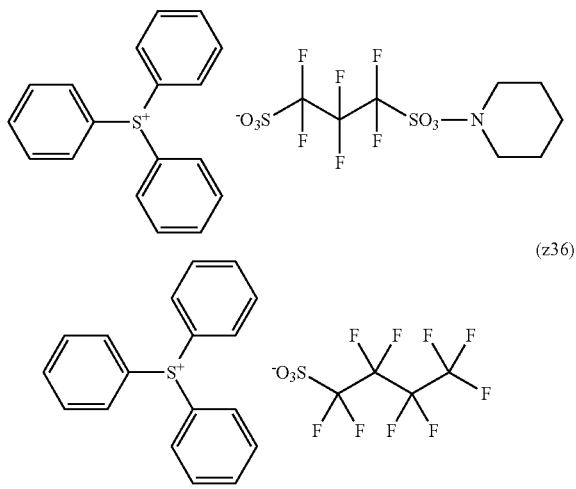

The photoacid generators may be used alone or in combination of two or more thereof.

The content of the photoacid generator in the actinic ray-sensitive or radiation-sensitive composition is preferably 0.1 to 50 mass %, more preferably 5 to 50 mass %, and still more preferably 8 to 40 mass %, based on the total solid content of the composition. In particular, the content of the photoacid generator is preferably as high as possible, more preferably 10 to 40 mass %, and most preferably 10 to 35 mass % in order to achieve both high sensitivity and high resolution at the time of electron beam or extreme ultraviolet exposure.

(C) Solvent

The actinic ray-sensitive or radiation-sensitive composition used in the present invention preferably contains a solvent (also referred to as "resist solvent"). This solvent preferably contains at least one of (M1) propylene glycol monoalkyl ether carboxylate or (M2) at least one selected from the group consisting of propylene glycol monoalkyl ether, lactic acid ester, acetic acid ester, alkoxypropionic acid ester, chain-like ketone, cyclic ketone, lactone, and alkylene carbonate. Further, this solvent may further contain components other than the components (M1) and (M2).

The present inventors have found that combined use of such a solvent and the above-described resin results in improved coatability of the composition and makes it possible to form a pattern with a small number of development defects. Although the reason is not always clear, the present inventors have thought that it is due to the fact that these solvents have well-balanced solubility, boiling point, and viscosity of the above-mentioned resins, so that unevenness of the film thickness of the composition film and the occurrence of precipitates during spin coating can be suppressed.

The component (M1) is preferably at least one selected from the group consisting of propylene glycol monomethyl ether acetate, propylene glycol monomethyl ether propionate, and propylene glycol monoethyl ether acetate, and particularly preferably propylene glycol monomethyl ether acetate.

The component (M2) is preferably as follows.

The propylene glycol monoalkyl ether is preferably propylene glycol monomethyl ether or propylene glycol monoethyl ether.

The lactic acid ester is preferably ethyl lactate, butyl lactate, or propyl lactate.

The acetic acid ester is preferably methyl acetate, ethyl acetate, butyl acetate, isobutyl acetate, propyl acetate, isoamyl acetate, methyl formate, ethyl formate, butyl formate, propyl formate, or 3-methoxybutyl acetate.

Butyl butyrate is also preferable.

The alkoxypropionic acid ester is preferably methyl 3-methoxypropionate (MMP) or ethyl 3-ethoxypropionate (EEP).

The chain-like ketone is preferably 1-octanone, 2-octanone, 1-nonanone, 2-nonanone, acetone, 4-heptanone, 1-hexanone, 2-hexanone, diisobutyl ketone, phenylacetone, methyl ethyl ketone, methyl isobutyl ketone, acetyl acetone, acetonyl acetone, ionone, diacetonyl alcohol, acetyl carbinol, acetophenone, methylnaphthyl ketone, or methyl amyl ketone.

The cyclic ketone is preferably methylcyclohexanone, isophorone, or cyclohexanone.

The lactone is preferably γ-butyrolactone.

The alkylene carbonate is preferably propylene carbonate.

The component (M2) is more preferably propylene glycol monomethyl ether, ethyl lactate, ethyl 3-ethoxypropionate, methyl amyl ketone, cyclohexanone, butyl acetate, pentyl acetate, γ-butyrolactone, or propylene carbonate.

In addition to the above-mentioned components, it is preferable to use an ester-based solvent having 7 or more carbon atoms (preferably 7 to 14, more preferably 7 to 12, and still more preferably 7 to 10) and having 2 or less heteroatoms.

Preferred examples of the ester-based solvent having 7 or more carbon atoms and 2 or less heteroatoms include amyl acetate, 2-methylbutyl acetate, 1-methylbutyl acetate, hexyl acetate, pentyl propionate, hexyl propionate, butyl propionate, isobutyl isobutyrate, heptyl propionate, and butyl butanoate. Isoamyl acetate is particularly preferably used.

As the component (M2), one having a flash point (hereinafter, also referred to as fp) of 37° C. or higher is preferably used. Such a component (M2) is preferably propylene glycol monomethyl ether (fp: 47° C.), ethyl lactate (fp: 53° C.), ethyl 3-ethoxypropionate (fp: 49° C.), methyl amyl ketone (fp: 42° C.), cyclohexanone (fp: 44° C.), pentyl acetate (fp: 45° C.), methyl 2-hydroxyisobutyrate (fp: 45° C.), γ-butyrolactone (fp: 101° C.), or propylene carbonate (fp: 132° C.). Among these, propylene glycol monomethyl ether, ethyl lactate, pentyl acetate, or cyclohexanone is more preferable, and propylene glycol monoethyl ether or ethyl lactate is particularly preferable. The term "flash point" as used herein means the value described in the reagent catalog of Tokyo Chemical Industry Co., Ltd. or Sigma-Aldrich Corporation.

It is preferred that the solvent contains the component (M1). It is more preferred that the solvent substantially consists of only the component (M1) or is a mixed solvent of the component (M1) and other components. In the latter case, it is still more preferred that the solvent contains both the component (M1) and the component (M2).

The mass ratio of the component (M1) to the component (M2) is preferably in the range of 100:0 to 15:85, more preferably in the range of 100:0 to 40:60, and still more preferably in the range of 100:0 to 60:40. That is, it is preferred that the solvent consists of only the component (M1), or contains both the component (M1) and the component (M2), in which the mass ratio therebetween is as follows. That is, in the latter case, the mass ratio of component (M1) to component (M2) is preferably 15/85 or more, more preferably 40/60 or more, and still more preferably 60/40 or more. In the case where such a configuration is adopted, the number of development defects can be further reduced.

In the case where the solvent contains both the component (M1) and the component (M2), the mass ratio of component (M1) to component (M2) is, for example, 99/1 or less.

As described above, the solvent may further contain components other than the components (M1) and (M2). In this case, the content of the components other than the components (M1) and (M2) is preferably in the range of 5 mass % to 30 mass % with respect to the total amount of the solvent.

The content of the solvent in the actinic ray-sensitive or radiation-sensitive composition is determined such that the solid content concentration of all components is preferably 0.5 to 30 mass % and more preferably 1 to 20 mass %. This can lead to further improved coatability of the actinic ray-sensitive or radiation-sensitive composition.

(E) Basic Compound

The resist composition of the present invention preferably contains a basic compound (E) in order to reduce changes in performance over time from exposure to heating.

The basic compound may be preferably, for example, a compound having a structure represented by General Formulae (A) to (E).

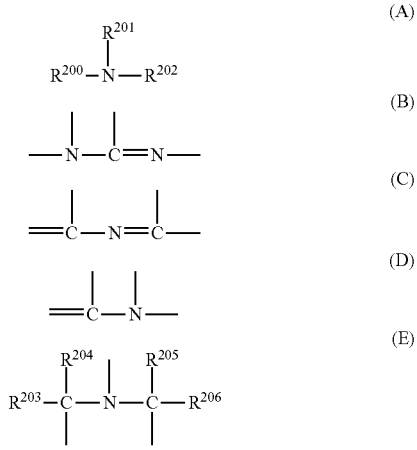

In General Formulae (A) and (E), $R^{200}$, $R^{201}$, and $R^{202}$ may be the same or different from one another and represent a hydrogen atom, an alkyl group (preferably having 1 to 20 carbon atoms), a cycloalkyl group (preferably having 3 to 20 carbon atoms), or an aryl group (preferably having 6 to 20 carbon atoms), in which $R^{201}$ and $R^{202}$ may be bonded to each other to form a ring.

As for the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

$R^{203}$, $R^{204}$, $R^{205}$, and $R^{206}$ may be the same or different from one another and represent an alkyl group having 1 to 20 carbon atoms.

The alkyl group in General Formulae (A) and (E) is more preferably unsubstituted.

Preferred examples of the compound include guanidine, aminopyrrolidine, pyrazole, pyrazoline, piperazine, aminomorpholine, aminoalkylmorpholine, and piperidine, and more preferred examples of the compound include a compound having an imidazole structure, a diazabicyclo structure, an onium hydroxide structure, an onium carboxylate structure, a trialkylamine structure, an aniline structure, or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]nona-5-ene, and 1,8-diazabicyclo[5,4,0]undeca-7-ene. Examples of the compound having an onium hydroxide structure include triarylsulfonium hydroxide, phenacylsulfonium hydroxide, and sulfonium hydroxide having a 2-oxoalkyl group, with the specific examples thereof including triphenylsulfonium hydroxide, tris(t-butylphenyl)sulfonium hydroxide, bis(t-butylphenyl)iodonium hydroxide, a phenacylthiophenium hydroxide, and 2-oxopropylthiophenium hydroxide. The compound having an onium carboxylate structure is a compound in which the anionic moiety of the compound having an onium hydroxide structure is carboxlated, and examples thereof include acetate, adamantane-1-carboxylate, and perfluoroalkyl carboxylate. Examples of the compound having a trialkylamine structure include tri(n-butyl)amine and tri(n-octyl)amine. Examples of the compound having an aniline structure include 2,6-diisopropylaniline, N,N-dimethylaniline, N,N-dibutylaniline, and N,N-dihexylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

Preferred examples of the basic compound further include an amine compound having a phenoxy group and an ammonium salt compound having a phenoxy group.

The amine compound may be a primary, secondary, or tertiary amine compound, and is preferably an amine compound in which at least one alkyl group is bonded to a nitrogen atom. Further, the amine compound is more preferably a tertiary amine compound. In the amine compound, in the case where at least one alkyl group (preferably having 1 to 20 carbon atoms) is bonded to a nitrogen atom, a cycloalkyl group (preferably having 3 to 20 carbon atoms) or an aryl group (preferably having 6 to 12 carbon atoms) other than the alkyl group may be bonded to a nitrogen atom.

Further, the amine compound preferably contains an oxygen atom and an oxyalkylene group formed in the alkyl chain. The number of the oxyalkylene groups is 1 or more in the molecule, preferably 3 to 9, and more preferably 4 to 6. Among the oxyalkylene groups, an oxyethylene group (—$CH_2CH_2O$—) or an oxypropylene group (—$CH(CH_3)CH_2O$— or —$CH_2CH_2CH_2O$—) is preferable, and an oxyethylene group is more preferable.

The ammonium salt compound may be a primary, secondary, tertiary, or quaternary ammonium salt compound and is preferably an ammonium salt compound in which at least one alkyl group is bonded to a nitrogen atom. In the ammonium salt compound, in the case where at least one alkyl group (preferably having 1 to 20 carbon atoms) is bonded to a nitrogen atom, a cycloalkyl group (preferably having 3 to 20 carbon atoms) or an aryl group (preferably having 6 to 12 carbon atoms) other than the alkyl group may be bonded to a nitrogen atom.

The ammonium salt compound preferably contains an oxygen atom and an oxyalkylene group formed in the alkyl chain. The number of the oxyalkylene groups is 1 or more in the molecule, preferably 3 to 9, and more preferably 4 to 6. Among the oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferable, and an oxyethylene group is more preferable.

Examples of the anion of the ammonium salt compound include a halogen atom, a sulfonate, a borate, and a phosphate, among which preferred is a halogen atom or a sulfonate. The halogen atom is particularly preferably a chloride, a bromide, or an iodide, and the sulfonate is particularly preferably an organic sulfonate having 1 to 20 carbon atoms. Examples of the organic sulfonate include an alkylsulfonate and an arylsulfonate each having 1 to 20 carbon atoms. The alkyl group in the alkylsulfonate may have a substituent, and examples of the substituent include fluorine, chlorine, bromine, an alkoxy group, an acyl group, and an aryl group. Specific examples of the alkylsulfonate include methansulfonate, ethansulfonate, butanesulfonate, hexanesulfonate, octanesulfonate, benzylsulfonate, trifluoromethansulfonate, pentafluoroethansulfonate, and nonafluorobutanesulfonate. Examples of the aryl group in the arylsulfonate include a benzene ring, a naphthalene ring, and an anthracene ring. A benzene ring, a naphthalene ring, and an anthracene ring may have a substituent, and the substituent is preferably a linear or branched alkyl group having 1 to 6 carbon atoms or a cycloalkyl group having 3 to 6 carbon atoms. Specific examples of the linear or branched alkyl group and the cycloalkyl group include methyl, ethyl, n-propyl, isopropyl, n-butyl, i-butyl, t-butyl, n-hexyl, and cyclohexyl. Examples of other substituents include an alkoxy group having 1 to 6 carbon atoms, a halogen atom, cyano, nitro, an acyl group, and an acyloxy group.

The amine compound having a phenoxy group or the ammonium salt compound having a phenoxy group is a compound having a phenoxy group at the terminal opposite to the nitrogen atom of the alkyl group of the amine compound or ammonium salt compound. The phenoxy group may have a substituent. Examples of the substituent of the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group, and an aryloxy group. The substitution position of the substituent may be any one of 2 to 6 positions. The number of the substituents may be in the range of 1 to 5.

At least one oxyalkylene group is preferably included between the phenoxy group and the nitrogen atom. The number of the oxyalkylene groups is 1 or more in the molecule, preferably 3 to 9, and more preferably 4 to 6. Among the oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferable, and an oxyethylene group is more preferable.

The amine compound having a phenoxy group can be obtained by heating and reacting a primary or secondary amine having a phenoxy group and a haloalkyl ether, and adding an aqueous solution of a strong base such as sodium hydroxide, potassium hydroxide, or tetraalkylammonium, followed by extraction with an organic solvent such as ethyl acetate or chloroform. Alternatively, the amine compound having a phenoxy group can be obtained by heating and reacting a primary or secondary amine and a haloalkyl ether having a phenoxy group at the terminal thereof, and adding an aqueous solution of a strong base such as sodium hydroxide, potassium hydroxide, or tetraalkylammonium, followed by extraction with an organic solvent such as ethyl acetate or chloroform.

(Compound Having Proton Acceptor Functional Group and Undergoing Decomposition to Generate Compound Reduced in or Deprived of Proton Acceptor Property or Changed to be Acidic from being Proton Acceptor-Functioning, Upon Irradiation with Actinic Rays or Radiation (PA))

The composition according to the present invention may further contain a compound having a proton acceptor functional group and undergoing decomposition to generate a compound reduced in or deprived of the proton acceptor property or changed to be acidic from being proton acceptor-functioning, upon irradiation with actinic rays or radiation (hereinafter, also referred to as a "compound (PA)") as a basic compound.

The proton acceptor functional group is a functional group having a group or electron capable of electrostatically interacting with a proton and includes, for example, a functional group having a macrocyclic structure such as cyclic polyether, and a functional group containing a nitrogen atom having an unshared electron pair not contributing to π-conjugation. The nitrogen atom having an unshared electron pair not contributing to π-conjugation is a nitrogen atom having a partial structure represented by General Formulae.

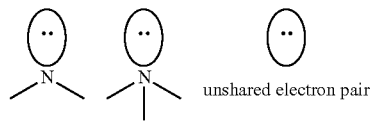

Preferred examples of the partial structure of the proton acceptor functional group include a crown ether structure, an aza-crown ether structure, a primary amine structure, a secondary amine structure, a tertiary amine structure, a pyridine structure, an imidazole structure, and a pyrazine structure.

The compound (PA) undergoes decomposition to generate a compound reduced in or deprived of the proton acceptor property or changed to be acidic from being proton acceptor-functioning, upon irradiation with actinic rays or radiation. As used herein, the expression "reduced in or deprived of the proton acceptor property or changed to be acidic from being proton acceptor-functioning" refers to a change in the proton acceptor property due to the addition of a proton to a proton acceptor functional group and specifically means that in the case where a proton adduct is produced from a proton acceptor functional group-containing compound (PA) and a proton, the equilibrium constant at the chemical equilibrium decreases.

Specific examples of the compound (PA) include the following compounds. Further specific examples of the compound (PA) may incorporate, for example, those described in paragraphs [0421] to [0428] of JP2014-41328A and paragraphs [0108] to [0116] of JP2014-134686A, the contents of which are incorporated herein by reference.

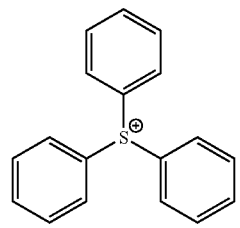

-continued

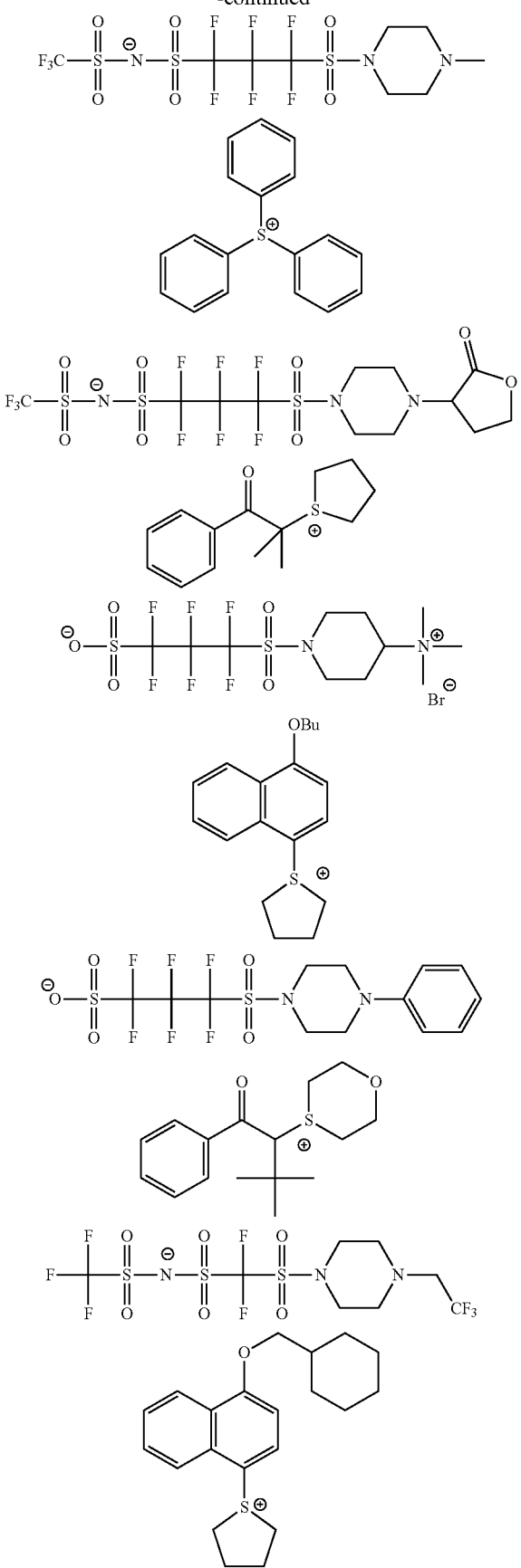

-continued

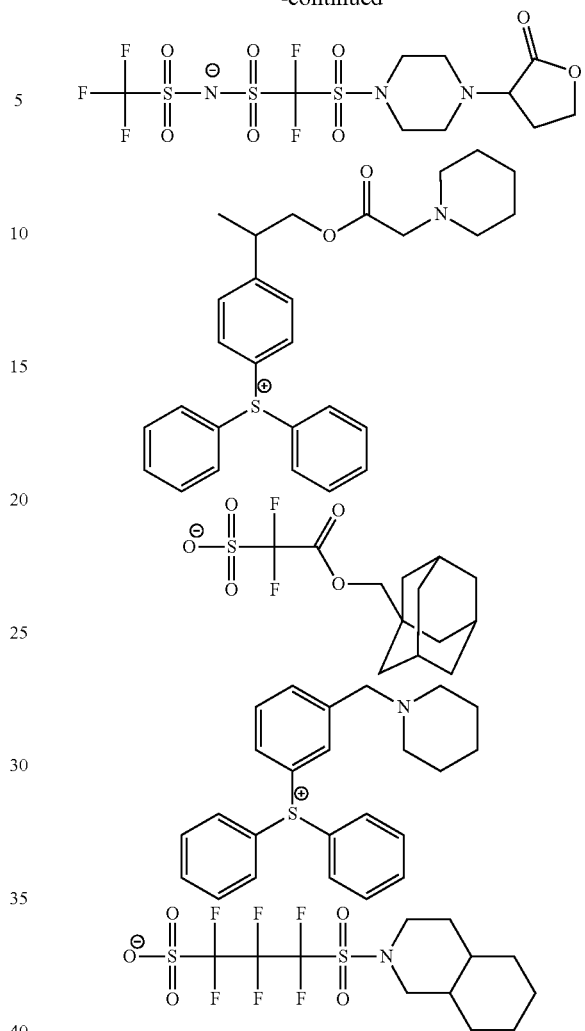

These basic compounds are used alone or in combination of two or more thereof.

The amount of the basic compound used is usually 0.001 to 10 mass % and preferably 0.01 to 5 mass %, based on the solid content of the resist composition.

The ratio of the acid generator to the basic compound used in the composition is preferably acid generator/basic compound (molar ratio) of 2.5 to 300. That is, the molar ratio of 2.5 or more is preferable from the viewpoint of sensitivity and resolution, and a molar ratio of 300 or less is preferable from the viewpoint of suppressing the reduction of resolution due to the thickening of the resist pattern over time until post exposure bake. The acid generator/basic compound (molar ratio) is more preferably 5.0 to 200 and still more preferably 7.0 to 150.

For example, compounds described in paragraphs [0140] to [0144] of JP2013-11833A (an amine compound, an amide group-containing compound, a urea compound, a nitrogen-containing heterocyclic compound, and the like) may be used as the basic compound.

<Hydrophobic Resin>

The actinic ray-sensitive or radiation-sensitive composition of the present invention may have a hydrophobic resin which is different from the resin (A), apart from the inclusion of the resin (A).

It is preferred that the hydrophobic resin is designed to be unevenly distributed on the surface of the resist film, but unlike a surfactant, the hydrophobic resin is not necessarily required to have a hydrophilic group in the molecule, and may not contribute to uniform mixing of polar/nonpolar materials.

The effects of adding a hydrophobic resin include control of the static/dynamic contact angle of the resist film surface with respect to water, suppression of outgassing, and the like.

From the viewpoint of uneven distribution to the film surface layer, it is preferred that the hydrophobic resin contains one or more of a "fluorine atom", a "silicon atom" and a "$CH_3$ partial structure contained in the side chain portion of the resin", and it is more preferred that the hydrophobic resin contains two or more thereof. Further, it is preferred that the hydrophobic resin contains a hydrocarbon group having 5 or more carbon atoms. These groups may be present in the main chain of the resin or may be substituted on the side chain of the resin.

In the case where the hydrophobic resin contains a fluorine atom and/or a silicon atom, the fluorine atom and/or silicon atom in the hydrophobic resin may be contained in the main chain of the resin or may be contained in side chain of the resin.

In the case where the hydrophobic resin contains a fluorine atom, the hydrophobic resin is preferably a resin having a fluorine atom-containing alkyl group, a fluorine atom-containing cycloalkyl group or a fluorine atom-containing aryl group as a fluorine atom-containing partial structure.

The fluorine atom-containing alkyl group (preferably having 1 to 10 carbon atoms and more preferably having 1 to 4 carbon atoms) is a linear or branched alkyl group in which at least one hydrogen atom is substituted with a fluorine atom, and may further have a substituent other than a fluorine atom.

The fluorine atom-containing cycloalkyl group is a monocyclic or polycyclic cycloalkyl group in which at least one hydrogen atom is substituted with a fluorine atom, and may further have a substituent other than a fluorine atom.

The fluorine atom-containing aryl group is, for example, a cycloalkyl group in which at least one hydrogen atom of an aryl group such as a phenyl group or a naphthyl group is substituted with a fluorine atom and may further have a substituent other than a fluorine atom.

Examples of the repeating unit having a fluorine atom or a silicon atom include those exemplified in paragraph [0519] of US2012/0251948A1.

As mentioned above, it is also preferred that the hydrophobic resin contains a $CH_3$ partial structure in the side chain portion thereof.

Here, the $CH_3$ partial structure in the side chain portion of the hydrophobic resin is intended to include a $CH_3$ partial structure that an ethyl group, a propyl group, or the like has.

On the other hand, a methyl group directly bonded to the main chain of the hydrophobic resin (for example, a-methyl group in the repeating unit having a methacrylic acid structure) makes only a small contribution to surface localization of the hydrophobic resin owing to influence of the main chain, and therefore it is not included in the $CH_3$ partial structure in the present invention.

Regarding the hydrophobic resin, reference can be made to the description of paragraphs [0348] to [0415] of JP2014-010245A, the contents of which are incorporated herein by reference.

As the hydrophobic resin, those described in JP2011-248019A, JP2010-175859A and JP2012-032544A can also be preferably used.

In the pattern forming method of the present invention, a resist film can be formed on a substrate using the actinic ray-sensitive or radiation-sensitive composition, and a topcoat layer can be formed on the resist film using the topcoat composition. The film thickness of this resist film is preferably 10 to 100 nm, and the film thickness of the topcoat layer is preferably 10 to 200 nm, more preferably 20 to 100 nm, and particularly preferably 40 to 80 nm.

The method of coating the actinic ray-sensitive or radiation-sensitive composition on the substrate is preferably spin coating, in which the rotational speed is preferably 1,000 to 3,000 rpm.

For example, the actinic ray-sensitive or radiation-sensitive composition is applied onto a substrate (for example, silicon/silicon dioxide-coated substrate) as used in the production of precision integrated circuit elements by a suitable coating method such as a spinner or a coater, and then dried to form a resist film. It is also possible to apply a known antireflection film in advance. Further, it is preferable to dry the resist film before forming the topcoat layer.

Next, a topcoat composition can be applied onto the resulting resist film by the same means as the foregoing method for forming a resist film and then dried to form a topcoat layer.

The resist film having the topcoat layer as the upper layer is irradiated with electron beams (EB), X-rays or EUV light, usually through a mask, preferably baked (heated) and developed. As a result, a good pattern can be obtained.

Surfactant (F)

The actinic ray-sensitive or radiation-sensitive composition used in the present invention may further contain a surfactant (F). The inclusion of a surfactant makes it possible to form a pattern with adhesiveness and less development defects while having good sensitivity and resolution in the case of using an exposure light source having a wavelength of 250 nm or less, particularly 220 nm or less.

As the surfactant, it is particularly preferred to use a fluorine-based and/or silicon-based surfactant.

Examples of the fluorine-based and/or silicon-based surfactant include the surfactants described in paragraph [0276] of US2008/0248425A. Further, EFTOP EF301 or EF303 (manufactured by Shin-Akita Kasei Co., Ltd.); FLUORAD FC430, 431, or 4430 (manufactured by Sumitomo 3M Limited); MEGAFACE F171, F173, F176, F189, F113, F110, F177, F120, or R08 (manufactured by DIC Corporation); SURFLON S-382, SC101, 102, 103, 104, 105, or 106 (manufactured by Asahi Glass Co., Ltd.); TROYSOL S-366 (manufactured by Troy Chemical Co., Ltd.); GF-300 or GF-150 (manufactured by Toagosei Co., Ltd.), SURFLON S-393 (manufactured by Seimi Chemical Co., Ltd.); EFTOP EF121, EF122A, EF122B, RF122C, EF125M, EF135M, EF351, EF352, EF801, EF802, or EF601 (manufactured by Jemco Inc.); PF636, PF656, PF6320, or PF6520 (manufactured by OMNOVA Solutions Inc.); or FTX-204G, 208G, 218G, 230G, 204D, 208D, 212D, 218D, or 222D (manufactured by Neos Company Limited) may be used. In addition, a polysiloxane polymer KP-341 (manufactured by Shin-Etsu Chemical Co., Ltd.) may also be used as the silicon-based surfactant.

Further, in addition to the above-mentioned known surfactants, the surfactant may be synthesized using a fluoroaliphatic compound produced by a telomerization method (also referred to as a telomer method) or an oligomerization method (also referred to as an oligomer method). Specifically, a polymer having a fluoroaliphatic group derived from the fluoroaliphatic compound may be used as the surfactant. This fluoroaliphatic compound can be synthesized, for example, by the method described in JP2002-90991A.

Further, surfactants other than the fluorine-based and/or silicon-based surfactants described in paragraph [0280] of US2008/0248425A may be used.

These surfactants may be used alone or in combination of two or more thereof.

In the case where the actinic ray-sensitive or radiation-sensitive composition used in the present invention contains a surfactant, the content thereof is preferably 0 to 2 mass %, more preferably 0.0001 to 2 mass %, 0.0001 to 2 mass %, and still more preferably 0.0005 to 1 mass %, based on the total solid content of the composition.

Other Additives (G)

The actinic ray-sensitive or radiation-sensitive composition used in the present invention may further contain a dissolution inhibiting compound, a dye, a plasticizer, a photosensitizer, a light absorber, and/or a compound promoting solubility in a developer (for example, a phenol compound having a molecular weight of 1,000 or less, or an alicyclic or aliphatic compound containing a carboxyl group).

The actinic ray-sensitive or radiation-sensitive composition used in the present invention may further contain a dissolution inhibiting compound. The term "dissolution inhibiting compound" as used herein is a compound having a molecular weight of 3,000 or less, which is decomposed by the action of an acid to reduce its solubility in an organic developer.

The rinsing liquid of the present invention can also be suitably applied to a non-chemically amplified resist composition.

The non-chemically amplified resist composition may be, for example,
- a resist material whose main chain is cleaved by irradiation with g line, h line, i line, KrF, ArF, EB, EUV, or the like and therefore whose molecular weight is lowered to result in change of the solubility (for example, a resist material or the like containing a copolymer of an α-chloroacrylate ester compound and an α-methylstyrene compound described in paragraphs [0025] to [0029] and [0056] of JP2013-210411A and paragraphs [0032] to [0036] and [0063] of US2015/0008211A, as a main component),
- hydrogen silsesquioxane (HSQ) accompanied by a silanol condensation reaction caused by g line, h line, i line, KrF, ArF, EB, EUV, or the like, or chlorine-substituted calixarene,
- a resist material which contains a metal complex (a complex of magnesium, chromium, manganese, iron, cobalt, nickel, copper, zinc, silver, cadmium, indium, tin, antimony, cesium, zirconium, hafnium, or the like, with titanium, zirconium, or hafnium being preferable from the viewpoint of patternability) having absorption to light such as g line, h line, i line, KrF, ArF, EB, EUV, or the like from the viewpoint of patternability) and which involves ligand elimination or a ligand exchange process in combination with an acid generator (resist materials described in paragraphs [0017] to [0033] and [0037] to [0047] of JP2015-075500A, paragraphs [0017] to [0032] and [0043] to [0044] of JP2012-185485A, paragraphs [0042] to and [0066] of US2012-0208125A, and the like), or the like.

As the resist composition, the resist compositions described in paragraphs [0010] to and [0129] to [0165] of JP2008-83384A can also be used.

It is preferred that various materials (for example, a resist solvent, a developer, a rinsing liquid, a composition for forming an antireflection film, a composition for forming a topcoat, and the like) used in the actinic ray-sensitive or radiation-sensitive composition of the present invention, and the pattern forming method of the present invention do not include impurities such as metals, metal salts containing halogen, acids, and alkalis. The content of impurities contained in these materials is preferably 1 ppm or less, more preferably 1 ppb or less, still more preferably 100 ppt or less, particularly preferably 10 ppt or less, and particularly preferably 1 ppt or less. It is most preferred that those materials are substantially free of impurities (below the detection limit of the measuring apparatus).

The method for removing impurities such as metals from various materials may be, for example, filtration using a filter. As for the filter pore diameter, the pore size is preferably 10 nm or less, more preferably 5 nm or less, and still more preferably 3 nm or less. As for the materials of a filter, a polytetrafluoroethylene-made filter, a polyethylene-made filter, and a nylon-made filter are preferred. The filter may be made of a composite material combining these materials and ion exchange media. The filter may be preliminarily washed with an organic solvent and then used. In the step of filtration using a filter, plural kinds of filters may be connected in series or in parallel, and then used. In the case of using plural kinds of filters, a combination of filters having different pore diameters and/or materials may be used. In addition, various materials may be filtered plural times, and a step of filtering plural times may be a circulatory filtration step.

Moreover, examples of the method for reducing impurities such as metals contained in various materials include a method of selecting raw materials having a small content of metals as raw materials constituting various materials, a method of subjecting raw materials constituting various materials to filtration using a filter, and a method of carrying out distillation under conditions where contamination is suppressed as much as possible by such as lining of the inside of the apparatus with Teflon (registered trademark). The preferred conditions for the filtration using a filter, which is carried out for raw materials constituting various materials, are the same as described above.

In addition to filtration using a filter, removal of impurities by an adsorbing material may be carried out, or a combination of filtration using a filter and filtration using an adsorbing material may be used. As the adsorbing material, known adsorbing materials may be used. For example, inorganic adsorbing materials such as silica gel and zeolite, and organic adsorbing materials such as activated carbon may be used.

<Accommodating Container>

As an organic solvent (also referred to as "organic treatment liquid") usable for a developer and a rinsing liquid, it is preferred to use one stored in an accommodating container for accommodating an organic treatment liquid for patterning a chemically amplified or non-chemically amplified resist film, in which the container has an accommodating portion. The accommodating container is preferably, for example, an accommodating container for accommodating an organic treatment liquid for patterning a resist film, in which the inner wall of the accommodating portion being in contact with the organic treatment liquid is formed of a resin different from any of a polyethylene resin, a polypropylene resin, and a polyethylene-polypropylene resin, or of a metal subjected to a rust prevention/metal elution prevention treatment. An organic solvent to be used as an organic treatment liquid for patterning a resist film is accommodated in the accommodating portion of the accommodating container, and the organic solvent discharged from the accommodating portion can be used at the time of patterning the resist film.

In the case where the accommodating container further has a sealing part for sealing the accommodating portion, the sealing part is also preferably formed of a resin different from one or more resins selected from the group consisting of a polyethylene resin, a polypropylene resin, and a polyethylene-polypropylene resin, or of a metal subjected to a rust prevention/metal elution prevention treatment.

Here, the seal portion refers to a member capable of shielding the accommodating portion from the outside air, examples of which suitably include packing, an O ring, and the like.

The resin different from one or more resins selected from the group consisting of a polyethylene resin, a polypropylene resin, and a polyethylene-polypropylene resin is preferably a perfluoro resin.

Examples of the perfluoro resin include a tetrafluoroethylene resin (PTFE), a tetrafluoroethylene-perfluoroalkyl vinyl ether copolymer resin (PFA), a tetrafluoroethylene-hexafluoropropylene copolymer resin (FEP), a tetrafluoroethylene-ethylene copolymer resin (ETFE), a trifluoroethylene chloride-ethylene copolymer resin (ECTFE), a polyvinylidene fluoride resin (PVDF), a trifluoroethylene chloride resin (PCTFE), and a polyvinyl fluoride resin (PVF).

Examples of the particularly preferred perfluoro resin include a tetrafluoroethylene resin, a tetrafluoroethylene-perfluoroalkyl vinyl ether copolymer resin, and a tetrafluoroethylene-hexafluoropropylene copolymer resin.

Examples of the metal in the metal subjected to a rust prevention/metal elution prevention treatment include carbon steel, alloy steel, nickel chromium steel, nickel chromium molybdenum steel, chromium steel, chromium molybdenum steel, and manganese steel.

As for the rust prevention/metal elution prevention treatment, it is preferred to apply a coating technique.

The coating technique is roughly divided into three types of metal coating (various plating), inorganic coating (various chemical conversion treatments, glass, concrete, ceramics, and the like), and organic coating (rust preventive oil, paint, rubber, and plastics).

Examples of the preferred coating technique include a rust preventive oil, a rust inhibitor, a corrosion inhibitor, a chelate compound, a strippable plastic, and a surface treatment with a lining agent.

Among them, corrosion inhibitors, such as various chromates, nitrites, silicates, phosphates, oleic acid, dimer acid, carboxylic acids such as naphthenic acid, carboxylic acid metal soaps, sulfonates, amine salts, and esters (glycerol esters of higher fatty acids and phosphoric acid esters); chelate compounds such as ethylene diamine tetraacetic acid, gluconic acid, nitrilotriacetic acid, hydroxyethyl ethylene diamine triacetic acid, and diethylene triamine pentaacetic acid; and fluorine resin lining are preferable. Particularly preferred are a phosphate treatment and fluorine resin lining.

Although it does not directly prevent rust when compared with a direct coating treatment, it is also preferred to adopt "pretreatment" which is a step prior to a rust prevention treatment, as a treatment method leading to prolongation of the rust prevention period by a coating treatment.

As a specific example of such a pretreatment, a treatment for removing a variety of corrosive factors such as chlorides and sulfates present on the metal surface by cleaning or polishing can be suitably exemplified.

Specific examples of the accommodating container include the following.

FluoroPurePFA composite drum manufactured by Entegris Inc. (wetted inner surface; PFA resin lining)

Steel drum manufactured by JFE Corporation (wetted inner surface; zinc phosphate coating)

Further, examples of the accommodating container that can be used in the present invention include the containers described in paragraphs [0013] to [0030] of JP1999-021393A (JP-H11-021393A) and paragraphs [0012] to [0024] of JP1998-45961A (JP-H10-45961A).

In order to prevent breakdown of chemical liquid piping and various parts (a filter, an O-ring, a tube, and the like) due to electrostatic charging and subsequent electrostatic discharging, a conductive compound may be added to the organic treatment liquid of the present invention. The conductive compound is not particularly limited and is, for example, methanol. The addition amount of the conductive compound is not particularly limited, but it is preferably 10 mass % or less and more preferably 5 mass % or less from the viewpoint of maintaining favorable development properties. Regarding the members of the chemical liquid piping, it is possible to use various pipes coated with SUS (stainless steel), or a polyethylene resin, a polypropylene resin, or a fluororesin (a polytetrafluoroethylene resin, a perfluoroalkoxy resin, or the like) subjected to an antistatic treatment. Likewise, a polyethylene resin, a polypropylene resin, or a fluororesin (a polytetrafluoroethylene resin, a perfluoroalkoxy resin, or the like) subjected to an antistatic treatment may also be used for a filter and an O-ring.

Generally, the developer and the rinsing liquid are stored in a waste liquid tank through a pipe after use. At that time, in the case where a hydrocarbon-based solvent is used as the rinsing liquid, the resist dissolved in the developer is precipitated and adheres to the rear surface of the wafer, the side surface of the pipe or the like. In order to prevent the above problem, there is a method of passing a solvent in which the resist dissolves again through the pipe. As the method of passing the solvent through the pipe, there are a method in which the rear surface, the side surface, and the like of the substrate are cleaned with a solvent in which the resist dissolves and then the solvent is allowed to flow after cleaning with the rinsing liquid, and a method of flowing a solvent in which a resist dissolves without being in contact with the resist so as to pass through a pipe.

The solvent to be passed through the pipe is not particularly limited as long as it can dissolve the resist, and may be, for example, the above-mentioned organic solvent. Use may be made of propylene glycol monomethyl ether acetate (PGMEA), propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, ethylene glycol monoethyl ether acetate, propylene glycol monomethyl ether (PGME), propylene glycol monoethyl ether, propylene glycol monopropyl ether, propylene glycol monobutyl ether, ethylene glycol monomethyl ether, ethylene glycol monoethyl ether, 2-heptanone, ethyl lactate, 1-propanol, acetone, or the like. Among them, PGMEA, PGME, or cyclohexanone may be preferably used.

A semiconductor fine circuit, an imprint mold structure, a photomask, or the like can be manufactured by appropriately performing an etching treatment, ion implantation and the like using the pattern obtained by the pattern forming method of the present invention as a mask.

The pattern formed by the foregoing method can also be used for guide pattern formation in DSA (Directed Self-Assembly) (see, for example, ACS Nano Vol. 4 No. 8 Page 4815-4823). Further, the pattern formed by the foregoing method can be used as a core material (core) in the spacer process disclosed in, for example, JP1991-270227A (JP-H03-270227A) and JP2013-164509A.

Meanwhile, the process for preparing an imprint mold by using the composition of the present invention is described, for example, in JP4109085B, JP2008-162101A, and "Basic and Technology Expansion-Application Development of Nanoimprint-Substrate Technology of Nanoimprint and Latest Technology Expansion-edited: Yoshihiko Hirai (Frontier Publishing)."

The photomask manufactured using the pattern forming method of the present invention may be a light transmission type mask used in, for example, ArF excimer laser, or a light reflective mask used in a reflective lithography using EUV light as a light source.

Further, the present invention also relates to an electronic device manufacturing method, including the above-mentioned pattern forming method of the present invention.

An electronic device manufactured by the electronic device manufacturing method of the present invention is suitably mounted on electric electronic equipment (such as a home electronic device, an office appliance (OA) media-related device, an optical device, and a communication device).

EXAMPLES

Hereinafter, the present invention will be described in more detail with reference to the following Examples, but the present invention is not limited thereto unless they go beyond its gist. Unless otherwise specified, "part(s)" and "%" are based on mass.

<Resin (A)>

(Synthesis Example 1) Synthesis of Resin (A-1)

600 g of cyclohexanone was placed in a 2 L flask which was then purged with nitrogen at a flow rate of 100 mL/min for one hour. Thereafter, 4.60 g (0.02 mol) of a polymerization initiator V-601 (manufactured by Wako Pure Chemical Industries, Ltd.) was added thereto, and the temperature was raised until the internal temperature reached 80° C. Then, the following monomers and 4.60 g (0.02 mol) of a polymerization initiator V-601 (manufactured by Wako Pure Chemical Industries, Ltd.) were dissolved in 200 g of cyclohexanone to prepare a monomer solution. The monomer solution was added dropwise over 6 hours to the above flask heated to 80° C. After the dropwise addition was completed, the mixture was allowed to react for another 2 hours at 80° C.

| | |
|---|---|
| 4-acetoxystyrene | 48.66 g (0.3 mol) |
| 1-ethylcyclopentyl methacrylate | 109.4 g (0.6 mol) |
| Monomer 1 | 22.2 g (0.1 mol) |

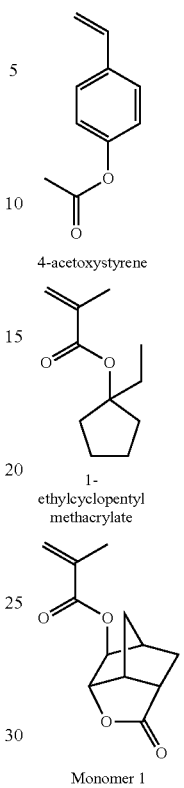

4-acetoxystyrene 1-ethylcyclopentyl methacrylate

Monomer 1

The reaction solution was cooled to room temperature and was added dropwise to 3 L of hexane to precipitate a polymer. The filtered solid was dissolved in 500 mL of acetone which was then added dropwise again to 3 L of hexane, followed by filtration. The filtered solid was dried under reduced pressure to give 160 g of a 4-acetoxystyrene/1-ethylcyclopentyl methacrylate/monomer 1 copolymer (A-1a).

10 g of the above-obtained polymer, 40 mL of methanol, 200 mL of 1-methoxy-2-propanol, and 1.5 mL of concentrated hydrochloric acid were added to a reaction vessel which was then heated to 80° C., followed by stirring for 5 hours. The reaction solution was allowed to cool to room temperature and was added dropwise to 3 L of distilled water. The filtered solid was dissolved in 200 mL of acetone which was then added dropwise again to 3 L of distilled water, followed by filtration. The filtered solid was dried under reduced pressure to give a resin (A-1) (8.5 g). The weight-average molecular weight by GPC was 10,800, and the molecular weight dispersity (Mw/Mn) was 1.55.

Resins (A-2) to (A-4) having the structure shown in Table 1 below were synthesized in the same manner as in Synthesis Example 1, except that the monomer used was changed. The composition ratio (molar ratio) of the resin was calculated by $^1$H-NMR measurement. The weight-average molecular weight (Mw: polystyrene conversion) and dispersity (Mw/Mn) of the resin were calculated by GPC (solvent: THF) measurement.

TABLE 1

| | Structure | Composition ratio (molar ratio) from the left | Mw | Mw/Mn |
|---|---|---|---|---|
| Resin A-1 | (p-hydroxystyrene / 1-ethylcyclopentyl methacrylate / norbornane lactone methacrylate) | 30/60/10 | 10,800 | 1.55 |
| Resin A-2 | (p-hydroxystyrene / t-butyl methacrylate / norbornane lactone methacrylate) | 30/60/10 | 12,000 | 1.42 |
| Resin A-3 | (p-hydroxystyrene / 1-methylcyclohexyl methacrylate / γ-butyrolactone methacrylate) | 30/50/20 | 5,500 | 1.65 |
| Resin A-4 | (p-hydroxystyrene / t-butyl methacrylate) | 20/80 | 14,000 | 1.45 |

Resins (A-5) to (A-7) having the structure shown in Table 2 below were synthesized in the same manner as in Synthesis Example 1, except that the monomer used was changed. The composition ratio (molar ratio) of the resin was calculated by $^1$H-NMR measurement. The weight-average molecular weight (Mw: polystyrene conversion) and dispersity (Mw/Mn) of the resin were calculated by GPC (solvent: THF) measurement.

TABLE 2
| | Structure | Composition ratio (molar ratio) from the left | Mw | Mw/Mn |
|---|---|---|---|---|
| Resin A-5 | | 50/50 | 9,100 | 1.65 |
| Resin A-6 | | 60/40 | 10,200 | 1.53 |
| Resin A-7 | | 70/30 | 10,400 | 1.37 |
<Acid Generator (B)>
As the acid generator, the following compounds were used.
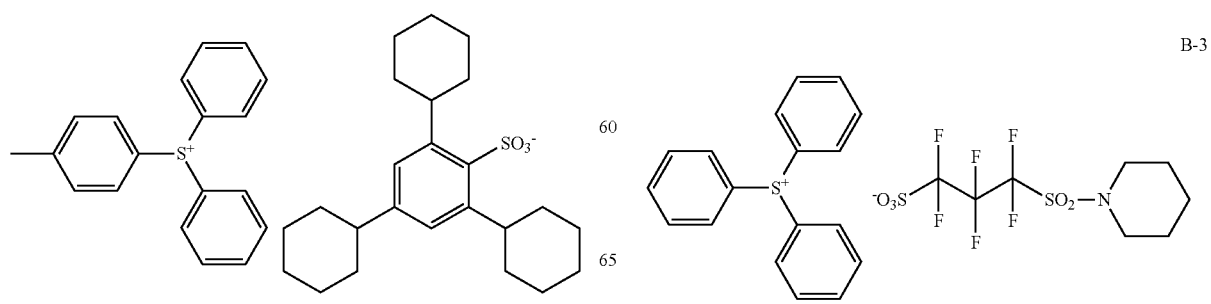
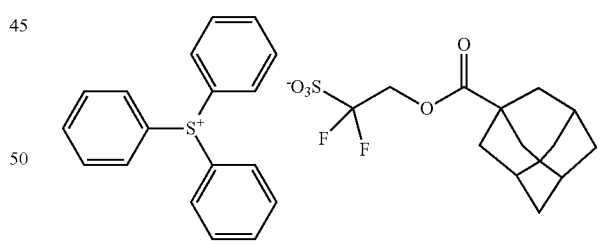

-continued

B-4

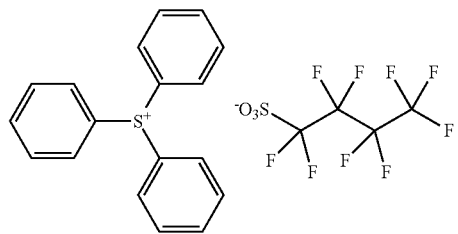

<Basic Compound (E)>

As the basic compound, the following compounds were used.

(E-1)

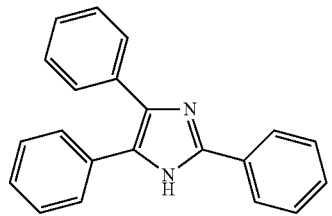

(E-2)

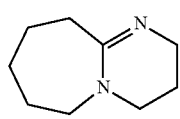

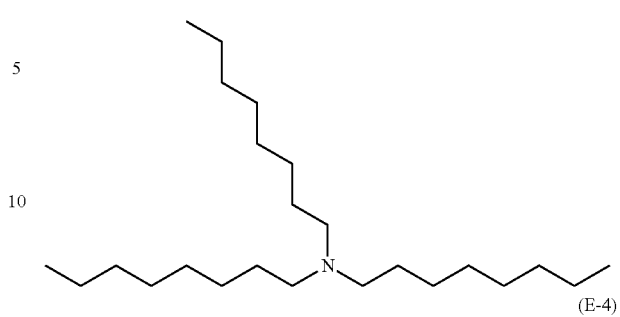

(E-3)

(E-4)

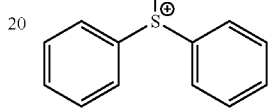

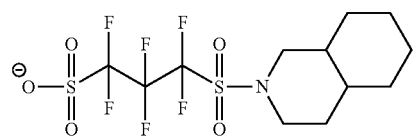

<Solvent (C)>

As the solvent, the following compounds were used.
C-1: propylene glycol monomethyl ether acetate
C-2: propylene glycol
C-3: ethyl lactate
C-4: cyclohexanone <Resist Composition>

The individual components shown in Table 3 below were dissolved in the solvent shown in the same table. This was filtered using a polyethylene filter having a pore size of 0.03 μm to obtain a resist composition.

TABLE 3

|  | Resin (A) | Acid generator (B) | Basic compound (E) | Solvent (C) | |
|---|---|---|---|---|---|
| Resist composition 1 | A-1 0.77 g | B-1 0.2 g | E-3 0.03 g | C-1 67.5 g | C-3 7.5 g |
| Resist composition 2 | A-2 0.79 g | B-2 0.18 g | E-1 0.03 g | C-1 45 g | C-2 30 g |
| Resist composition 3 | A-5 0.78 g | B-3 0.19 g | E-3 0.03 g | C-1 67.5 g | C-3 7.5 g |
| Resist composition 4 | A-6 0.79 g | B-2 0.18 g | E-1 0.03 g | C-1 67.5 g | C-3 7.5 g |
| Resist composition 5 | A-7 0.79 g | B-4 0.2 g | E-2 0.01 g | C-1 45 g | C-4 30 g |
| Resist composition 6 | A-1 0.79 g | B-2 0.18 g | E-1 0.03 g | C-1 67.5 g | C-3 7.5 g |
| Resist composition 7 | A-2 0.79 g | B-2 0.2 g | E-4 0.01 g | C-1 45 g | C-4 30 g |
| Resist composition 8 | A-3 0.8 g | B-3 0.19 g | E-2 0.01 g | C-1 67.5 g | C-4 7.5 g |
| Resist composition 9 | A-4 0.79 g | B-2 0.18 g | E-1 0.03 g | C-1 60 g | C-3 15 g |
| Resist composition 10 | A-1/A-2 0.4 g/0.4 g | B-2 0.18 g | E-1 0.03 g | C-1 60 g | C-3 15 g |

TABLE 3-continued

| | Resin (A) | Acid generator (B) | Basic compound (E) | Solvent (C) | |
|---|---|---|---|---|---|
| Resist composition 11 | A-1 0.79 g | B-2/B-3 0.09 g/0.09 g | E-1 0.03 g | C-1 60 g | C-3 15 g |
| Resist composition 12 | A-1 0.79 g | B-2 0.18 g | E-1/E-4 0.015 g/0.015 g | C-1 60 g | C-3 15 g |

<EUV Exposure Evaluation>

Using the resist composition described in Table 3, a resist pattern was formed by the following procedure.

[Application and Post Application Bake (PB) of Resist Composition]

The above-obtained resist composition was applied onto a 4-inch silicon wafer subjected to a hexamethyldisilazane (HMDS) treatment, and baked for 60 seconds under the conditions of temperature shown in Table 6 to form a resist film having a film thickness of 40 nm.

1 inch corresponds to 25.4 mm.

[Exposure]

EUV exposure was carried out on the wafer prepared above with Numerical Aperture (NA) of 0.3, dipole illumination. Specifically, EUV exposure was carried out by changing the exposure amount through a mask including a pattern for forming a 1:1 line and space pattern with a line width of 15 to 20 nm.

[Post Exposure Bake (PEB)]

Once removed from the EUV exposure apparatus following the irradiation, the wafer was immediately baked for 60 seconds under the conditions of temperature shown in Table 6.

[Development]

Thereafter, using a shower-type developing apparatus (ADE3000S, manufactured by ACTES), development was carried out by spraying and ejecting the developer (23° C.) described in Table 4 at a flow rate of 200 mL/min for a predetermined time while rotating the wafer at 50 revolutions (rpm).

The content ratio of butyl acetate to isopentyl acetate in Developer S-9 is the mass ratio.

TABLE 4

| Developer | |
|---|---|
| S-1 | Butyl acetate |
| S-2 | Isopentyl acetate (3-methylbutyl acetate) |
| S-3 | Butyl butanoate |
| S-4 | Isobutyl isobutanoate |
| S-5 | 2-pentanone |
| S-6 | Butyl propionate |
| S-7 | Diisobutyl ketone |
| S-8 | Diisopropyl ether |

TABLE 4-continued

| Developer | |
|---|---|
| S-9 | Butyl acetate/Isopentyl acetate = 70/30 |

[Rinsing]

Thereafter, a rinsing treatment was carried out by spraying and ejecting the rinsing liquid (23° C.) described in Table 5 at a flow rate of 200 mL/min for a predetermined time while rotating the wafer at 50 revolutions (rpm).

Finally, the wafer was dried by high-speed spinning at 2,500 revolutions (rpm) for 120 seconds.

The content ratio of isodecane to isododecane in Rinsing liquid R-6 is the mass ratio.

TABLE 5

| Rinsing liquid | | Remarks |
|---|---|---|
| R-1 | Isodecane | Example |
| R-2 | Isododecane | Example |
| R-3 | 2,2,3-trimethyl hexane | Example |
| R-4 | Isoundecane | Example |
| R-5 | Isohexadecane | Example |
| R-6 | Isodecane/Isododecane = 20/80 | Example |
| RA-1 | 4-methyl-2-pentanol | Comparative Example |
| RA 2 | n-octane | Comparative Example |
| RA-3 | 1-hexanol | Comparative Example |

[Evaluation Test]

The resist pattern was evaluated for the following items. The results are shown in Table 6.

TABLE 6

| | | PB (60 seconds) | PEB (60 seconds) | Developer | Rinsing liquid | Pattern collapse performance | Bridge performance |
|---|---|---|---|---|---|---|---|
| Example 1 | Resist composition 1 | 120° C. | 120° C. | S-1 | R-1 | A | A |
| Example 2 | Resist composition 2 | 120° C. | 110° C. | S-2 | R-2 | A | A |
| Example 3 | Resist composition 3 | 120° C. | 110° C. | S-3 | R-3 | B | C |

TABLE 6-continued

|  |  | PB (60 seconds) | PEB (60 seconds) | Developer | Rinsing liquid | Pattern collapse performance | Bridge performance |
|---|---|---|---|---|---|---|---|
| Example 4 | Resist composition 4 | 120° C. | 110° C. | S-4 | R-4 | A | A |
| Example 5 | Resist composition 5 | 120° C. | 110° C. | S-5 | R-5 | A | A |
| Example 6 | Resist composition 6 | 120° C. | 110° C. | S-6 | R-1 | A | A |
| Example 7 | Resist composition 7 | 120° C. | 110° C. | S-7 | R-2 | A | A |
| Example 8 | Resist composition 8 | 120° C. | 110° C. | S-8 | R-3 | A | A |
| Example 9 | Resist composition 9 | 120° C. | 110° C. | S-9 | R-4 | A | A |
| Example 10 | Resist composition 10 | 120° C. | 100° C. | S-1 | R-5 | A | A |
| Example 11 | Resist composition 11 | 120° C. | 100° C. | S-2 | R-6 | A | A |
| Example 12 | Resist composition 12 | 120° C. | 90° C. | S-1 | R-1 | A | A |
| Comparative Example 1 | Resist composition 3 | 120° C. | 110° C. | S-1 | RA-1 | D | D |
| Comparative Example 2 | Resist composition 8 | 120° C. | 140° C. | S-5 | RA-2 | C | D |
| Comparative Example 3 | Resist composition 3 | 120° C. | 140° C. | S-6 | RA-3 | D | D |

(Pattern Collapse Performance)

Exposure was carried out with irradiation energy separating and resolving the ratio of line to space of 1:1 in a line width of 20 nm.

The obtained resist pattern was observed under a scanning electron microscope (S-9380II manufactured by Hitachi, Ltd.). The magnification was set to 200,000×.

The resolution state of a line width of 20 nm obtained by the above method was observed under a scanning electron microscope to determine the number of pattern collapse. 1,000 images were photographed while shifting the observation point by 1 μm each. Those in which pattern collapse was observed in the photograph 1 view were regarded as NG, and those in which pattern collapse was not observed were regarded as OK, followed by counting. Depending on the number of NG, it was classified as A to D below. The smaller NG indicates the better pattern collapse performance.

A: 0
B: I to 10
C: 11 to 100
D: 101 to 1000

(Bridge Performance)

Exposure was carried out with irradiation energy separating and resolving the ratio of line to space of 1:1 in a line width of 20 nm.

The obtained resist pattern was observed under a scanning electron microscope (S-9380II manufactured by Hitachi, Ltd.). The magnification was set to 200,000×.

The resolution state of a line width of 20 nm obtained by the above method was observed under a scanning electron microscope to determine the number of bridges. 1,000 images were photographed while shifting the observation point by 1 μm each. Those in which bridges were observed in the photograph 1 view were regarded as NG, and those in which bridges were not observed were regarded as OK, followed by counting. Depending on the number of NG, it was classified as A to D below. The smaller NG indicates the better bridge performance.

A: 0
B: I to 10
C: 11 to 100
D: 101 to 1000

<EB Exposure Evaluation>

Using the resist composition described in Table 3, a resist pattern was formed by the following procedure.

[Application and Post Application Bake of Resist Composition (PB)]

The organic film DUV44 (manufactured by Brewer Science Co., Ltd.) was applied onto a 6-inch silicon wafer, and baked for 60 seconds at 200° C. to form an organic film having a film thickness of 60 nm. The resist composition described in Table 3 was applied thereon and baked for 60 seconds at the temperature shown in Table 7 to form a resist film having a film thickness of 40 nm.

[Exposure]

The above-prepared wafer was exposed to a 1:1 line and space pattern with a line width of 20 nm to 17.5 nm (length direction: 0.12 mm, number of lines drawn: 20) in a unit of 1.25 nm by using an electron beam irradiation apparatus (JBX6000FS/E, manufactured by JEOL, accelerating voltage: 50 keV) while varying the exposure amount.

[Post Exposure Bake (PEB)]

Once removed from the electron beam irradiation following the irradiation, the wafer was immediately was heated on a hot plate under the conditions of 60 seconds at the temperature shown in Table 7.

[Development]

Using a shower-type developing apparatus (ADE3000S, manufactured by ACTES), development was carried out by spraying and ejecting the developer (23° C.) described in Table 4 at a flow rate of 200 mL/min for a predetermined time while rotating the wafer at 50 revolutions (rpm).

[Rinsing]

Thereafter, a rinsing treatment was carried out by spraying and ejecting a rinsing liquid (23° C.) described in Table 5 at a flow rate of 200 mL/min for a predetermined time while rotating the wafer at 50 revolutions (rpm).

Finally, the wafer was dried by high-speed spinning at 2,500 revolutions (rpm) for 120 seconds.

The evaluation of the resist pattern was carried out in the same manner as in the section <EUV exposure evaluation>. The results are shown in Table 7.

TABLE 7

| | | PB (60 seconds) | PEB (60 seconds) | Developer | Rinsing liquid | Pattern collapse performance | Bridge performance |
|---|---|---|---|---|---|---|---|
| Example 13 | Resist composition 1 | 100° C. | 120° C. | S-1 | R-1 | A | A |
| Example 14 | Resist composition 2 | 100° C. | 120° C. | S-2 | R-2 | A | A |
| Example 15 | Resist composition 9 | 100° C. | 120° C. | S-3 | R-3 | B | C |
| Example 16 | Resist composition 8 | 100° C. | 120° C. | S-4 | R-4 | A | A |
| Example 17 | Resist composition 7 | 100° C. | 120° C. | S-5 | R-5 | A | A |
| Example 18 | Resist composition 6 | 100° C. | 120° C. | S-6 | R-1 | A | A |
| Example 19 | Resist composition 5 | 100° C. | 120° C. | S-7 | R-2 | A | A |
| Example 20 | Resist composition 4 | 100° C. | 120° C. | S-8 | R-3 | A | A |
| Example 21 | Resist composition 3 | 100° C. | 120° C. | S-9 | R-4 | A | A |
| Comparative Example 4 | Resist composition 3 | 120° C. | 110° C. | S-1 | RA-1 | D | D |
| Comparative Example 5 | Resist composition 8 | 120° C. | 140° C. | S-5 | RA-2 | C | D |
| Comparative Example 6 | Resist composition 3 | 120° C. | 140° C. | S-6 | RA-3 | D | D |

As shown in Tables 6 and 7 above, it was found that both pattern collapse performance and bridge performance are very good by using a rinsing liquid containing a branched aliphatic hydrocarbon-based solvent as the rinsing liquid, even when any of the exposure light sources is used.

According to the present invention, it is possible to provide a rinsing liquid which is used for a resist film to achieve both pattern collapse performance and bridge performance at a very high level in a high-precision fine pattern (for example, a line width of 20 nm or less), a pattern forming method using the rinsing liquid, and an electronic device manufacturing method including the pattern forming method.

While the present invention has been described in detail and with reference to specific embodiments, it will be apparent to those skilled in the art that various changes and modifications can be made without departing from the spirit and scope of the invention.

What is claimed is:

1. A pattern forming method comprising the successive steps of:
    a resist film forming step of forming a resist film using an actinic ray-sensitive or radiation-sensitive composition,
    an exposure step of exposing the resist film,
    a step of developing the exposed resist film using a developer containing an organic solvent, and
    a step of rinsing the developed resist film using a rinsing liquid comprising hydrocarbon-based solvent having a branched alkyl group, wherein the hydrocarbon-based solvent having a branched alkyl group comprises a mixture of compounds having a same number of carbon atoms and different structures, and at least one of the compounds is isodecane or isododecane, wherein the number of carbon atoms in each of the compounds is 10 or more.

2. The pattern forming method according to claim 1, wherein the organic solvent contained in the developer is an ester-based solvent.

3. The pattern forming method according to claim 1, wherein the organic solvent contained in the developer contains one or more selected from the group consisting of butyl acetate, pentyl acetate, and isoamyl acetate.

4. The pattern forming method according to claim 1, wherein the actinic ray-sensitive or radiation-sensitive composition contains a resin containing a repeating unit represented by General Formula (1):

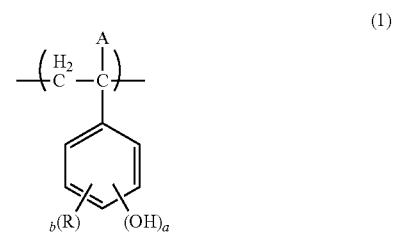

in General Formula (1),

A represents a hydrogen atom, an alkyl group, a cycloalkyl group, a halogen atom, or a cyano group, R represents a halogen atom, an alkyl group, a cycloalkyl group, an aryl group, an alkenyl group, an aralkyl group, an alkoxy group, an alkylcarbonyloxy group, an alkylsulfonyloxy group, an alkyloxycarbonyl group, or an aryloxycarbonyl group; in the case where there are a plurality of R's, they may be the same or different; and in the case of having a plurality of R's, they may form a ring in cooperation with each other, a represents an integer of 1 to 3, and b represents an integer of 0 to (3-a).

5. The pattern forming method according to claim 1, wherein the exposure is carried out using electron beams or extreme ultraviolet rays.

6. An electronic device manufacturing method, comprising:
the pattern forming method according to claim 1.

7. A rinsing liquid for use in rinsing a resist film obtained from an actinic ray-sensitive or radiation-sensitive composition, comprising:
a hydrocarbon-based solvent having a branched alkyl group; and
an antioxidant comprising an amine-based antioxidant or a phenol-based antioxidant,
wherein the hydrocarbon-based solvent having a branched alkyl group contains at least one of isodecane or isododecane.

8. A pattern forming method comprising the successive steps of:
a resist film forming step of forming a resist film using an actinic ray-sensitive or radiation-sensitive composition,
an exposure step of exposing the resist film,
a step of developing the exposed resist film using a developer selected from a group consisting of butyl acetate, isopentyl acetate, butyl butanoate, isobutyl isobutanoate, 2-heptanone, butyl propionate, diisobutyl ketone, diisopropyl ether, and a mixture of butyl acetate/isopentyl acetate with a mass ratio of 70/30, and
a step of rinsing the developed resist film using a rinsing liquid selected from a group consisting of isodecane, isododecane, 2,2,3-trimethyl hexane, isoundecane, isohexadecane, a mixture of isodecane/isododecane with a mass ratio of 20/80, 4-methyl-2-pentanol, n-octane, and 1-hexanol,
wherein the actinic ray-sensitive or radiation-sensitive composition contains a resin (A), and the resin (A) contains:
a repeating unit represented by General Formula (1):

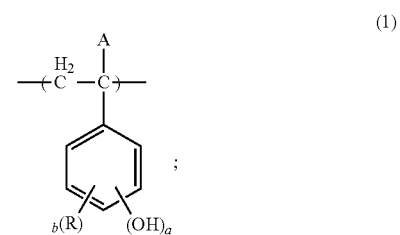

;and
a repeating unit having a group that decomposes by action of an acid to generate a carboxyl group,
wherein a content of the repeating unit having the group that decomposes by the action of the acid to generate the carboxyl group is 60 to 90 mol% With respect to all repeating units in the resin (A).

* * * * *